(12) United States Patent
Ikedo

(10) Patent No.: US 9,595,564 B1
(45) Date of Patent: Mar. 14, 2017

(54) SEMICONDUCTOR MEMORY DEVICE AND METHOD OF MANUFACTURING THE SAME

(71) Applicant: KABUSHIKI KAISHA TOSHIBA, Minato-ku (JP)

(72) Inventor: Akihito Ikedo, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/057,593

(22) Filed: Mar. 1, 2016

Related U.S. Application Data

(60) Provisional application No. 62/216,816, filed on Sep. 10, 2015.

(51) Int. Cl.

| | |
|---|---|
| H01L 45/00 | (2006.01) |
| H01L 47/00 | (2006.01) |
| H01L 27/22 | (2006.01) |
| H01L 27/24 | (2006.01) |
| G11C 13/00 | (2006.01) |

(52) U.S. Cl.
CPC ...... *H01L 27/2463* (2013.01); *G11C 13/0069* (2013.01); *H01L 45/06* (2013.01);
(Continued)

(58) Field of Classification Search
CPC .............. H01L 27/2463; H01L 45/085; H01L 45/1233; H01L 45/1266; H01L 45/145; H01L 45/06; G11C 13/0069
(Continued)

(56) References Cited

U.S. PATENT DOCUMENTS

| | | | |
|---|---|---|---|
| 8,183,602 B2 | 5/2012 | Tabata et al. | |
| 8,445,880 B2 * | 5/2013 | Park | H01L 27/2409 257/2 |

(Continued)

FOREIGN PATENT DOCUMENTS

| | | |
|---|---|---|
| JP | 2009-130140 | 6/2009 |
| JP | 2009-260052 | 11/2009 |

(Continued)

*Primary Examiner* — Dao H Nguyen
(74) *Attorney, Agent, or Firm* — Oblon, McClelland, Maier & Neustadt, L.L.P.

(57) ABSTRACT

The embodiments provide a semiconductor memory device including: a plurality of first wiring lines extending in a first direction, the first wiring lines being provided in a second direction intersecting the first direction; a plurality of second wiring lines extending in the second direction, the second wiring lines being provided in the first direction; a plurality of memory cells provided in the intersections between the first wiring lines and the second wiring lines, each memory cell having a first stack structure comprising at least a variable resistor film; a contact extending in a third direction intersecting the first and second directions, the contact having a first end connected to one of the first wiring lines or one of the second wiring lines, the contact having a second stack structure having a stack of a plurality of films; and a wiring layer connected to a second end of the contact. At least some of the films of the second stack structure have generally the same third direction position and film thickness as at least some of layers of the first stack structure. And, the second stack structure has a higher metal ratio than the first stack structure.

20 Claims, 50 Drawing Sheets

(52) U.S. Cl.
CPC ........ *H01L 45/085* (2013.01); *H01L 45/1233* (2013.01); *H01L 45/1266* (2013.01); *H01L 45/145* (2013.01); *H01L 45/165* (2013.01)

(58) Field of Classification Search
USPC ... 257/2, 4, 5, 211, 295, 296, 390, E27.005, 257/E45.001, E45.002, E47.001, 257/E21.614, E21.662, E21.665; 365/148, 163; 438/128, 129, 268, 381, 438/622
See application file for complete search history.

(56) References Cited

U.S. PATENT DOCUMENTS

| | | | |
|---|---|---|---|
| 8,502,322 B2 | 8/2013 | Nitta | |
| 2009/0302299 A1* | 12/2009 | Chang | H01L 21/76849 257/4 |
| 2010/0012917 A1* | 1/2010 | Takaura | G11C 8/08 257/4 |
| 2013/0221309 A1* | 8/2013 | Lee | H01L 45/085 257/2 |
| 2014/0063913 A1* | 3/2014 | Kawashima | G11C 13/0007 365/148 |
| 2015/0069480 A1* | 3/2015 | Kanaya | H01L 27/222 257/295 |
| 2015/0102280 A1* | 4/2015 | Lee | H01L 45/085 257/4 |

FOREIGN PATENT DOCUMENTS

| | | |
|---|---|---|
| JP | 2011-66143 | 3/2011 |
| JP | 2011-199186 | 10/2011 |

* cited by examiner

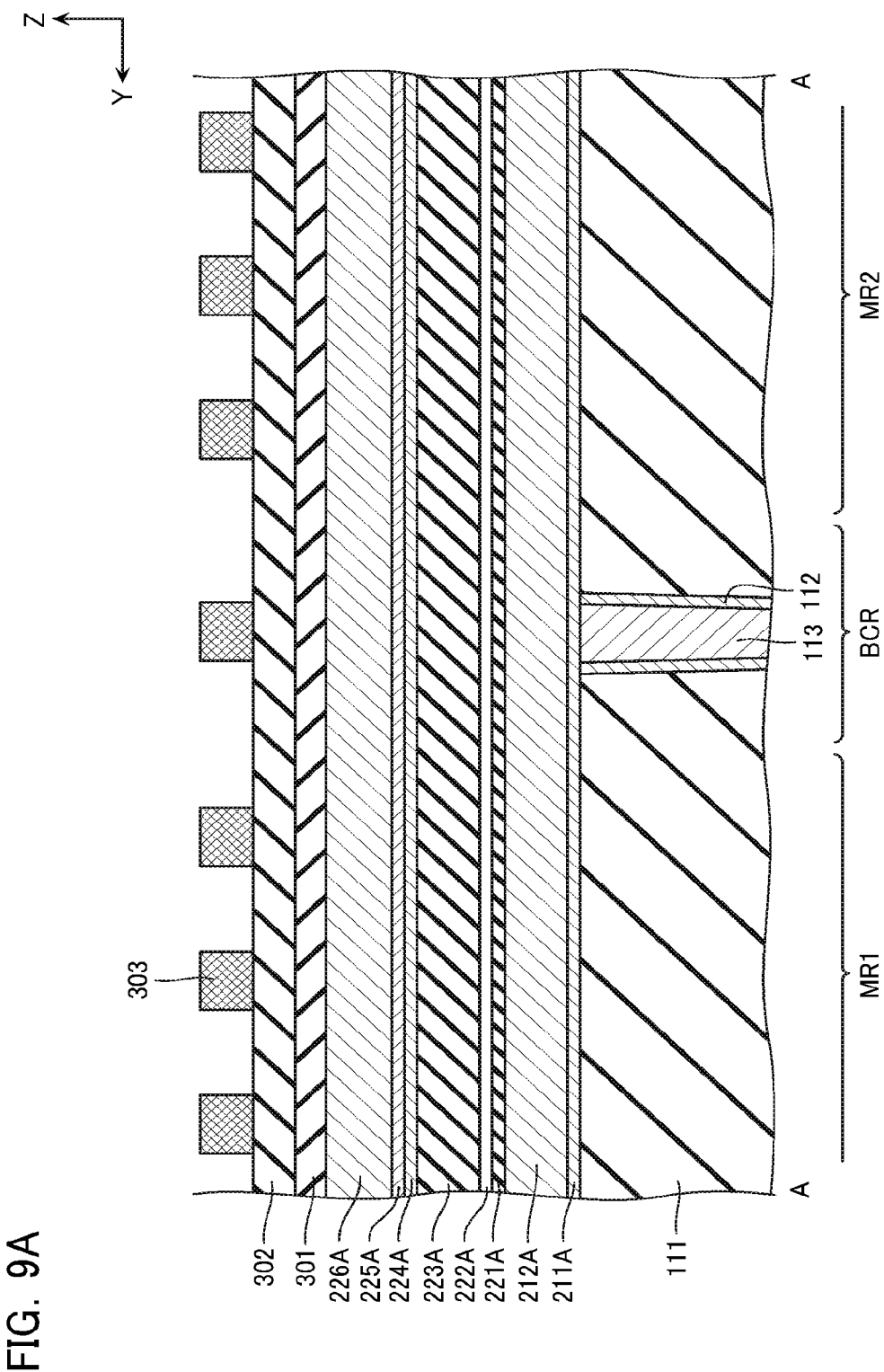

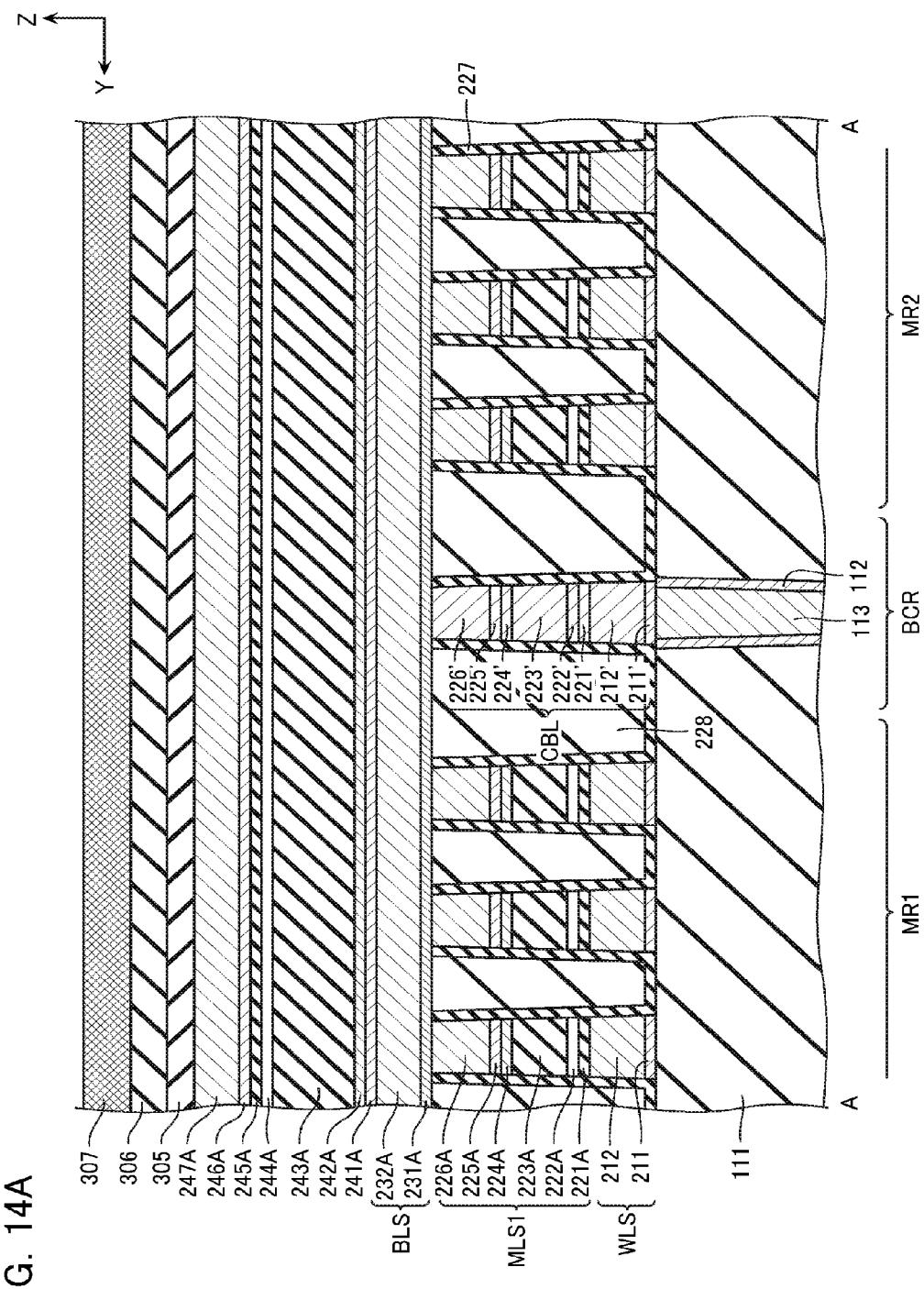

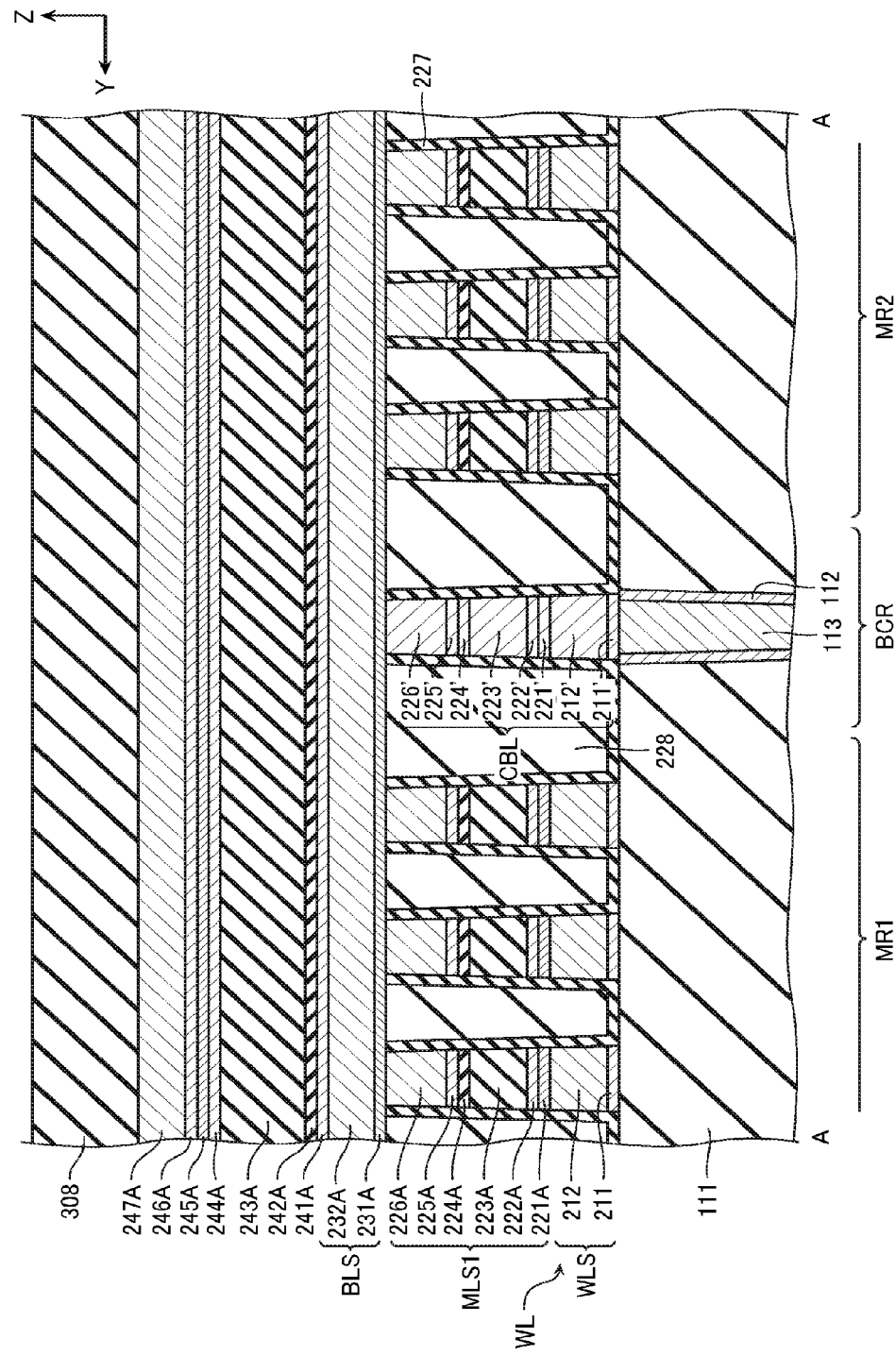

SEMICONDUCTOR MEMORY DEVICE AND METHOD OF MANUFACTURING THE SAME

CROSS REFERENCE TO RELATED APPLICATION

This application is based upon and claims the benefit of priority from U.S. Provisional Patent Application No. 62/216,816, filed on Sep. 10, 2015, the entire contents of which are incorporated herein by reference.

FIELD

The embodiments described herein relate to a semiconductor memory device and a method of manufacturing the same.

BACKGROUND

As a memory for storing and using large capacity data, a Resistive RAM (ReRAM) or the like that may be easily formed into a three-dimensional structure has drawn attention. Such a memory includes a variable resistance element as a memory element. Such a variable resistance element includes, for example, a Conduction Bridge RAM (CBRAM), a memory element including a chalcogenide chemical compound or metal oxide or the like, an MRAM device using a resistance change by a tunnel magnetoresistive effect, and a memory element including an electrically conductive polymer (a polymer ferroelectric RAM, PFRAM) or the like.

BRIEF DESCRIPTION OF THE DRAWINGS

FIG. 9A, 10A, 11A, 12A, 13A, 14A, 15A, 16A, 17A, 18A, 19A, 20A, 21A are cross-sectional views in the Y-Z plane illustrating a method of manufacturing the non-volatile semiconductor memory device;

DETAILED DESCRIPTION

A non-volatile semiconductor memory device according to one embodiment includes: a plurality of first wiring lines extending in a first direction, the first wiring lines being provided in a second direction intersecting the first direction; a plurality of second wiring lines extending in the second direction, the second wiring lines being provided in the first direction; a plurality of memory cells provided in the intersections between the first wiring lines and the second wiring lines, each memory cell having a first stack structure comprising at least a variable resistor film; a contact extending in a third direction intersecting the first and second directions, the contact having a first end connected to one of the first wiring lines or one of the second wiring lines, the contact having a second stack structure having a stack of a plurality of films; and a wiring layer connected to a second end of the contact. At least some of the films of the second stack structure have generally the same third direction position and film thickness as at least some of layers of the first stack structure. And, the second stack structure has a higher metal ratio than the first stack structure.

Next, non-volatile semiconductor memory devices according to the embodiments will be described in more detail with reference to the drawings. Note that these embodiments are only by way of example and not intended to limit the present invention.

For example, although a memory device including a Conduction Bridge RAM (CBRAM) is illustrated herein, the present invention may also be applicable to memory devices having other configurations. Such memory devices may have any configurations including such as a memory element including a chalcogenide chemical compound or metal oxide or the like, an MRAM using a resistance change by a tunnel magnetoresistive effect, and a memory element including an electrically conductive polymer (a polymer ferroelectric RAM, PFRAM) or the like. In addition, the memory cells of the memory device may or may not include a non-linear element such as a diode or a transistor.

In addition, as the structure of a memory cell array, a configuration including two layer stack of memory mats will be illustrated herein. However, the present invention may also be applicable to a configuration including one layer memory mat and a configuration including three or more layer stack of memory mats. In addition, a configuration including two layer stack of memory mats sharing bit-lines BL is illustrated herein. The present invention may also include a configuration including stacked memory mats sharing or not sharing word-lines WL.

First Embodiment

[Configuration]

Figure 1:
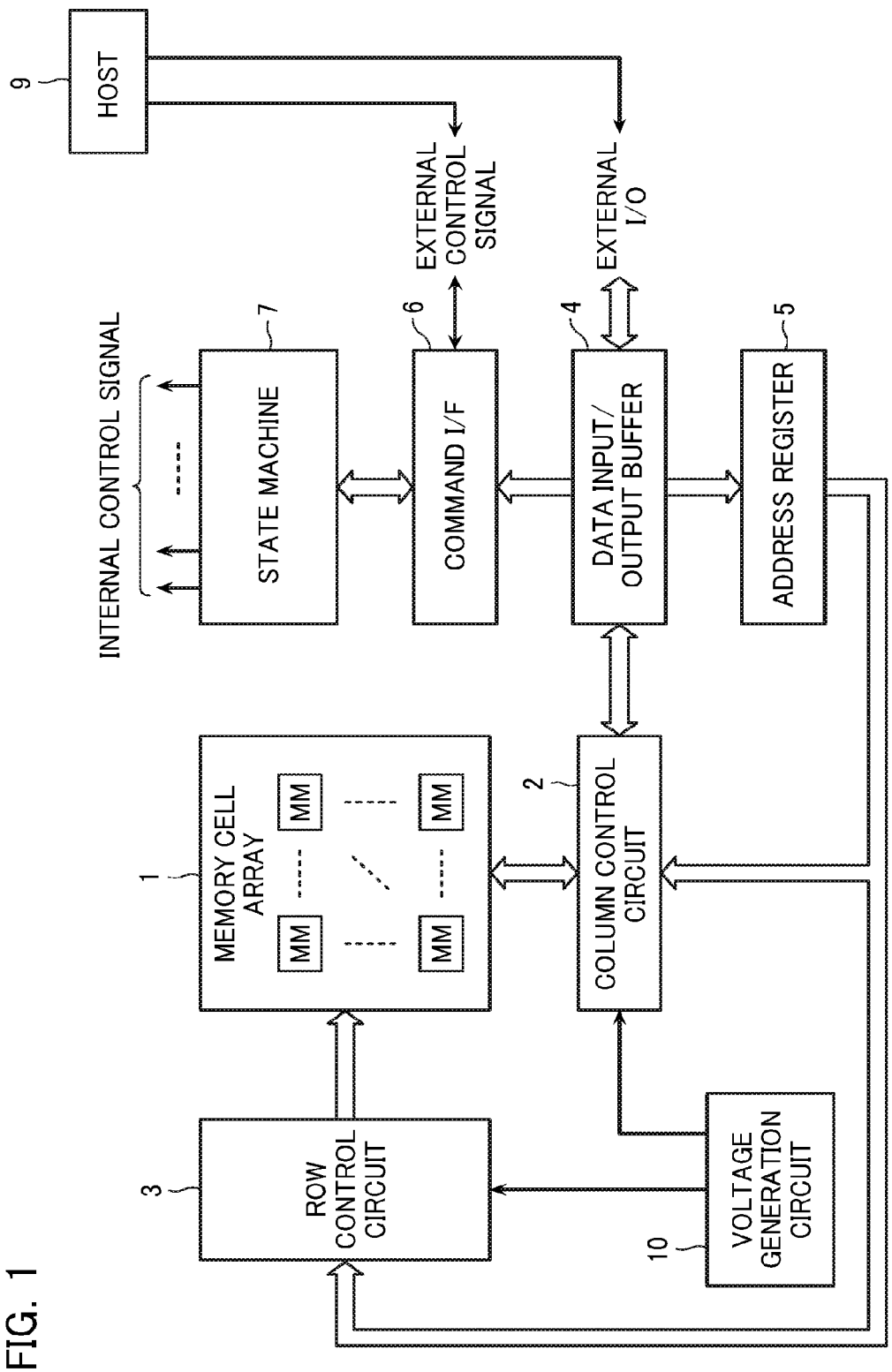
FIG. 1 is a block diagram of a non-volatile semiconductor memory device according to a first embodiment.

FIG. 1 is a block diagram of a non-volatile semiconductor memory device according to a first embodiment. The non-volatile semiconductor memory device stores user data input from an external host 9 at a predetermined address in a memory cell array 1. In addition, the non-volatile semiconductor memory device reads user data from a predetermined address in the memory cell array 1 and outputs it to the external host 9.

Figure 2:
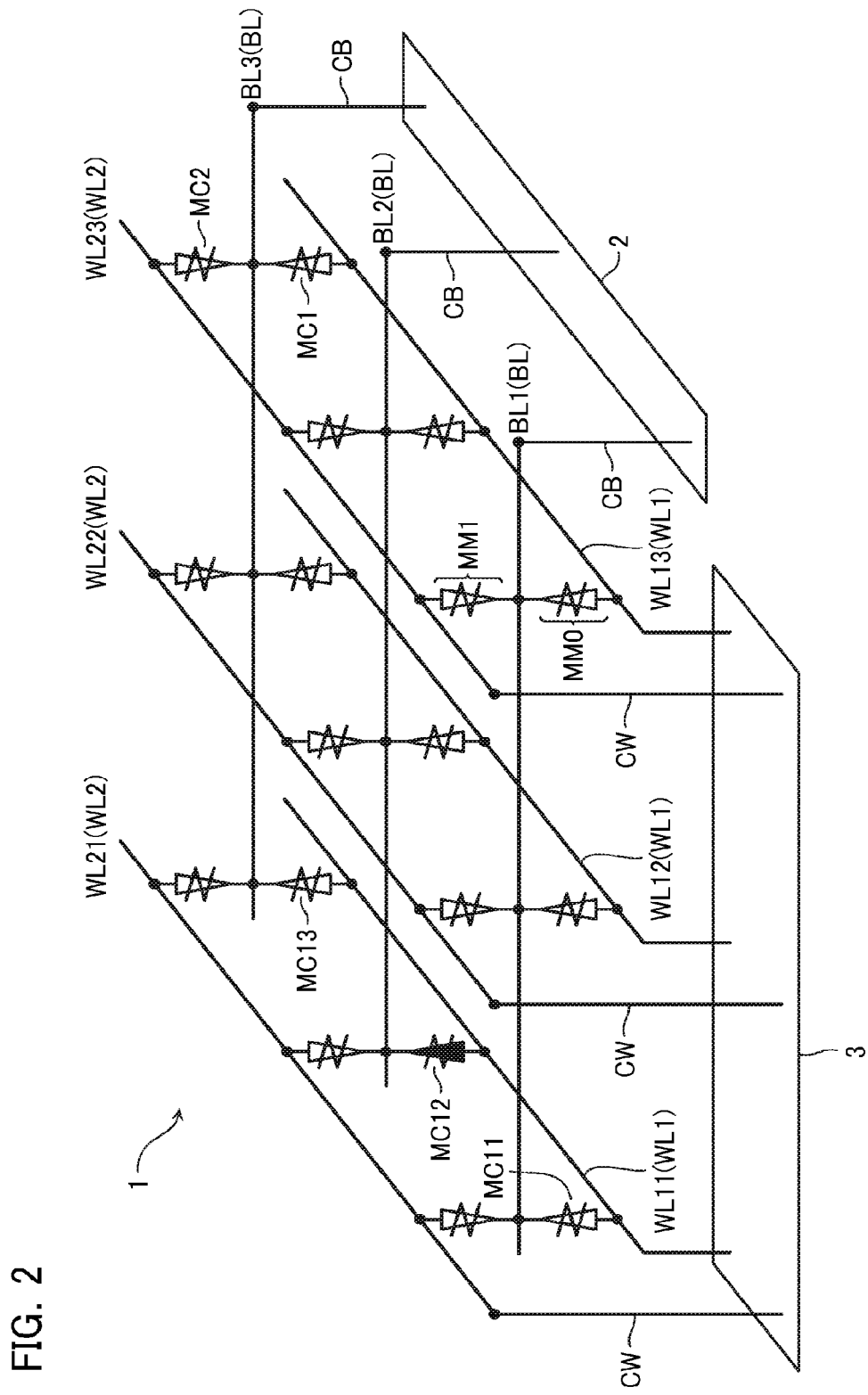
FIG. 2 is a circuit diagram partially illustrating the configuration of the non-volatile semiconductor memory device.

Specifically, as shown in FIG. 1, the non-volatile semiconductor memory device includes the memory cell array 1 for storing user data. The memory cell array 1 includes a plurality of memory mats MM. The memory mats MM include, as shown in FIG. 2, a plurality of memory cells MC1 and MC2, and bit-lines BL and word-lines WL1 and WL2 connected to the memory cells MC1 and MC2.

As shown in FIG. 1, the non-volatile semiconductor memory device includes a column control circuit 2 provided around the memory cell array 1. To write user data, the column control circuit 2 transfers, in response to user data input from the external host 9, a voltage generated by a voltage generation circuit 10 to a desired bit-line BL. In addition, the column control circuit 2 includes a not-shown sense amplifier and senses a voltage or potential of a predetermined bit-line BL to read user data.

As shown in FIG. 1, the non-volatile semiconductor memory device includes a row control circuit 3 provided around the memory cell array 1. The row control circuit 3 transfers, in response to address data input from the external host 9, a voltage generated by the voltage generation circuit 10 to desired word-lines WL1 and WL2 or the like.

As shown in FIG. 1, the non-volatile semiconductor memory device includes an address register 5 for supplying address data to the column control circuit 2 and the row control circuit 3. The address register 5 holds address data input from the data input/output buffer 4.

As shown in FIG. 1, the non-volatile semiconductor memory device includes the voltage generation circuit 10 for supplying a voltage to the memory cell array 1 via the column control circuit 2 and the row control circuit 3. The voltage generation circuit 10 generates, in response to an internal control signal input from a state machine 7, a predetermined amount of voltage at a predetermined timing and outputs it.

As shown in FIG. 1, the non-volatile semiconductor memory device includes the state machine 7 for inputting an internal control signal to the voltage generation circuit 10 or the like. The state machine 7 receives, via a command interface 6, command data from the host 9 to manage receiving, reading, writing, erasing, data input/output or the like.

As shown in FIG. 1, the non-volatile semiconductor memory device includes a data input/output buffer 4 connected to the external host 9 via an I/O line. The data input/output buffer 4 receives user data from the external host 9 and transfers it to the column control circuit 2. In addition, the data input/output buffer 4 receives command data from the external host 9 and transfers it to the command interface 6. In addition, the data input/output buffer 4 receives address data from the external host 9 and transfers it to the address register 5. In addition, the data input/output buffer 4 receives user data from the column control circuit 2 and transfers it to the external host 9.

As shown in FIG. 1, the non-volatile semiconductor memory device includes the command interface 6 for receiving an external control signal from the external host 9. The command interface 6 determines, in response to an external control signal input from the external host 9, whether data input to the data input/output buffer 4 is user data, command data, or address data, and controls the data input/output buffer 4. In addition, the command interface 6 transfers command data received from the data input/output buffer 4 to the state machine 7.

Note that the column control circuit 2, the row control circuit 3, the state machine 7, and the voltage generation circuit 10 or the like form a control circuit for controlling the memory cell array 1.

Next, with reference to FIG. 2, circuitry of the memory cell array 1 according to this embodiment will be partially described. FIG. 2 is an equivalent circuit diagram partially illustrating the configuration of the memory cell array 1.

As shown in FIG. 2, the memory cell array 1 includes a plurality of bit-lines BL, a plurality of word-lines WL1 and WL2, and a plurality of memory cells MC1 and MC2 connected to the bit-lines BL and the word-lines WL1 and WL2. The memory cells MC1 and MC2 are connected via the word-lines WL1 and WL2 and word-line contacts CW to the row control circuit 3 and via the bit-lines BL and bit-line contacts CB to the column control circuit 2. For example, the memory cells MC1 and MC2 connected to the respective common word-lines WL1 and WL2 each store one-page user data. In addition, the memory cells MC1 and MC2 each store, for example, one-bit data.

The memory cells MC1 and MC2 each function as a variable resistance element and change its resistance depending on the stored data. For example, memory cells MC11 and MC13 recording "0" are in a high resistance state and a memory cell MC2 recording "1" is in a low resistance state. Therefore, a word-line WL11 (selected word-line) connected to the memory cells MC11 to MC13 applied with a predetermined voltage does not draw a current through a bit-line BL1 and a bit-line BL3 connected to the respective memory cells MC11 and MC13 and draws a current through a bit-line BL2 connected to the memory cell MC12. Therefore, sensing the current by the column control circuit 2 allows reading of, for example, "010" data as user data. Note that the column control circuit 2 may sense a voltage of the bit-lines BL instead of their current.

In addition, the memory cells MC1 and MC2 may also function as a rectifying device. Therefore, other word-lines WL1 and WL2 (non-selected word-lines) than the selected word-line WL11 draw little current.

Note that a configuration including the bit-lines BL, the word-lines WL1, and the memory cells MC1 is hereinafter referred to a memory mat MM0. Likewise, a configuration including the bit-lines BL, the word-lines WL2, and the memory cells MC2 is referred to a memory mat MM1.

Figure 3:
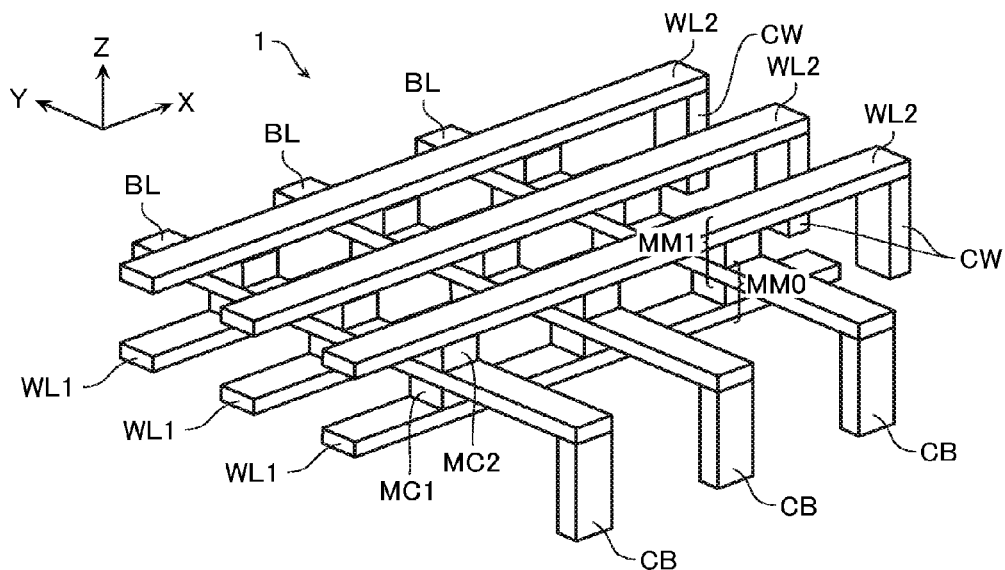
FIG. 3 is a perspective view partially illustrating the configuration of the non-volatile semiconductor memory device.

Next, with reference to FIG. 3, a schematic configuration of the memory cell array 1 will be described. FIG. 3 is a schematic perspective view partially illustrating the configuration of the memory cell array 1. Note that FIG. 3 omits a part of the configuration. In addition, the configuration shown in FIG. 3 is only by way of example, and the specific configuration may be changed as appropriate.

As shown in FIG. 3, the memory cell array 1 is a so-called cross point type of memory cell array. Specifically, the memory cell array 1 includes a plurality of word-lines WL1 provided in parallel in the Y direction and extending in the X direction. Each word-line WL1 is connected to a word-line contact CW and electrically connected to a not-shown wiring layer. The memory cell array 1 also includes, over the word-lines WL1, a plurality of bit-lines BL provided in parallel in the X direction and extending in the Y direction. Each bit-line BL is connected to a bit-line contact CB and electrically connected to a not-shown wiring layer.

The memory cell array 1 also includes, over the bit-lines BL, a plurality of word-lines WL2 provided in parallel in the Y direction and extending in the X direction. In addition, the intersections of the word-lines WL1 and the bit-lines BL each include the memory cell MC1 provided therein. Likewise, the intersections of the bit-lines BL and the word-lines WL2 each include the memory cell MC2 provided therein.

Figure 4:
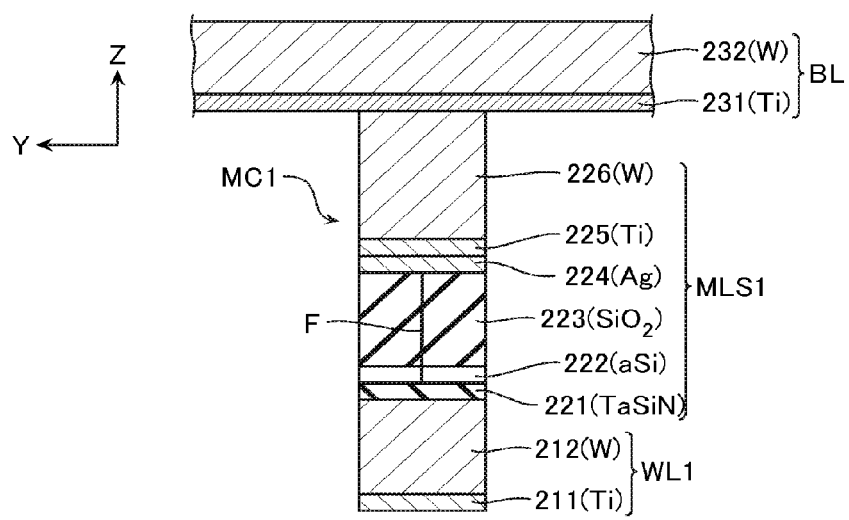
FIG. 4 is a cross-sectional view partially illustrating the configuration of the non-volatile semiconductor memory device.

Next, with reference to FIG. 4, the memory mat MM0 will be described. FIG. 4 is a cross-sectional view showing the configuration of the memory mat MM0. Note that FIG. 4 omits a part of the configuration.

As shown in FIG. 4, the memory mat MM0 includes the word-lines WL1, the memory cells MC1 provided on the upper surfaces of the word-lines WL1, and the bit-lines BL provided on the upper surfaces of the memory cells MC1. Each memory cell MC1 includes an electrically conductive filament F and is in a low resistance state when the filament F contacts an electrode layer 221. When the filament F is not contact with the electrode layer 221, each memory cell MC1 is in a high resistance state.

As shown in FIG. 4, each word-line WL1 includes, for example, a barrier metal layer 211 and an electrically conductive layer 212 stacked on the barrier metal layer 211. In other words, in this embodiment, each word-line WL1 has a word-line stack structure WLS1 including a stack of the barrier metal layer 211 and the electrically conductive layer 212. The barrier metal layer 211 includes, for example, an electrically conductive layer such as titanium (Ti). The barrier metal layer 211 may limit the diffusion of impurities or the like in the deposition of the electrically conductive layer 212. The electrically conductive layer 212 includes, for example, an electrically conductive layer such as tungsten (W).

As shown in FIG. 4, each memory cell MC1 includes, for example, the word-line WL1, the electrode layer 221, a high resistance layer 222, an insulating layer 223, a metal layer 224, a barrier metal layer 225, and an electrically conductive layer 226 that are sequentially stacked on the word-line WL1. In other words, in this embodiment, each memory cell MC1 has a memory cell stack structure MLS1 including a stack of the above layers.

The electrode layer 221 includes, for example, a material such as silicon tantalum nitride (TaSiN). Also, the electrode layer 221 functions as an electrode in contact with the filament F. The high resistance layer 222 may include a material such as for example amorphous silicon that has a higher resistance than an electrically conductive material such as a metal and a lower resistance than an insulating material such as oxide. Also, the high resistance layer 222 functions as a series resistance in the memory cell MC1. The insulating layer 223 includes, for example, an insulating layer such as silicon oxide ($SiO_2$). Also, the insulating layer 223 functions as a medium in which the filament F grows. The metal layer 224 includes, for example, a metal such as silver (Ag) and copper (Cu). Also, the metal layer 224 functions as a source of metal ions forming filament F. The barrier metal layer 225 includes, for example, an electrically conductive layer such as titanium (Ti). Then, the barrier metal layer 225 limits the diffusion of impurities or the like in the deposition of the metal layer 224 or the electrically conductive layer 226. The electrically conductive layer 226 includes, for example, an electrically conductive layer such as tungsten (W).

As shown in FIG. 4, each bit-line BL includes, for example, a barrier metal layer 231 and an electrically conductive layer 232 stacked on the barrier metal layer 231. In other words, in this embodiment, each bit-line BL has a bit-line stack structure BLS including a stack of the barrier metal layer 231 and the electrically conductive layer 232. The barrier metal layer 231 includes, for example, an electrically conductive layer such as titanium (Ti). The barrier metal layer 231 may limit the diffusion of impurities or the like in the deposition of the electrically conductive layer 232. The electrically conductive layer 232 includes, for example, an electrically conductive layer such as tungsten (W).

Note that the material of each configuration is only by way of illustration and may be changed as appropriate. For example, the insulating layer 223 may include a material such as silicon nitride (SiN), silicon oxynitride (SiON), oxidation aluminum ($Al_2O_3$), and hafnium oxide (HfO). In addition, the electrode layer 221 may include a material such as amorphous silicon, polysilicon, tantalum nitride (TaN), and aluminum tantalum nitride. In addition, the electrically conductive layer 212 and the electrode layer 221 may further include a barrier metal layer between them.

Figure 5:
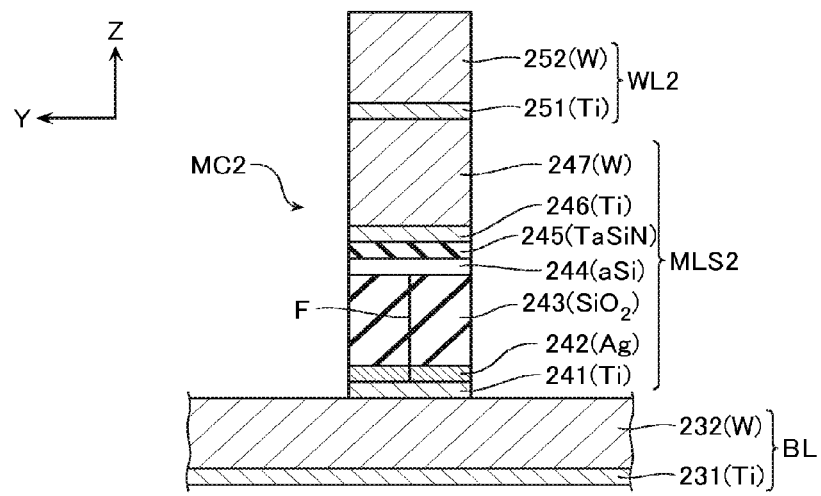
FIG. 5 is a cross-sectional view partially illustrating the configuration of the non-volatile semiconductor memory device.

Next, with reference to FIG. 5, the memory mat MM1 will be described. FIG. 5 is a cross-sectional view showing the configuration of the memory mat MM1. Note that FIG. 5 omits a part of the configuration.

As shown in FIG. 5, the memory mat MM1 includes the bit-lines BL, the memory cells MC2 provided on the upper surfaces of the bit-lines BL, and the word-lines WL2 provided on the upper surfaces of the memory cells MC2. Each memory cell MC2 includes, like the memory cell MC1, the electrically conductive filament F and is in a low resistance state when the filament F contacts an electrode layer 245 and in a high resistance state when the filament F is not contact with the electrode layer 245.

As shown in FIG. 5, each memory cell MC2 includes, for example, the bit-line BL, a barrier metal layer 241, a metal layer 242, an insulating layer 243, a high resistance layer 244, the electrode layer 245, a barrier metal layer 246, and an electrically conductive layer 247 that are sequentially stacked on the bit-line BL. In other words, each memory cell MC2 has a memory cell stack structure MLS2 including a stack of the above layers.

The barrier metal layers 241 and 246 each include, for example, an electrically conductive layer such as titanium (Ti). Also, the barrier metal layers 241 and 246 limit the diffusion of impurities or the like in the deposition of the electrode layer 245, the metal layer 242, or the electrically conductive layer 247. The metal layer 242 includes, for example, a metal such as silver (Ag) or copper (Cu). Also, the metal layer 242 functions as a source of metal ions forming the filament F. The insulating layer 243 includes, for example an insulating layer such as silicon oxide ($SiO_2$). Also, the insulating layer 243 functions as a medium in which the filament F grows. The high resistance layer 244 may include a material such as for example amorphous silicon that has a higher resistance than an electrically conductive material such as a metal and a lower resistance than an insulating material such as oxide. Also, the high resistance layer 244 functions as a series resistance in the memory cell MC2. The electrode layer 245 includes, for example, a material such as silicon tantalum nitride (TaSiN) and functions as an electrode to contact the filament F. The electrically conductive layer 247 includes, for example, an electrically conductive layer such as tungsten (W).

As shown in FIG. 5, each word-line WL2 includes, for example, a barrier metal layer 251 and an electrically conductive layer 252 stacked on the barrier metal layer 251. In other words, each word-line WL2 has a word-line stack structure WLS2 including a stack of the barrier metal layer 251 and the electrically conductive layer 252. The barrier metal layer 251 includes, for example, an electrically conductive layer such as titanium (Ti). The barrier metal layer 251 may limit the diffusion of impurities or the like in the deposition of the electrically conductive layer 252. The electrically conductive layer 252 includes, for example, an electrically conductive layer such as tungsten (W).

Note that the material of each configuration is only by way of illustration and may be changed as appropriate. For example, the electrode layer 245 may include a material such as amorphous silicon, polysilicon, tantalum nitride (TaN), and aluminum tantalum nitride. For example, the insulating layer 243 may include a material such as silicon nitride (SiN), silicon oxynitride (SiON), oxidation aluminum (Al$_2$O$_3$), and hafnium oxide (HfO). In addition, the high resistance layer 244 and the electrode layer 245 may further include a barrier metal layer between them.

Figure 6:
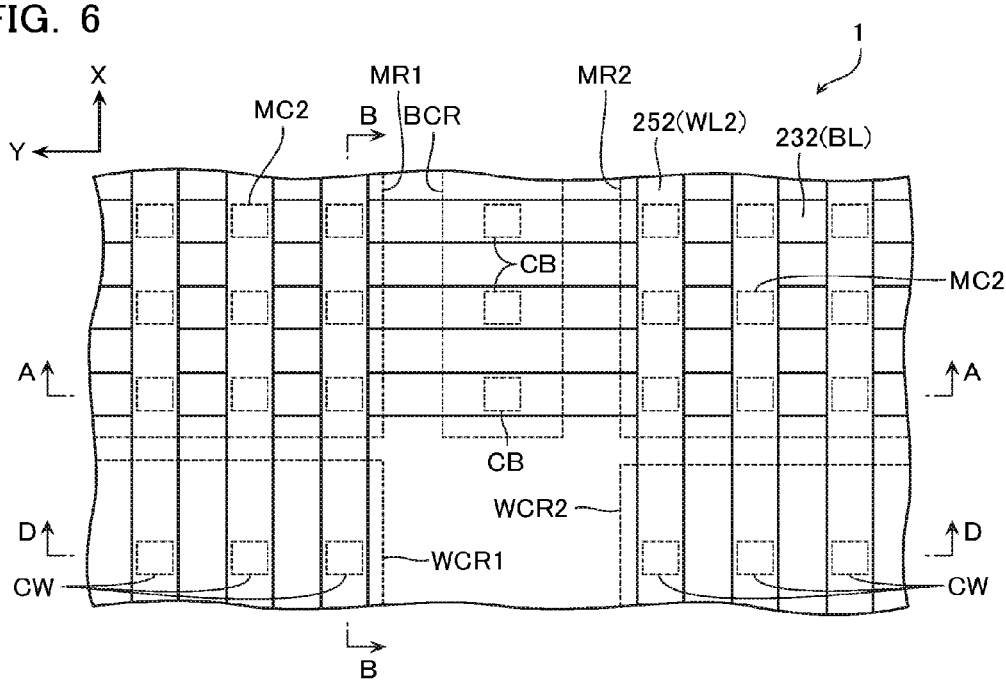
FIG. 6 is a plan view partially illustrating the configuration of the non-volatile semiconductor memory device.
Figure 7:
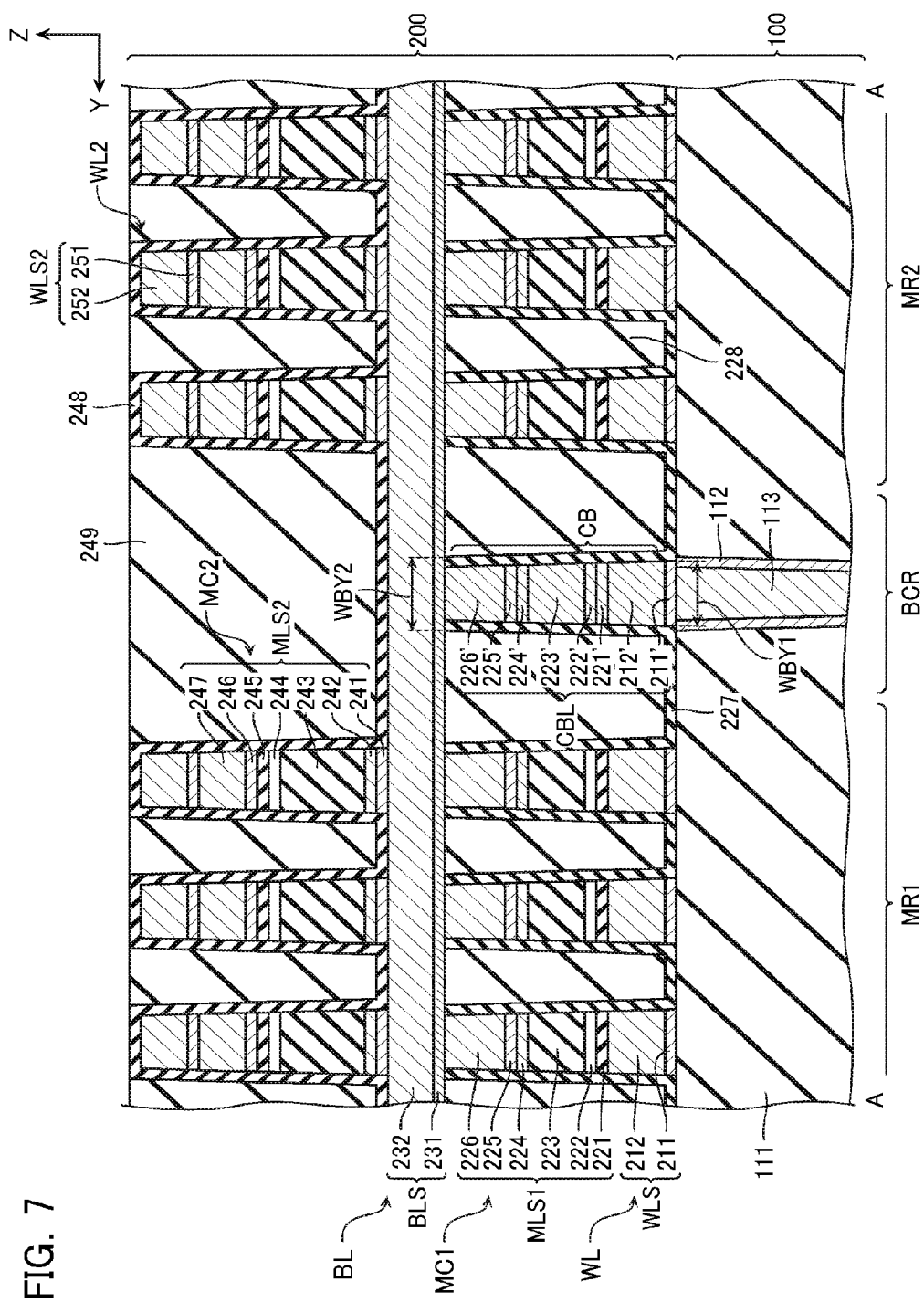
FIG. 7 is a cross-sectional view in the Y-Z plane partially illustrating the configuration of the non-volatile semiconductor memory device.
Figure 8:
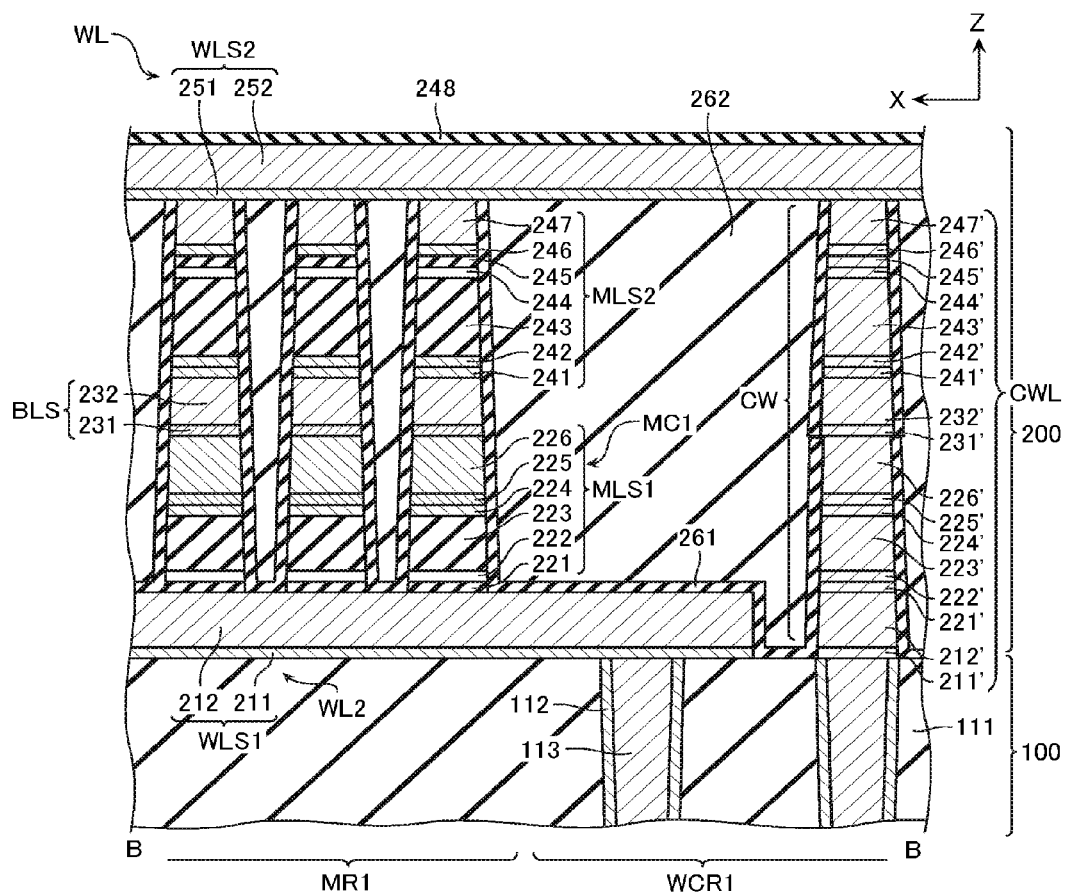
FIG. 8 is a cross-sectional view in the X-Z plane partially illustrating the configuration of the non-volatile semiconductor memory device.

Next, with reference to FIG. 6 to FIG. 8, the memory cell array 1 according to this embodiment will be described in more detail. FIG. 6 is a plan view partially illustrating the configuration of the memory cell array 1. FIG. 7 and FIG. 8 are cross-sectional views partially illustrating the configuration of the memory cell array 1. FIG. 7 and FIG. 8 show cross-sections corresponding to A-A and B-B in FIG. 6, respectively. Note that FIG. 6 omits a part of the configuration.

As shown in FIG. 6, the memory cell array 1 according to this embodiment includes a plurality of memory areas MR1 and MR2 provided therein. In addition, a bit-line contact region BCR is provided adjacent to the memory areas MR1 and MR2 in the Y direction. In addition, word-line contact regions WCR1 and WCR2 are provided adjacent to the memory areas MR1 and MR2 in the X direction.

As shown in FIG. 6 to FIG. 8, the memory areas MR1 and MR2 each include the bit-lines BL provided in parallel in the X direction and extending in the Y direction and the word-lines WL1 and word-lines WL2 (see FIG. 7 and FIG. 8) provided in parallel in the Y direction and extending in the X direction. In addition, the intersections between the bit-lines BL and the word-lines WL1 and WL2 include the memory cells MC1 and MC2 provided therein.

As shown in FIG. 6, the bit-line contact region BCR includes the bit-lines BL provided in the X direction and extending in parallel in the Y direction. In other words, the bit-lines BL are provided over the memory areas MR1 and MR2 and the bit-line contact region BCR. In addition, as shown in FIG. 6 and FIG. 7, the bit-lines BL are connected to the respective bit-line contacts CB. Each bit-line contact CB extends in the Z-direction and has an upper end connected to the lower surface of the bit-line BL and a lower end connected to an electrically conductive layer 113 of a lower wiring layer 100.

As shown in FIG. 6 to FIG. 8, the word-line contact regions WCR1 and WCR2 each include the word-lines WL1 and WL2 provided in the Y direction and extending in parallel in the X direction. In other words, the word-lines WL1 and WL2 are provided over the memory areas MR1 and MR2 and the word-line contact regions WCR1 and WCR2. In addition, as shown in FIG. 8, each word-line WL1 is connected, in the word-line contact region WCR1 or WCR2, to the electrically conductive layer 113 of the lower wiring layer 100. In addition, as shown in FIG. 6 and FIG. 8, each word-line WL2 is connected to the word-line contact CW. Each word-line contact CW extends in the Z-direction and has an upper end connected to the lower surface of the word-line WL2 and a lower end connected to the electrically conductive layer 113 of the lower wiring layer 100. Each word-lines WL2 is connected, via the word-line contact CW, to the electrically conductive layer 113 of the lower wiring layer 100.

Then, in this embodiment, as shown in FIG. 7 and FIG. 8, each bit-line contact CB and each word-line contact CW have a stack structure CBL and CBW including a stack of a plurality of films respectively.

As shown in FIG. 7, some of the layers of the stack structure CBL of the bit-line contact CB have generally the same film thickness and Z-direction position as the respective layers of the stack structure MLS1 of the memory cell MC1. Specifically, the stack structure CBL has a layer 221', a layer 222', a layer 223', a layer 224', a layer 225', and a layer 226'. The layer 221' has generally the same film thickness and Z-direction position as the electrode layer 221. The layer 222' has generally the same film thickness and Z-direction position as the high resistance layer 222. The layer 223' has generally the same film thickness and Z-direction position as the insulating layer 223. The layer 224' has generally the same film thickness and Z-direction position as the metal layer 224. The layer 225' has generally the same film thickness and Z-direction position as the barrier metal layer 225. Also, the layer 226' has generally the same film thickness and Z-direction position as the electrically conductive layer 226.

In addition, in this embodiment, the stack structure CBL of the bit-line contact CB further includes the stack structure WLS1 of the word-line WL1. Specifically, the stack structure CBL includes the stack structure WLS1 of the word-line WL with its upper surface deposited with the stack structure MLS1 of the memory cell MC1 whose insulating layers are replaced with electrically conductive layers. Specifically, the stack structure CBL includes a layer 211' and a layer 212'. The layer 211' has generally the same film thickness and Z-direction position as the barrier metal layer 211. The layer 212' has generally the same film thickness and Z-direction position as the electrically conductive layer 212.

Here, the stack structure MLS1 of the memory cell MC1 includes, as described above, the high resistance layer 222 and the insulating layer 223. However, in this embodiment, the stack structure CBL of the bit contact CB does not include an insulating layer and all layers 211' to 212' and layers 221' to 226' are electrically conductive layers.

Specifically, the stack structure CBL of the bit-line contact CB has the same configuration as the stack structure MLS1 of the memory cell MC1 with an electrically conductive material such as metal ions added thereto. Therefore, although the bit-line contact CB has the same stack structure CBL as the stack structure MLS1 that includes the high resistance layer 222 and the insulating layer 223, it is electrically conductive and may electrically connect the bit-line BL and the electrically conductive layer 113 of the lower wiring layer 100.

Note that as understood from the above description, in this embodiment, two stack structures having the same stack structure means that the two stack structures have generally the same number of layers included therein and the corresponding layers of the two stack structures have generally the same thicknesses in the Z-direction, not meaning that the corresponding layers of the two stack structures have the same ratio of the component materials.

As shown in FIG. 8, the stack structure CWL of the word-line contact CW has a stack of, from the lower wiring layer 100 side, the stack structure WLS of the word-line WL, the stack structure MLS1 of the memory cell MC1 whose insulating layer and high resistance layer are replaced with electrically conductive layers, the stack structure BLS of the bit-line BL, and the stack structure MLS2 of the memory cell MC2 whose insulating layer and high resistance layer are replaced with electrically conductive layers.

Specifically, some of the layers of the stack structure CWL of the word-line contact CW have generally the same film thickness and Z-direction position as the layers of the stack structure MLS1 of the memory cell MC1 and the layers of the memory cell MC2. In addition, like the bit-line contact CB, all layers of the stack structure CWL are electrically conductive.

Specifically, the stack structure CWL includes the layer 221', the layer 222', the layer 223', the layer 224', the layer 225', and the layer 226'. The layer 221' has generally the same film thickness and Z-direction position as the electrode layer 221. The layer 222' has generally the same film thickness and Z-direction position as the high resistance layer 222. The layer 223' has generally the same film thickness and Z-direction position as the insulating layer 223. The layer 224' has generally the same film thickness and Z-direction position as the metal layer 224. The layer 225' has generally the same film thickness and Z-direction position as the barrier metal layer 225. Also, the layer 226' has generally the same film thickness and Z-direction position as the electrically conductive layer 226.

In addition, the stack structure CWL includes a layer 241', a layer 242', a layer 243', a layer 244', a layer 245', a layer 246', and a layer 247'. The layer 241' has generally the same film thickness and Z-direction position as the barrier metal layer 241. The layer 242' has generally the same film thickness and Z-direction position as the metal layer 242. The layer 243' has generally the same film thickness and Z-direction position as the insulating layer 243. The layer 244' has generally the same film thickness and Z-direction position as the high resistance layer 244. The layer 245' has generally the same film thickness and Z-direction position as the electrode layer 245. The layer 246' has generally the same film thickness and Z-direction position as the barrier metal layer 246. Also, the layer 247' has generally the same film thickness and Z-direction position as the electrically conductive layer 247.

In addition, some of the layers of the stack structure CWL have generally the same film thickness and Z-direction as the layers of the stack structure WLS1 of the word-line WL1 and the layers of the stack structure BLS of the bit-line BL. Specifically, the stack structure CWL includes the layer 211', the layer 212', the layer 231', and the layer 232'. The layer 211' has generally the same film thickness and Z-direction position as the barrier metal layer 211. The layer 212' has generally the same film thickness and Z-direction position as the electrically conductive layer 212. The layer 231' has generally the same film thickness and Z-direction position as the barrier metal layer 231. The layer 232' has generally the same film thickness and Z-direction position as the electrically conductive layer 232.

The above configuration allows the word-line contact CW to have, in spite of having the same stack structure as the stack structures MLS1 and MLS2 that include the high resistance layers 222 and 224 and the insulating layers 223 and 243, electrical conductivity and electrically connect the word-line WL and the electrically conductive layer 113 of the lower wiring layer 100.

In addition, in this embodiment, the bit-line contact CB has, as shown in FIG. 7, a reversely tapered shape viewed from the X direction. Specifically, as shown in FIG. 7, in the Y direction, the bit-line contact CB has a lower end width WBY1 larger than an upper end width WBY2.

In addition, the word-line contact CW has, as shown in FIG. 8, a stack of reversely tapered structures viewed from the Y direction. Specifically, the word-line contact CW has a stack of two reversely tapered shapes each thinning from the lower end having a width WWX1 in the X direction to the upper end having a width WWX2 smaller than the width WWX1.

This may prevent too small cross sectional area of the upper or lower end of the contact, thus avoiding the increase of the wiring resistance.

In addition, because of the contacts having a similar stack structure to the wiring lines and the memory cells MC, the contacts CB and CW have generally the same width as the bit-lines BL, the word-lines WL, and the memory cells MC1 and MC2 in the X and Y directions.

This may control the X and Y direction widths of the bit-line contact CB and the word-line contact CW. Therefore, the area occupied by the bit-line contact region BCR and the word-line contact region WCR may be reduced.

Note that the foregoing is with respect to the stack structure CWL of the word-line contact CW that is similar to both stack structures (MLS1 and MLS2) of the memory cells (MC1 and MC2) between the upper and lower ends of the word-line contact CW. However, the stack structure CWL of the word-line contact CW may be similar to only one of the stack structures of the memory cells MC1 and MC2.

[Manufacturing Method]

Next, with reference to FIG. 9A, 10A, 11A, 12A, 13A, 14A, 15A, 16A, 17A, 18A, 19A, 20A, 21A, FIG. 9B, 10B, 11B, 12B, 13B, 14B, 15B, FIG. 16B, FIGS. 17B, 18B, 19B, 20B, and 21B, a method of manufacturing the semiconductor memory device according to this embodiment will be described. FIG. 9A, 10A, 11A, 12A, 13A, 14A, 15A, 16A, 17A, 18A, 19A, 20A, 21A are cross-sectional views in the XZ-plane illustrating a method of manufacturing the non-volatile semiconductor memory device according to this embodiment and correspond to the A-A line cross-sectional view in FIG. 6. FIG. 9B, 10B, 11B, 12B, 13B, 14B, 15B, FIG. 16B, FIGS. 17B, 18B, 19B, 20B, and 21B are cross-sectional views in the YZ-plane showing the manufacturing method and correspond to the B-B line cross-sectional view in FIG. 6.

Figure 9B:
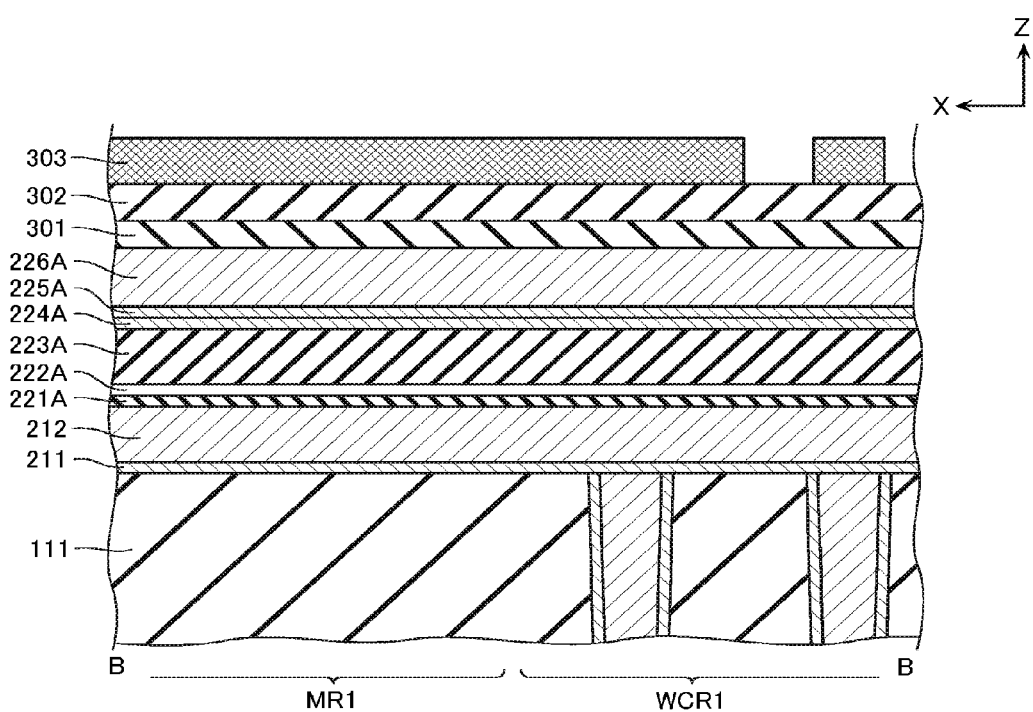
FIG. 9B, 10B, 11B, 12B, 13B, 14B, 15B, 16B, 17B, 18B, 19B, 20B, 21B are cross-sectional views in the X-Z plane illustrating the manufacturing method.

First, as shown in FIG. 9A and FIG. 9B, over the lower wiring layer 100 formed on a not-shown substrate, a barrier metal layer 211A and an electrically conductive layer 212A of the word-line WL are formed. The lower wiring layer 100 includes an interlayer insulating layer 111, an electrically conductive layer 113, and an interlayer insulating layer 112. The electrically conductive layer 113 and the interlayer insulating layer 112 are provided in the interlayer insulating layer 111. The interlayer insulating layer 111 may include, for example, silicon oxide (SiO). The electrically conductive layer 112 may include, for example, tungsten (W). The interlayer insulating layer 112 may include, for example, silicon nitride (SiN). Th barrier metal layer 211A includes, for example, an electrically conductive layer such as titanium (Ti). The electrically conductive layer 212A includes, for example, an electrically conductive layer such as tungsten (W).

The structure is deposited with an electrode layer 221A, a high resistance layer 222A, an insulating layer 223A, a metal layer 224A, a barrier metal layer 225A, and an electrically conductive layer 226A, sequentially, which are of the memory cell MC1. The electrode layer 221A includes, for example, a material such as silicon tantalum nitride (TaSiN). The high resistance layer 222A includes, for example, a material such as polysilicon. The insulating layer 223A includes, for example, an insulating layer such as silicon oxide ($SiO_2$). The metal layer 224A includes, for example, a metal such as silver (Ag) or copper (Cu). The barrier metal layer 225A includes, for example, an electrically conductive layer such as titanium (Ti). The electrically conductive layer 226A includes, for example, an electrically conductive layer such as tungsten (W).

Then, the electrically conductive layer 226A is provided with an insulating layer 301 and an insulating layer 302 that provide masks during etching. The structure is provided on its upper surface with a resist 303 that corresponds to the patterns of the word-line WL1 and the bit-line contact CB. The insulating layer 301 includes, for example, silicon nitride (SiN). The insulating layer 302 includes, for example, silicon oxide (SiO).

Figure 10A:
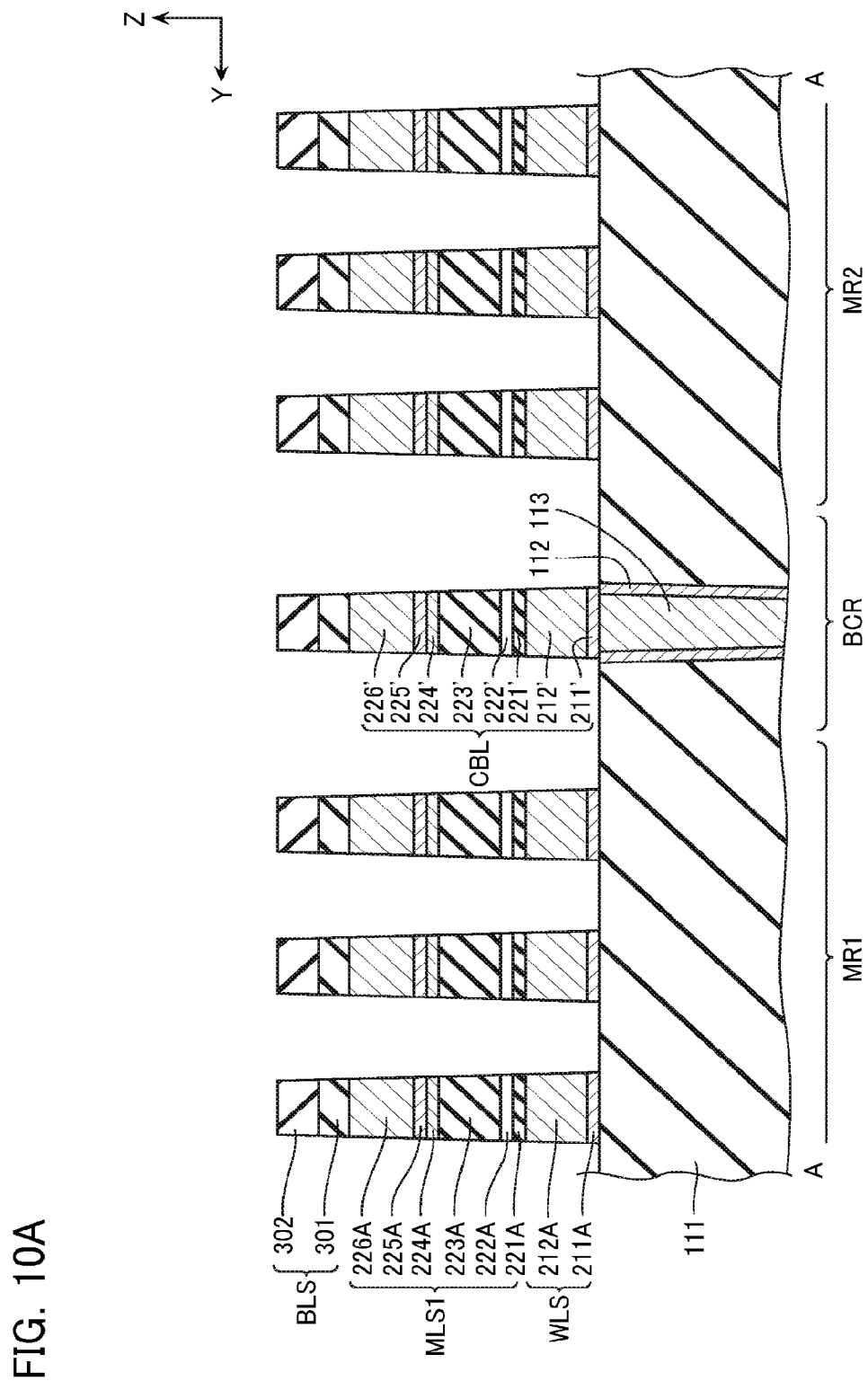
Figure 10B:
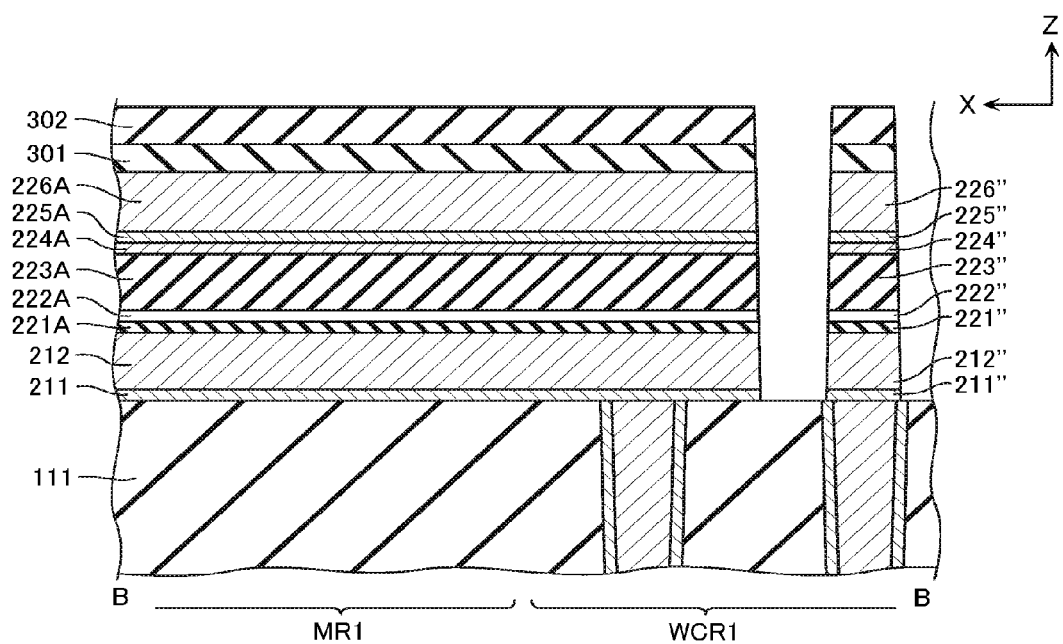

As shown in FIG. 10A and FIG. 10B, each layer of the word-lines WL1 (the barrier metal layer 211A and the electrically conductive layer 212A) and each layer of the memory cell MC1 (the electrode layer 221A, the high resistance layer 222A, the insulating layer 223A, the metal layer 224A, the barrier metal layer 225A, and the electrically conductive layer 226A) are etched to be divided in the Y direction along the pattern of the word-line WL1. This step forms the word-line WL1 (the barrier metal layer 211 and the electrically conductive layer 212). This step also forms the stack structure CBL of the bit-line contact CB.

Figure 11A:
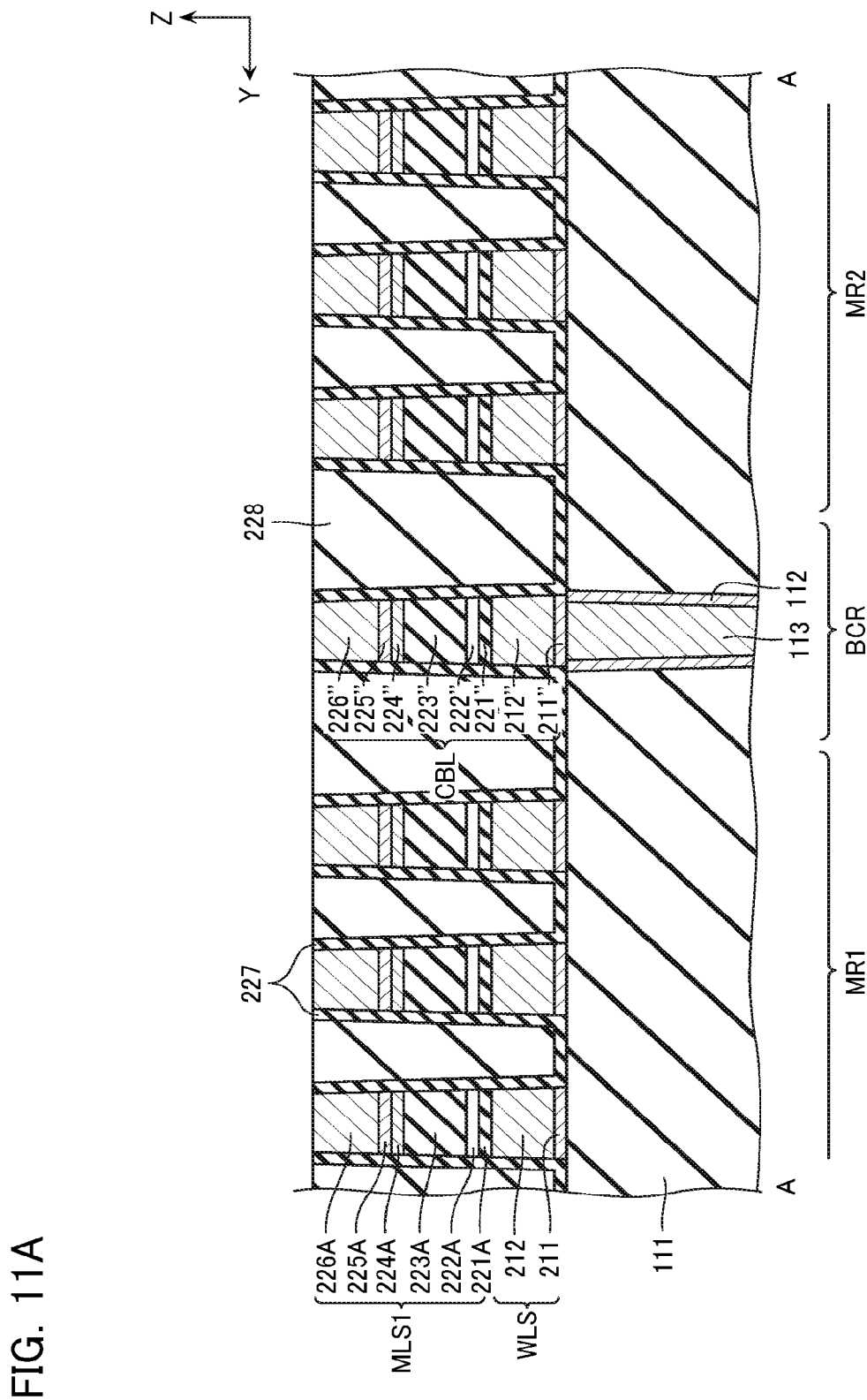
Figure 11B:
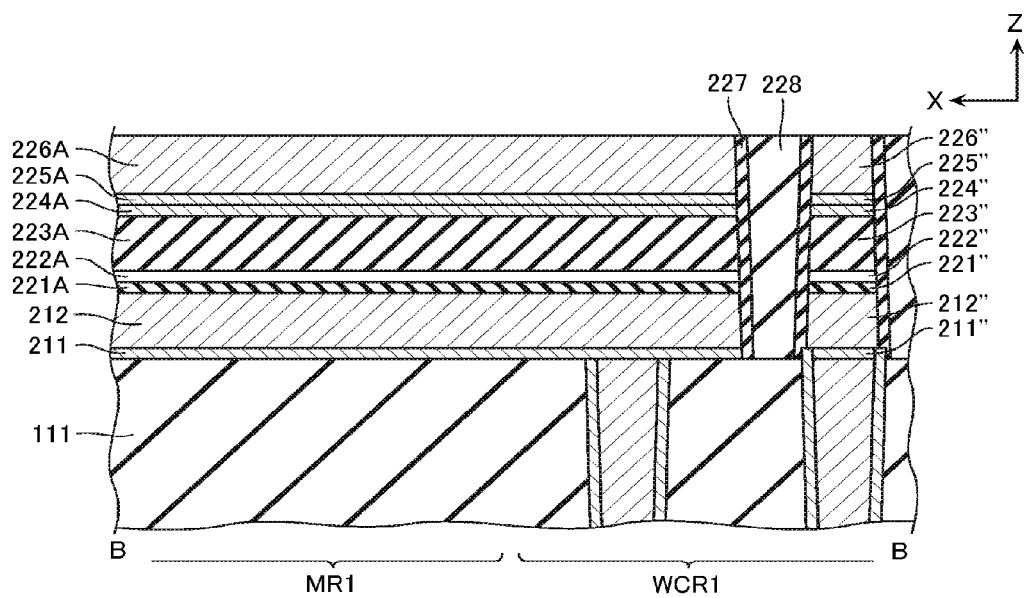

As shown in FIG. 11A and FIG. 11B, after removing the insulating layer 301 and the insulating layer 302, the memory cell MC1 and the stack structure CBL of the bit-line contact CB are deposited with a nitride film 227, then filled with an interlayer dielectric film 228, and planarized by CMP or the like. The nitride film 227 includes, for example, silicon nitride (SiN). The interlayer dielectric film 228 includes, for example, silicon oxide (SiO).

Figure 12A:
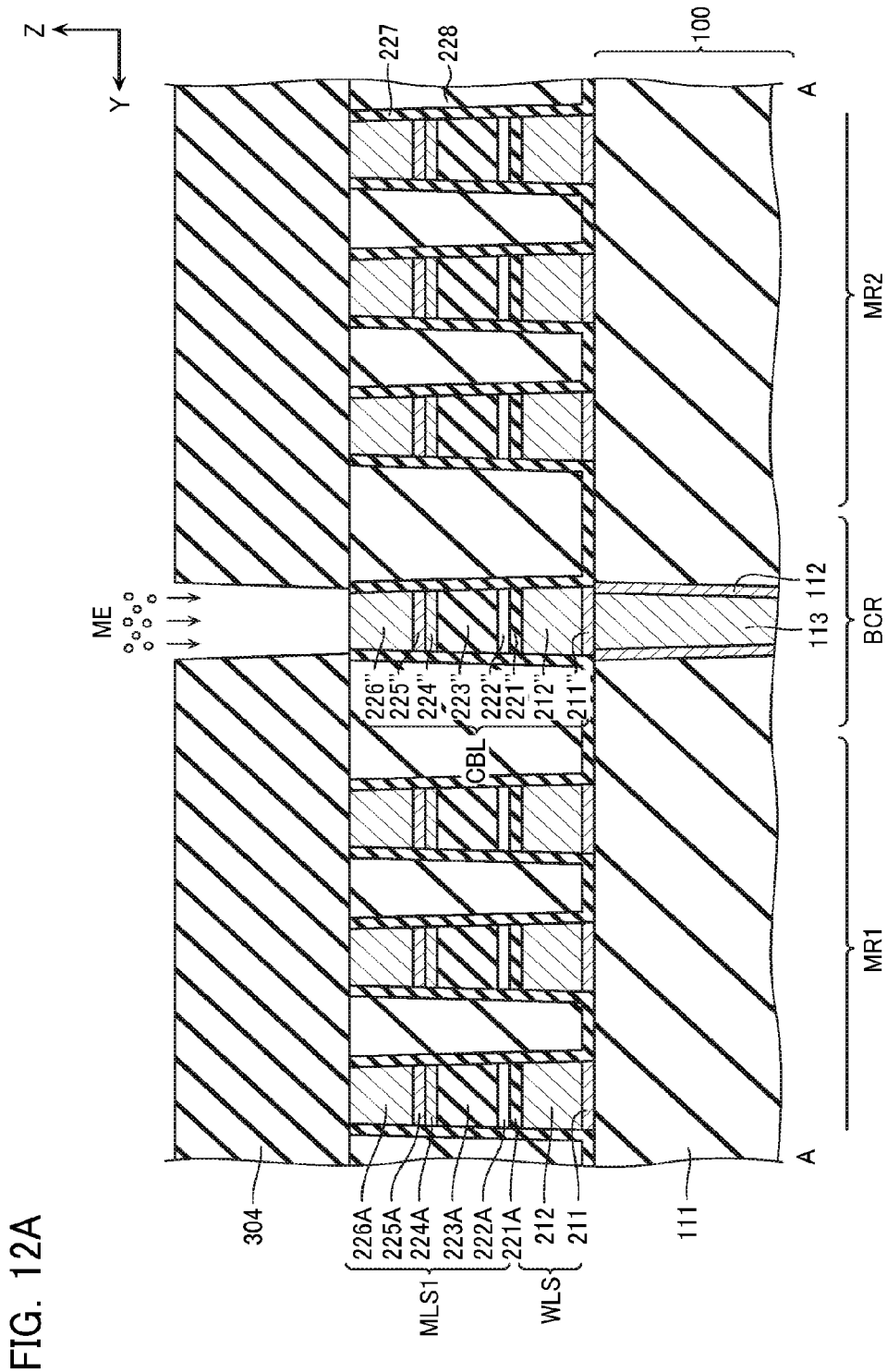
Figure 12B:
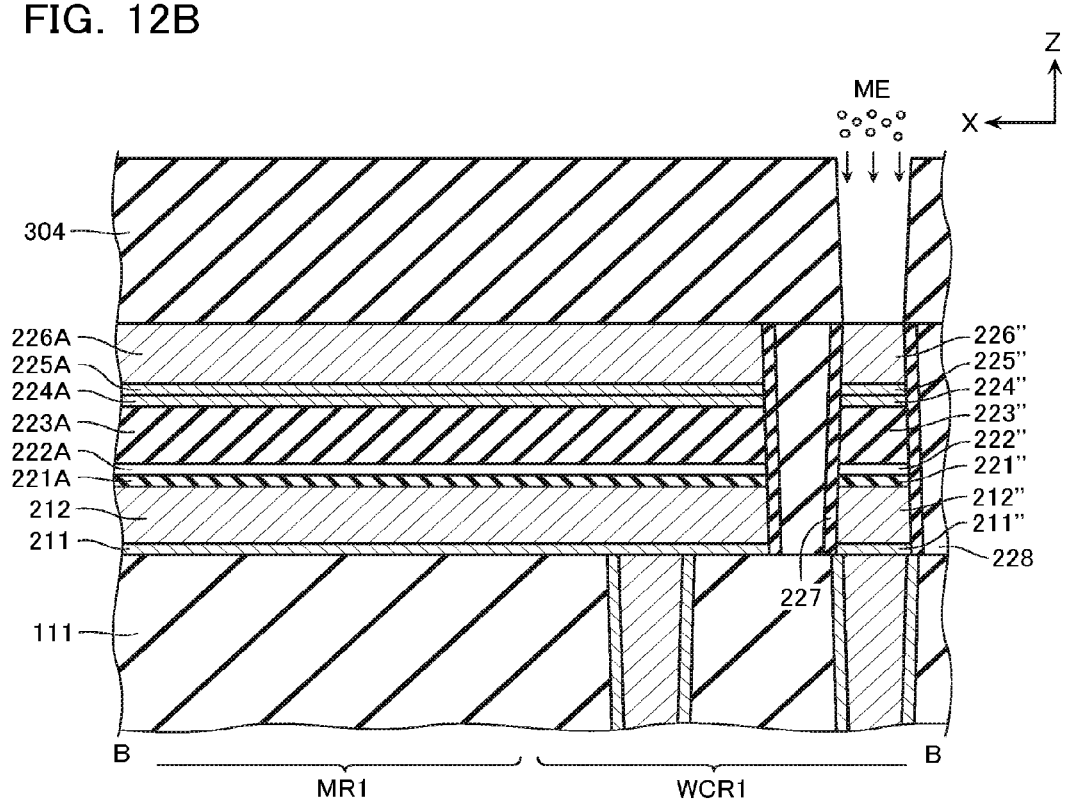

As shown in FIG. 12A and FIG. 12B, a resist 304 is disposed in a pattern corresponding to the bit-line contact CB and the word-line contact CW and then metal particle ions ME are implanted. The metal particle ions ME may be of any type that may damage the insulating layers in the stack structure CBL to reduce their resistance.

Figure 13A:
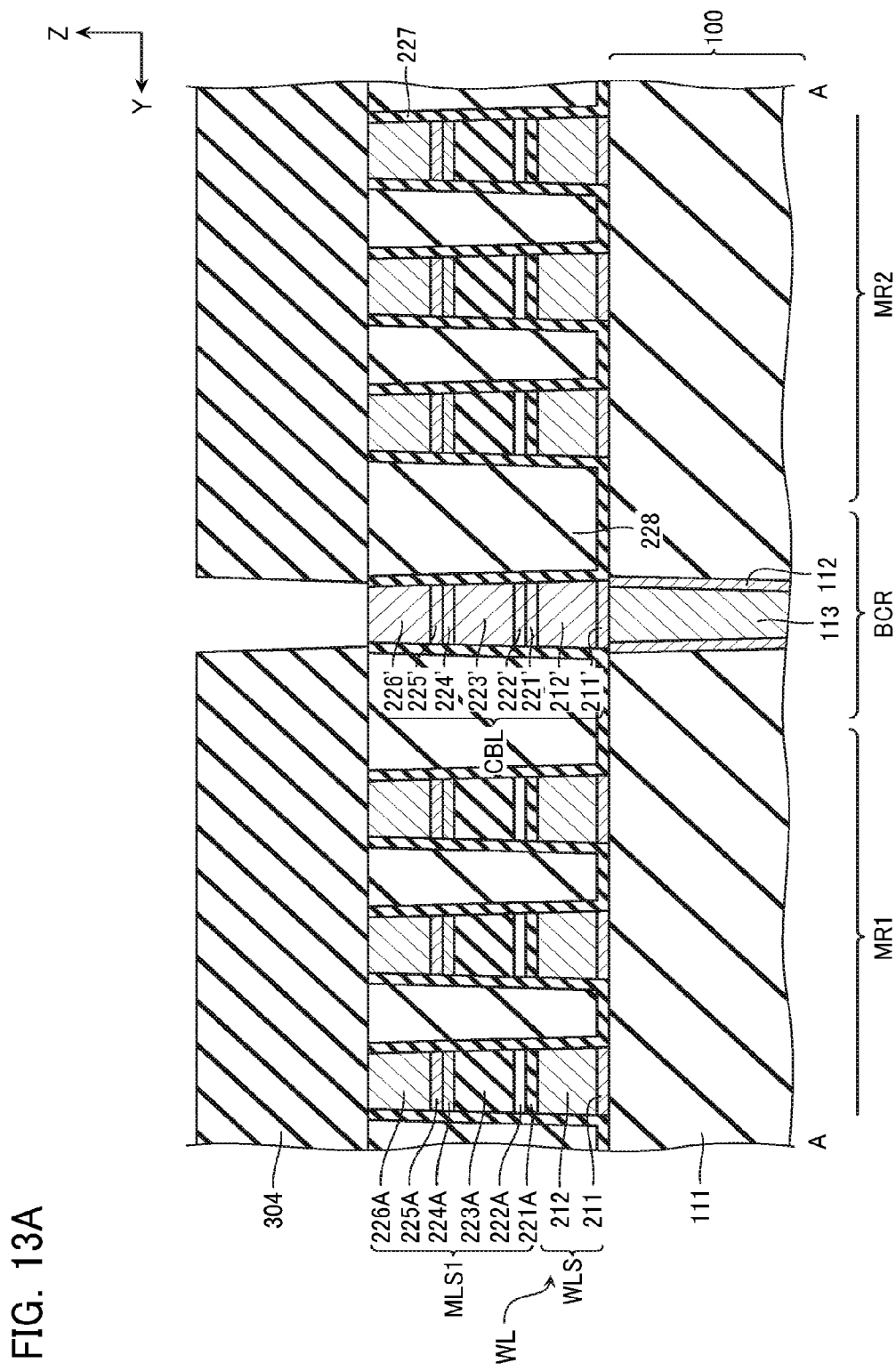
Figure 13B:
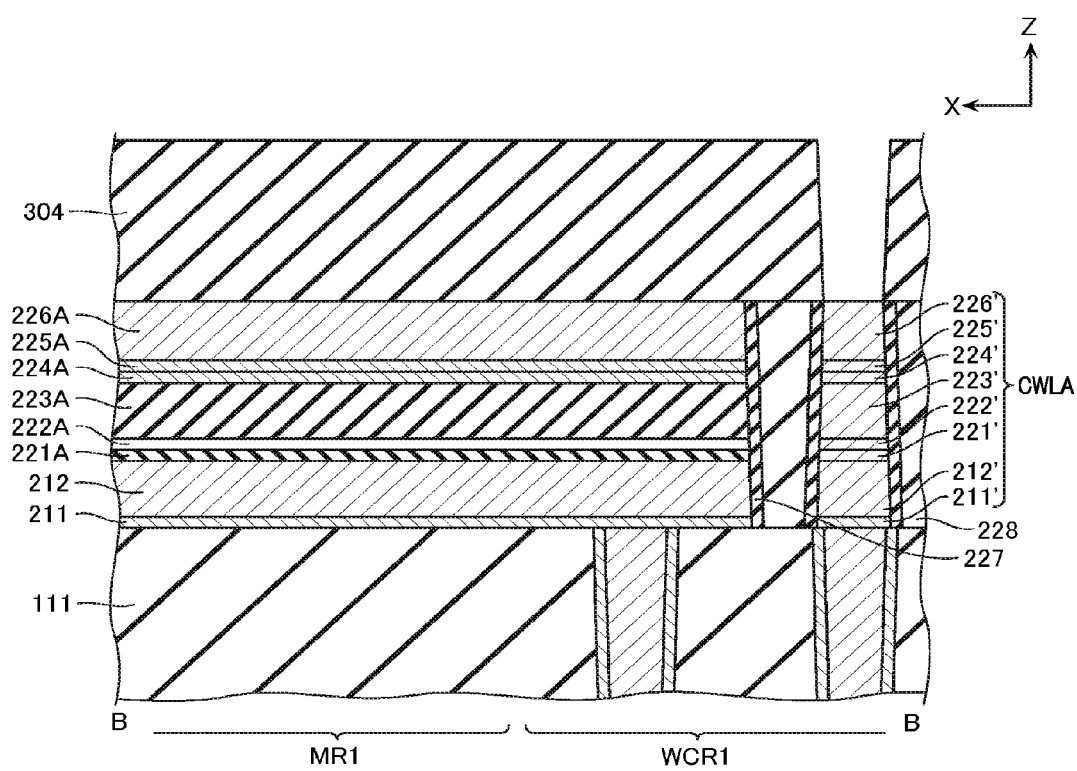

The implantation of the metal particle ions ME may make electrically conductive, as shown in FIG. 13A and FIG. 13B, the insulating layers in the stack structure CBL of the bit-line contact CB and the stack structure CWLA which is the part of the stack structure of the word-line contact CW.

Figure 14B:
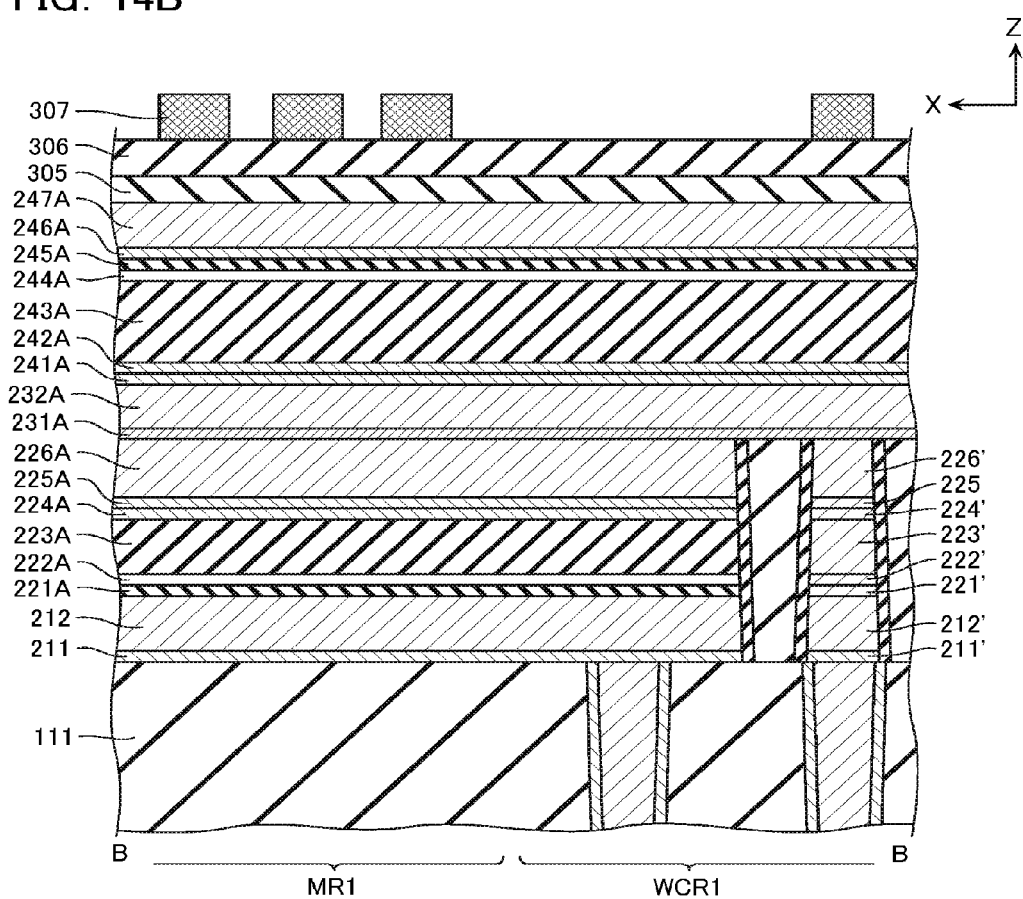

As shown in FIG. 14A and FIG. 14B, the resist 304 is removed and the barrier metal layer 231A and the electrically conductive layer 232A are sequentially deposited. The barrier metal layer 231A includes, for example, an electrically conductive layer such as titanium (Ti). The electrically conductive layer 232A includes, for example, an electrically conductive layer such as tungsten (W).

The upper surface of the electrically conductive layer 232A is deposited with a barrier metal layer 241A, a metal layer 242A, an insulating layer 243A, a high resistance layer 244A, an electrode layer 245A, a barrier metal layer 246A, and an electrically conductive layer 247A, sequentially, which are all of the memory cell MC2. The barrier metal layers 241A and 246A each include, for example, an electrically conductive layer such as titanium (Ti). The metal layer 242A includes, for example, a metal such as silver (Ag) or copper (Cu). The insulating layer 243A includes, for example, an insulating layer such as silicon oxide ($SiO_2$). The high resistance layer 244A includes, for example, polysilicon. The electrode layer 245A includes, for example, a material such as silicon tantalum nitride (TaSiN). The electrically conductive layer 247A includes, for example, an electrically conductive layer such as tungsten (W).

The electrically conductive layer 247A is provided on its upper surface with insulating layers 305 and 306 that provide masks during etching. The structure is provided on its surface with a resist 307 that corresponds to the patterns of the bit-line BL and the word-line contact CW. The insulating layer 305 includes, for example, silicon nitride (SiN). The insulating layer 307 includes, for example, silicon oxide (SiO).

Figure 15A:
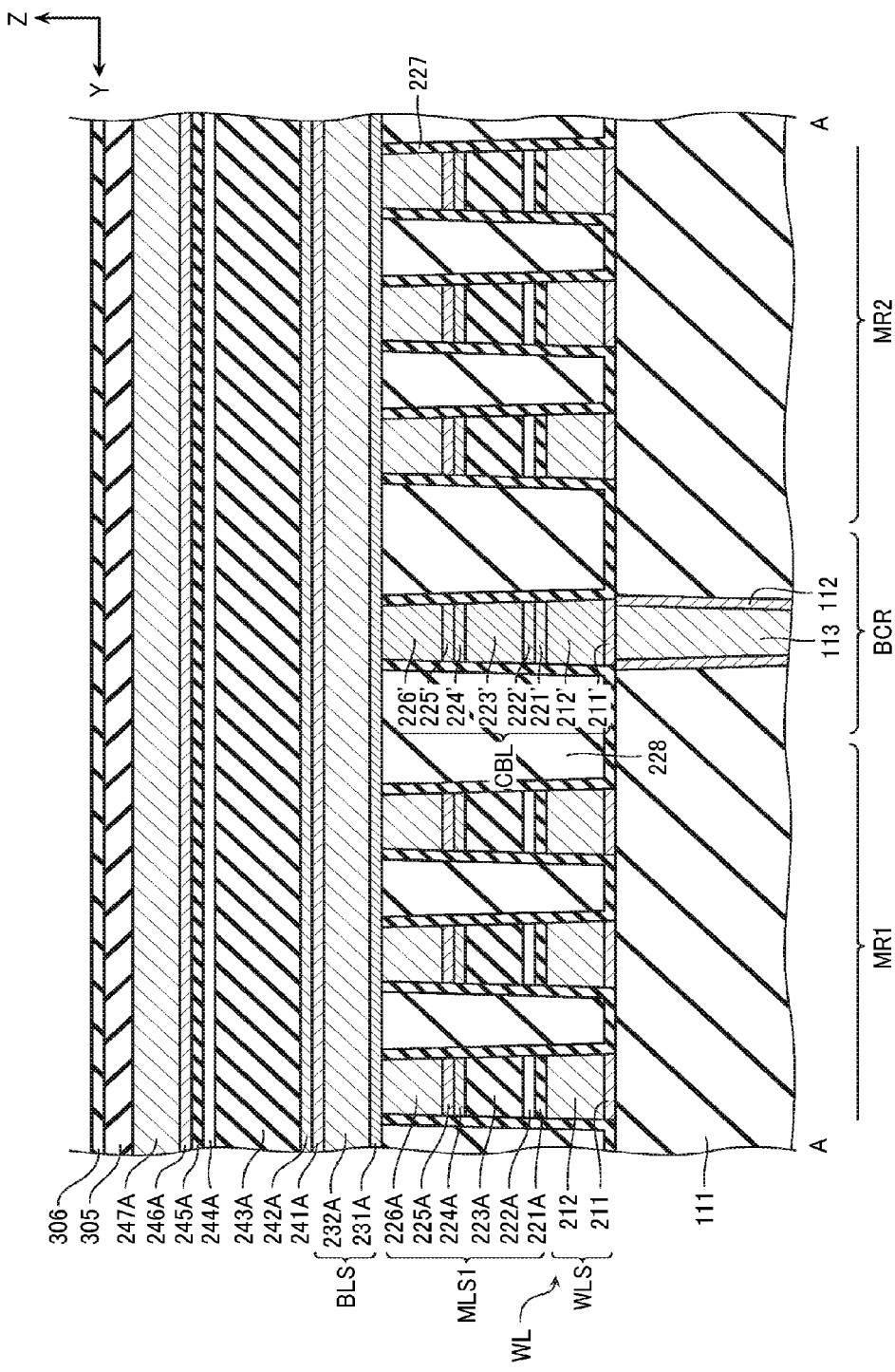
Figure 15B:
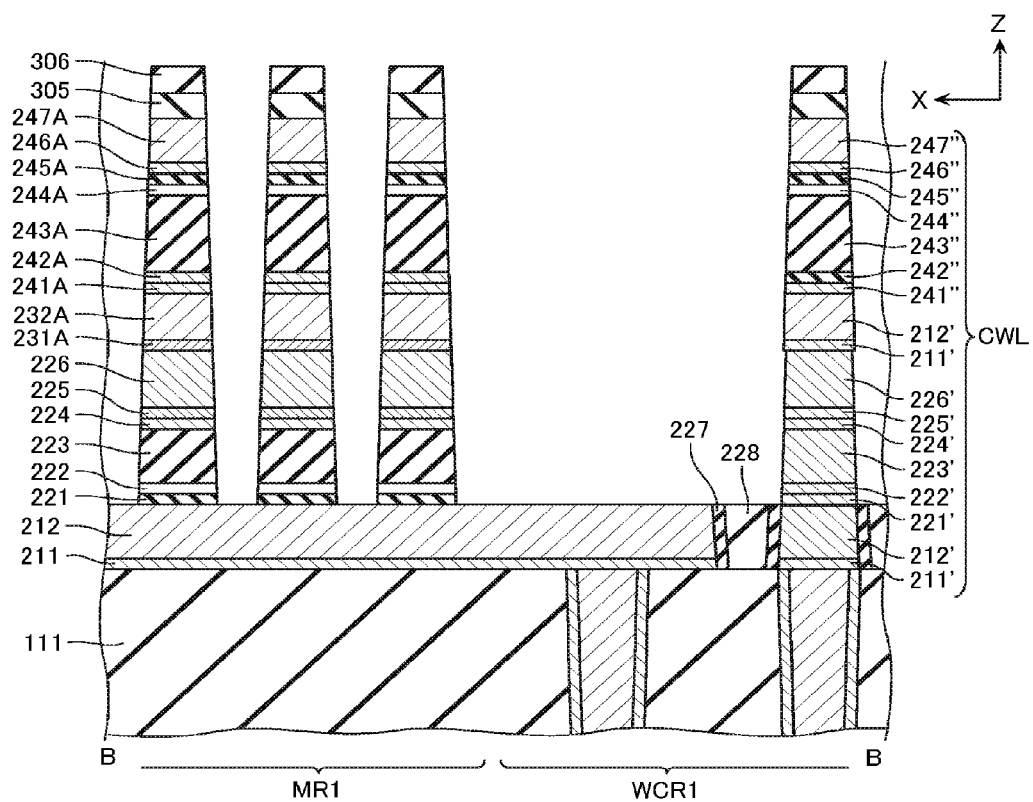

As shown in FIG. 15A and FIG. 15B, the layers (the barrier metal layer 231A and the electrically conductive layer 232A) of the bit-line BL are divided in the X direction by etching. This forms the bit-line BL. This also forms a stack structure CWLB that provides the word-line contact CW. In addition, as described above, the word-line contact CW is formed by separate steps of forming the word-line WL1 and the memory cell MC1 and forming the bit-line BL and the memory cell MC2. Therefore, as shown in FIG. 15B, the word-line contact CW has a stack of two tapered shapes with the widths decreasing upward in the Z-direction.

Here, as the etching proceeds, the etched width may decrease downward. If this occurs during the etching in forming a contact, the contact may have different widths at the upper and lower ends. Then, it may be difficult to ensure a sufficient electrical connection at the end of the smaller width. To prevent the possibility of this phenomenon, in other words, to ensure the sufficient electrical connection at both upper and lower ends of the contact, the contact should have a larger entire width (diameter).

Meanwhile, in this embodiment, the etching is divided into several times to form a contact as described above. This may limit the widths in the X and Y directions of the word-line contact CW compared to forming the word-line contact CW by one etching.

Figure 16A:
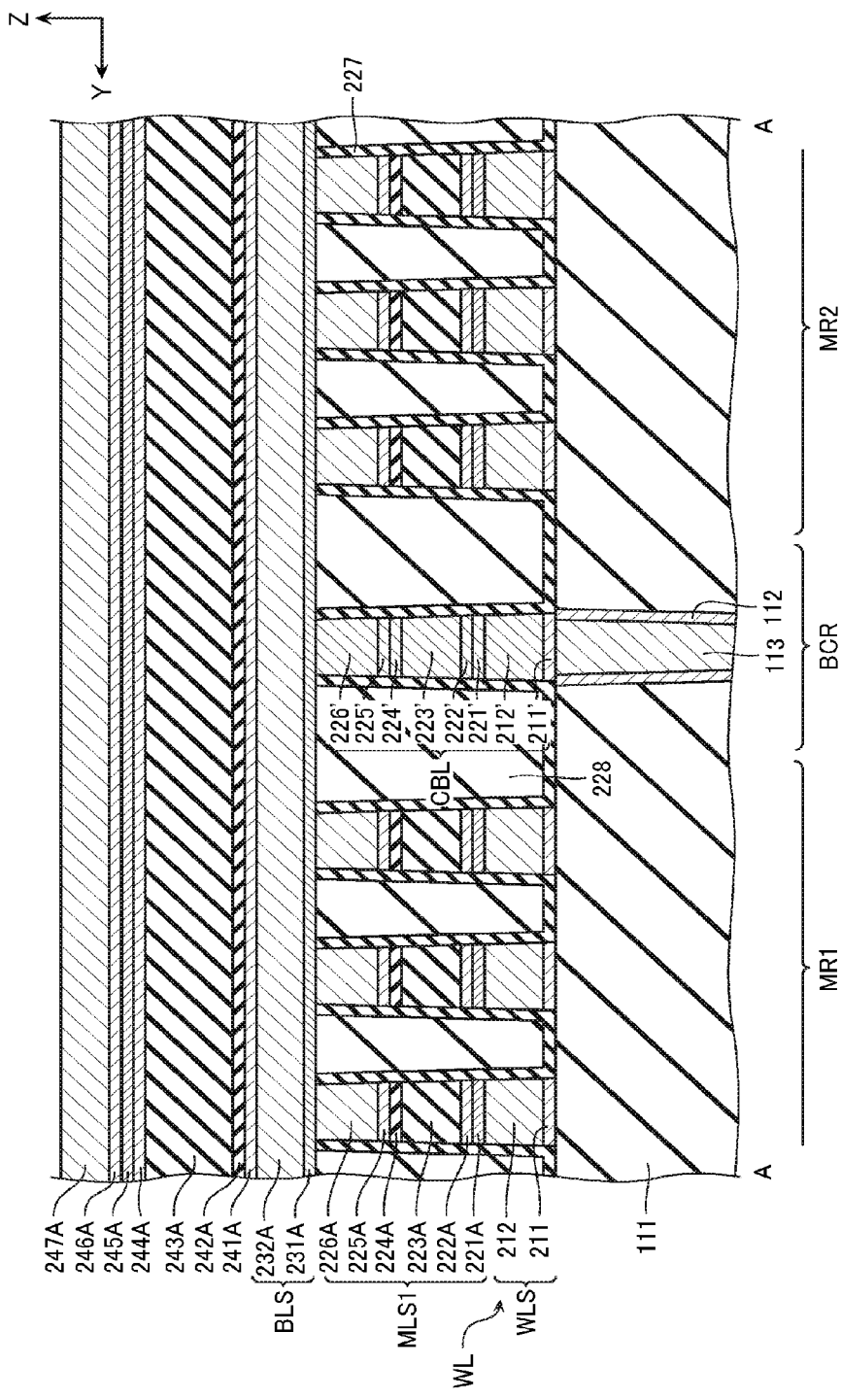
Figure 16B:
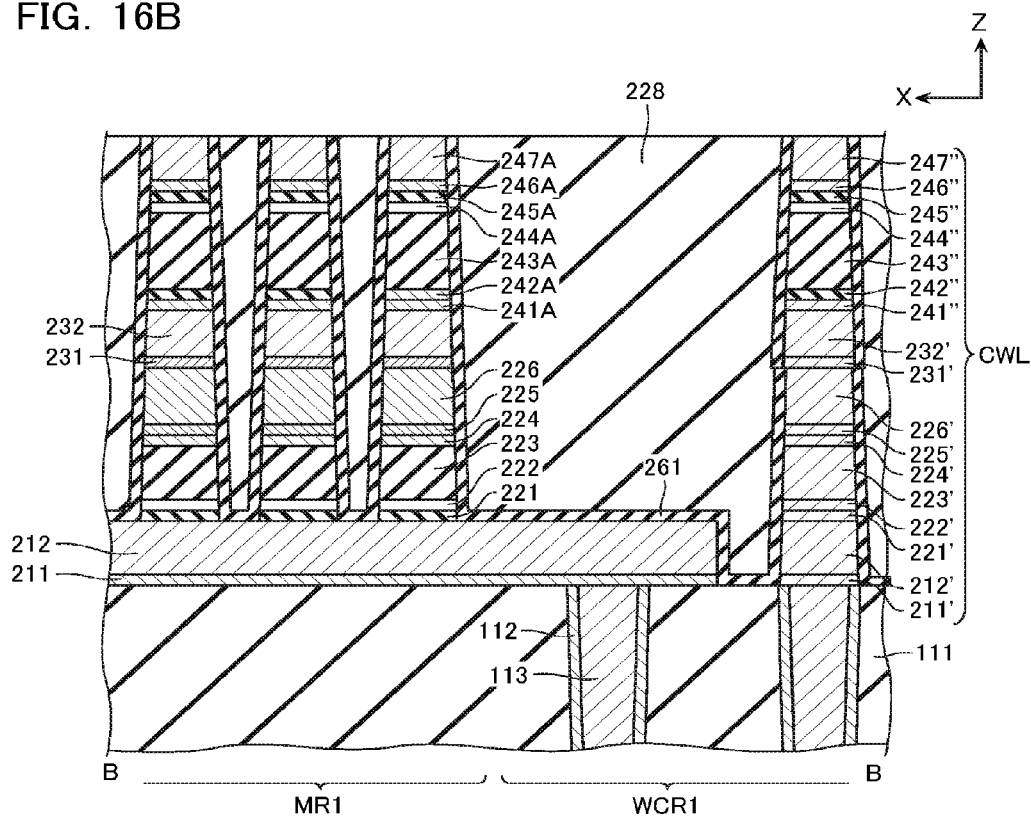

As shown in FIG. 16B, the insulating layers 305 and 306 are removed. Then, the layers of the memory cell MC1, the bit-line BL, and the memory cell MC2, the X direction sidewalls of the stack structure CWLB that provides the word-line contact CW, and the upper surface of the interlayer insulating layer 111 are deposited with a nitrided layer 261. The nitrided layer 261 includes, for example, silicon nitride (SiN). Then, the interlayer insulating layer 262 is filled. The interlayer insulating layer 262 includes, for example, silicon oxide ($SiO_2$). Then, the surface is planarized by CMP or the like.

Figure 17B:
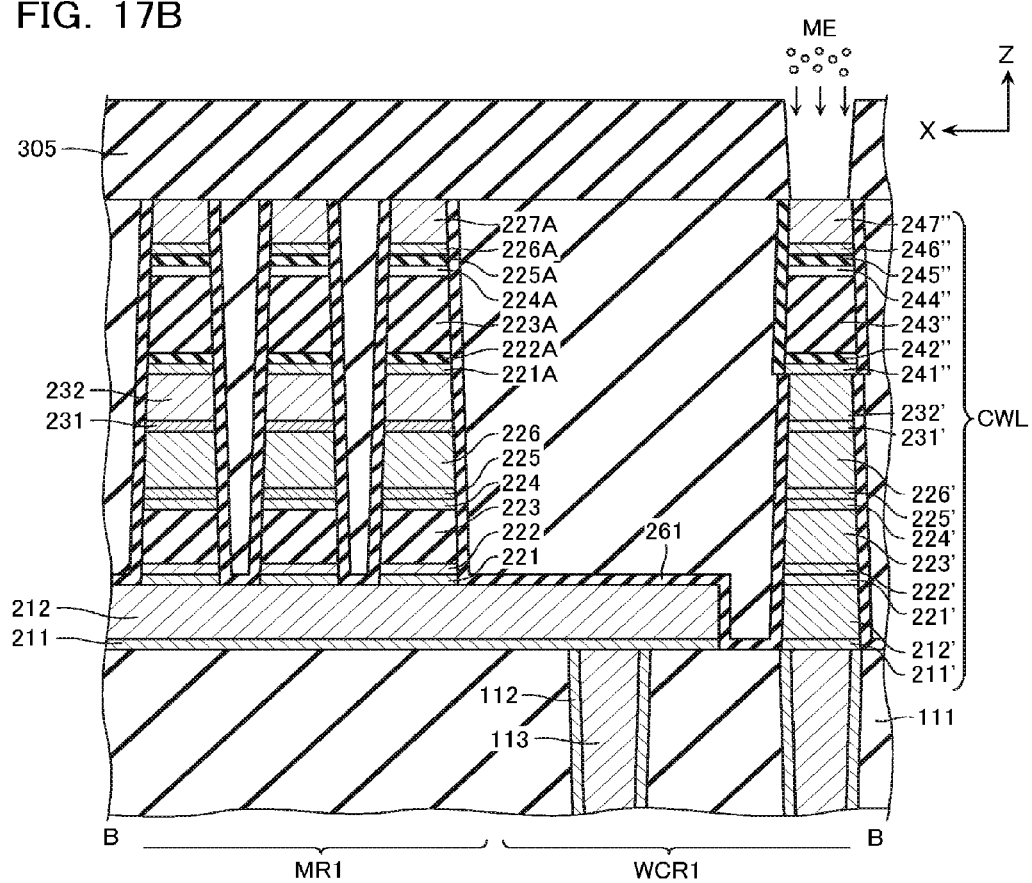

As shown in FIG. 17A and FIG. 17B, a resist 308 is disposed in a pattern that opens a portion of the upper surface of the word-line contact CW and then metal ions ME are implanted.

Figure 18A:
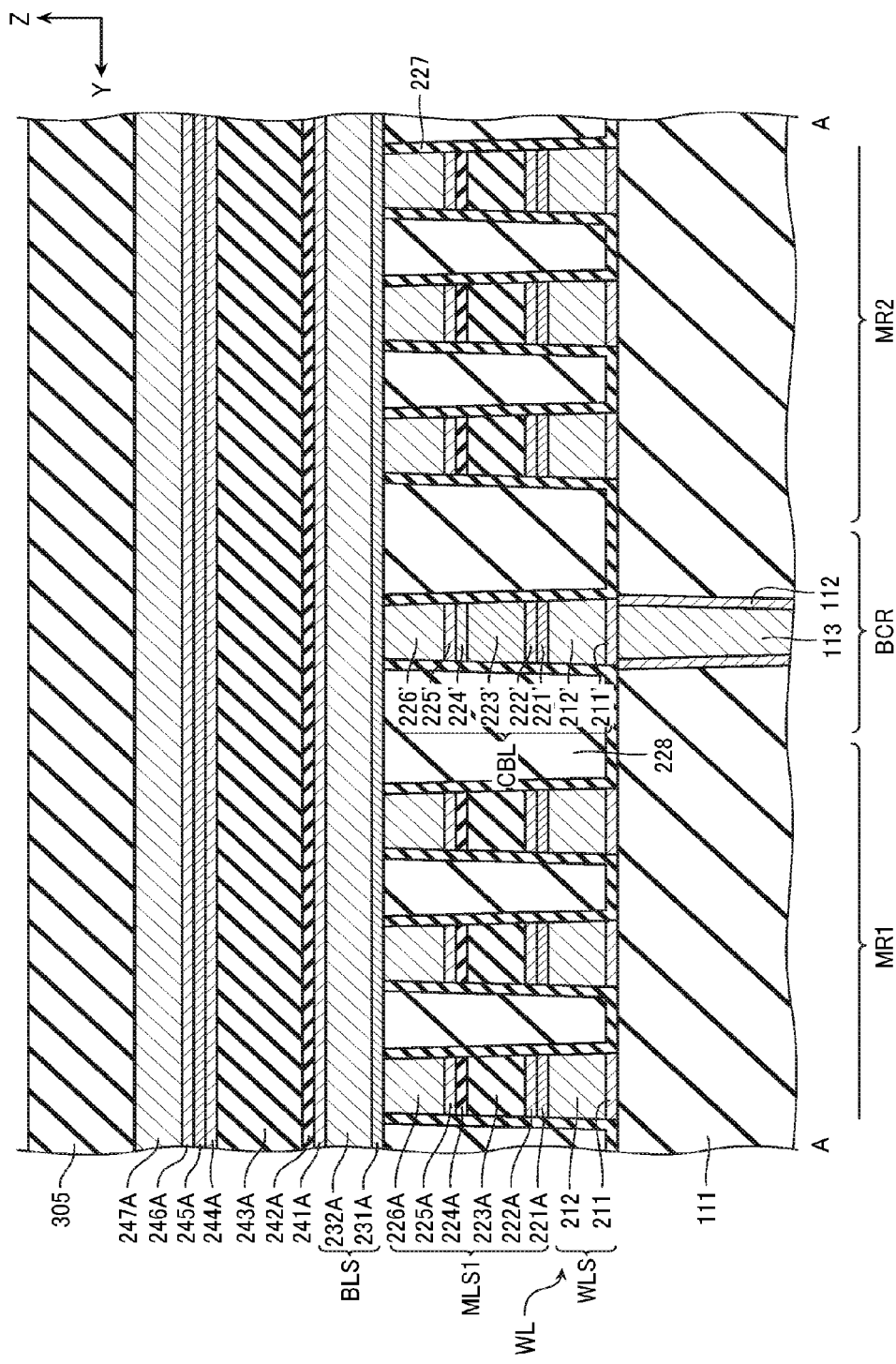
Figure 18B:
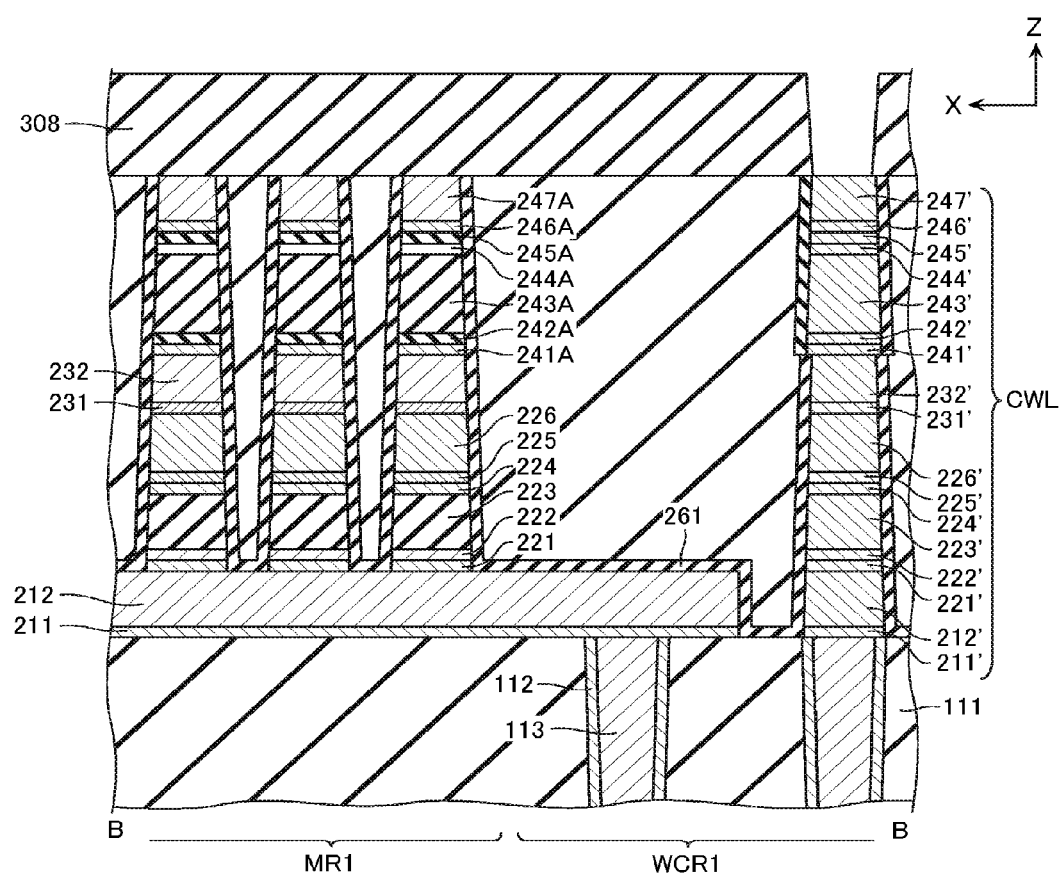

As shown in FIG. 18A and FIG. 18B, implanting the above metal ions ME makes electrically conductive the insulating layer and the high resistance layer in the stack structure CWLB, thus forming the word-line contact CW.

Figure 19A:
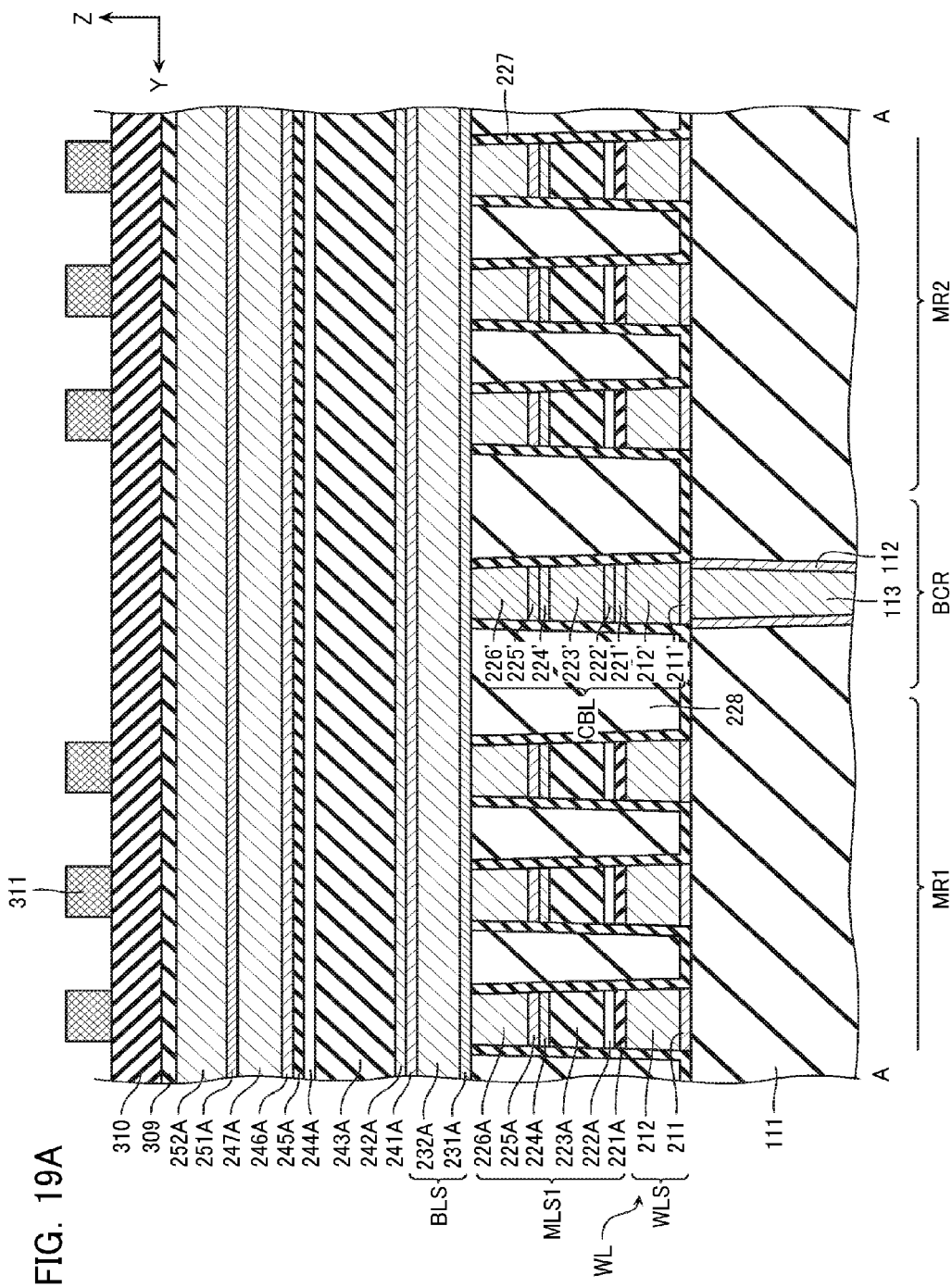
Figure 19B:
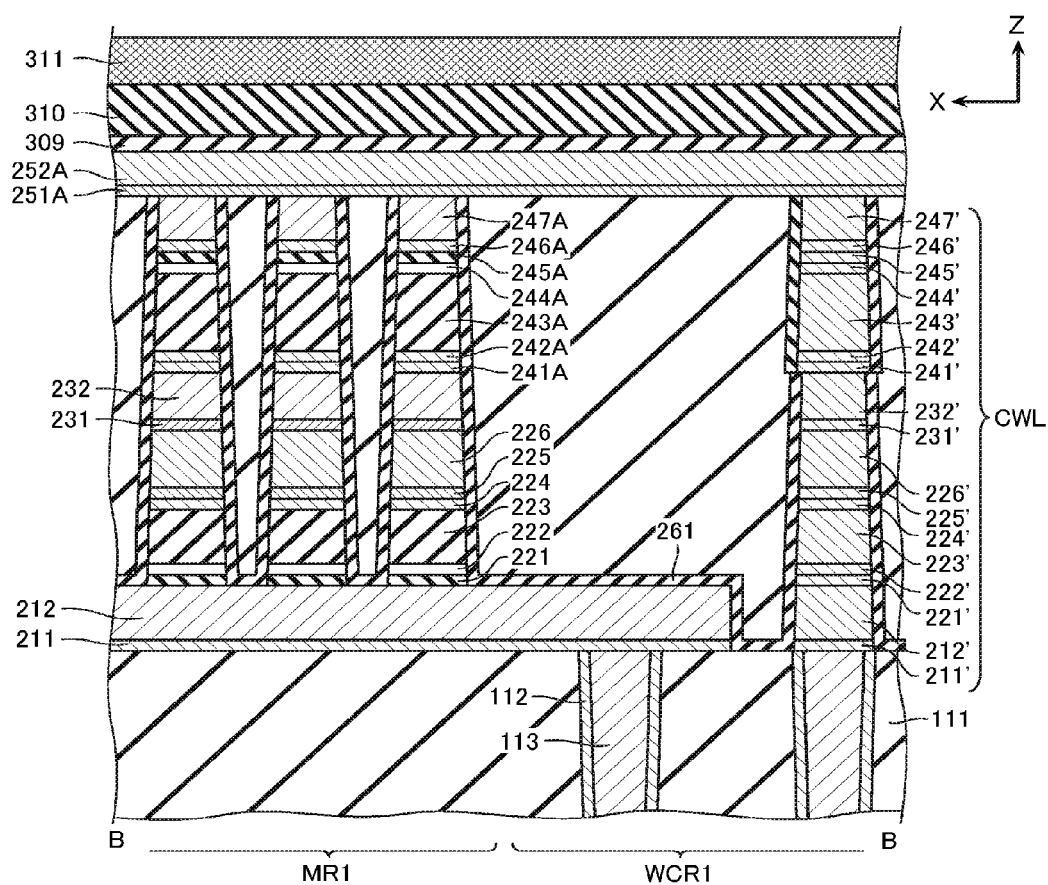

As shown in FIG. 19A and FIG. 19B, a barrier metal layer 251A and an electrically conductive layer 252A of the word-line WL2 are sequentially deposited. The barrier metal layer 251A includes, for example, an electrically conductive layer such as titanium (Ti). The electrically conductive layer 252A includes, for example, an electrically conductive layer such as tungsten (W).

Then, an insulating layer 309 and an insulating layer 310 that provide masks during etching are deposited. The structure is provided on its upper surface with a resist 311 that corresponds to the pattern of the word-line WL2. The insulating layer 309 includes, for example, silicon nitride (SiN). The insulating layer 310 includes, for example, silicon oxide (SiO).

Figure 20A:
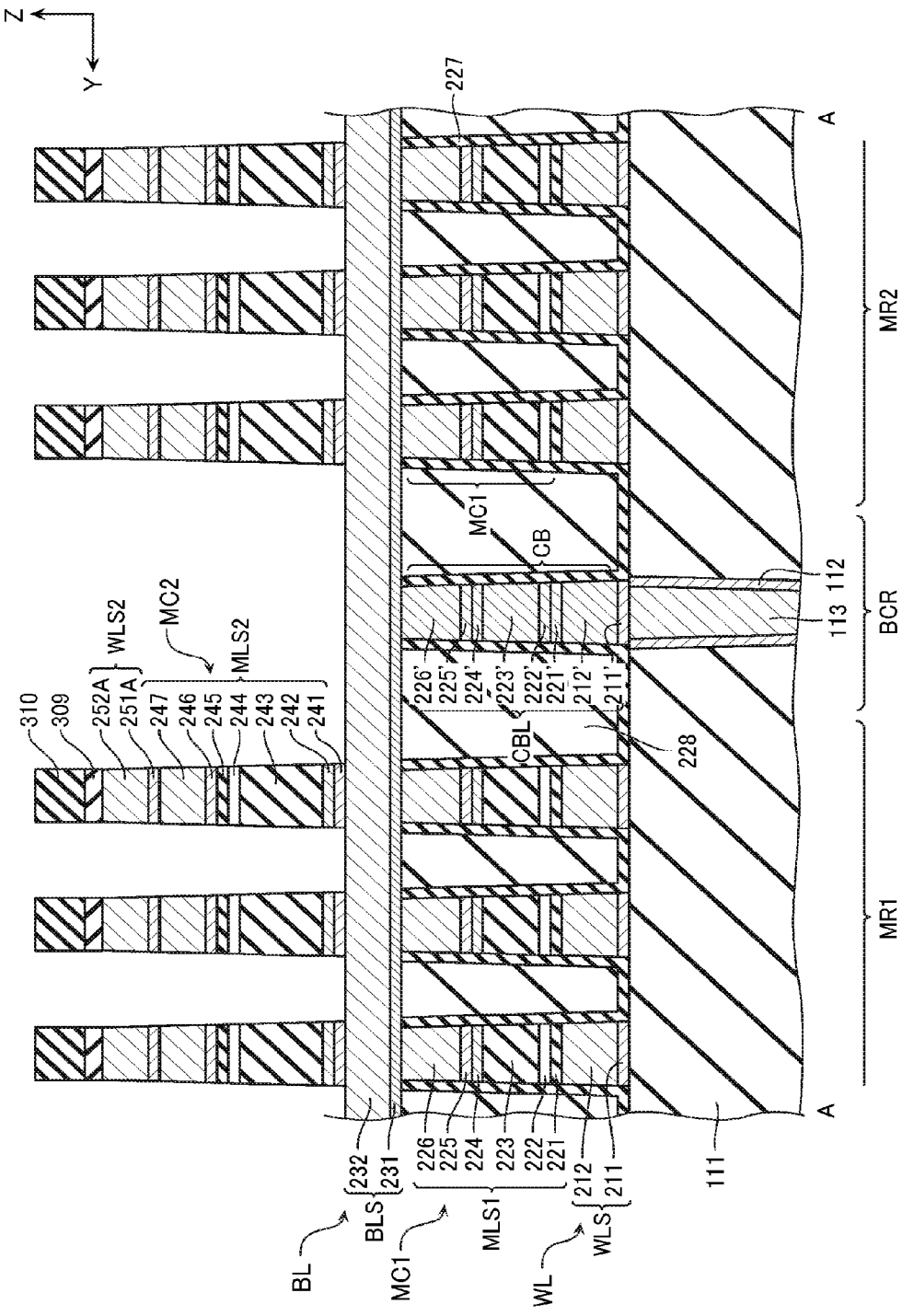
Figure 20B:
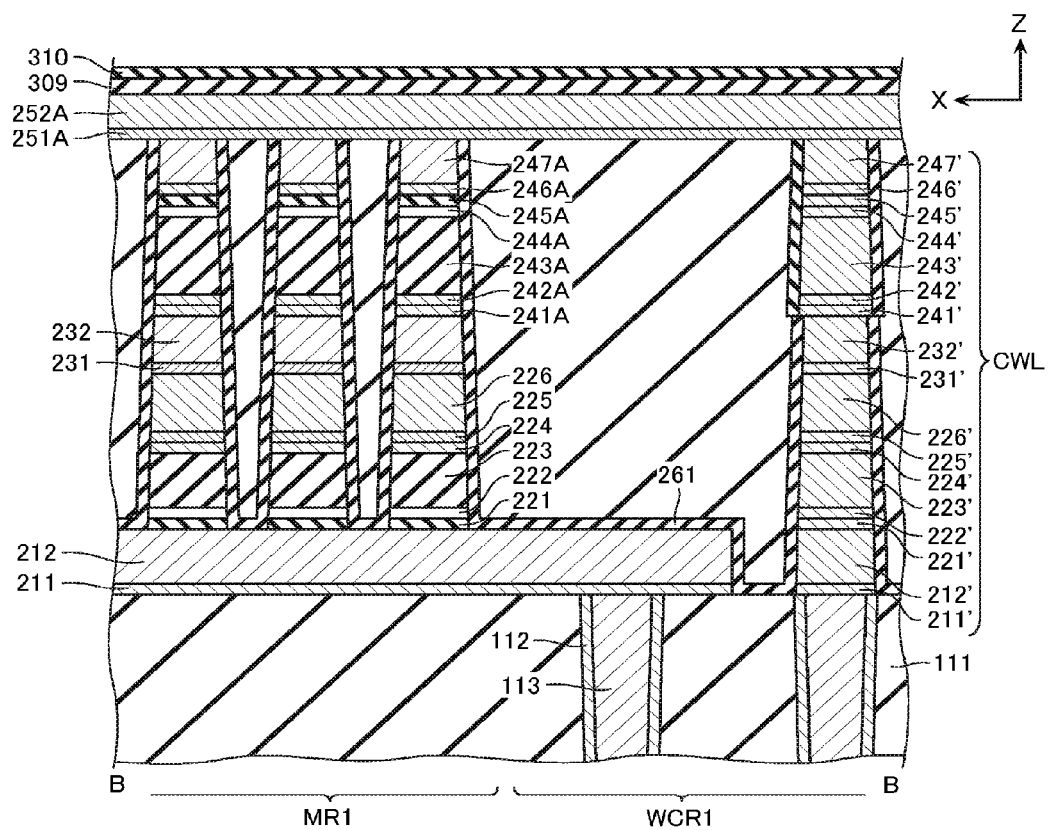

As shown in FIG. 20A and FIG. 20B, etching divides the layers of the memory cell MC2 (the barrier metal layer 241A, the metal layer 242A, the insulating layer 243A, the high resistance layer 244A, the electrode layer 245A, the barrier metal layer 246A, and the electrically conductive layer 247A) and the layers of the word-line WL2 (the barrier metal layer 251A and the electrically conductive layer 252A) in the X direction. This forms the memory cell MC2 and the word-line WL2.

Figure 21A:
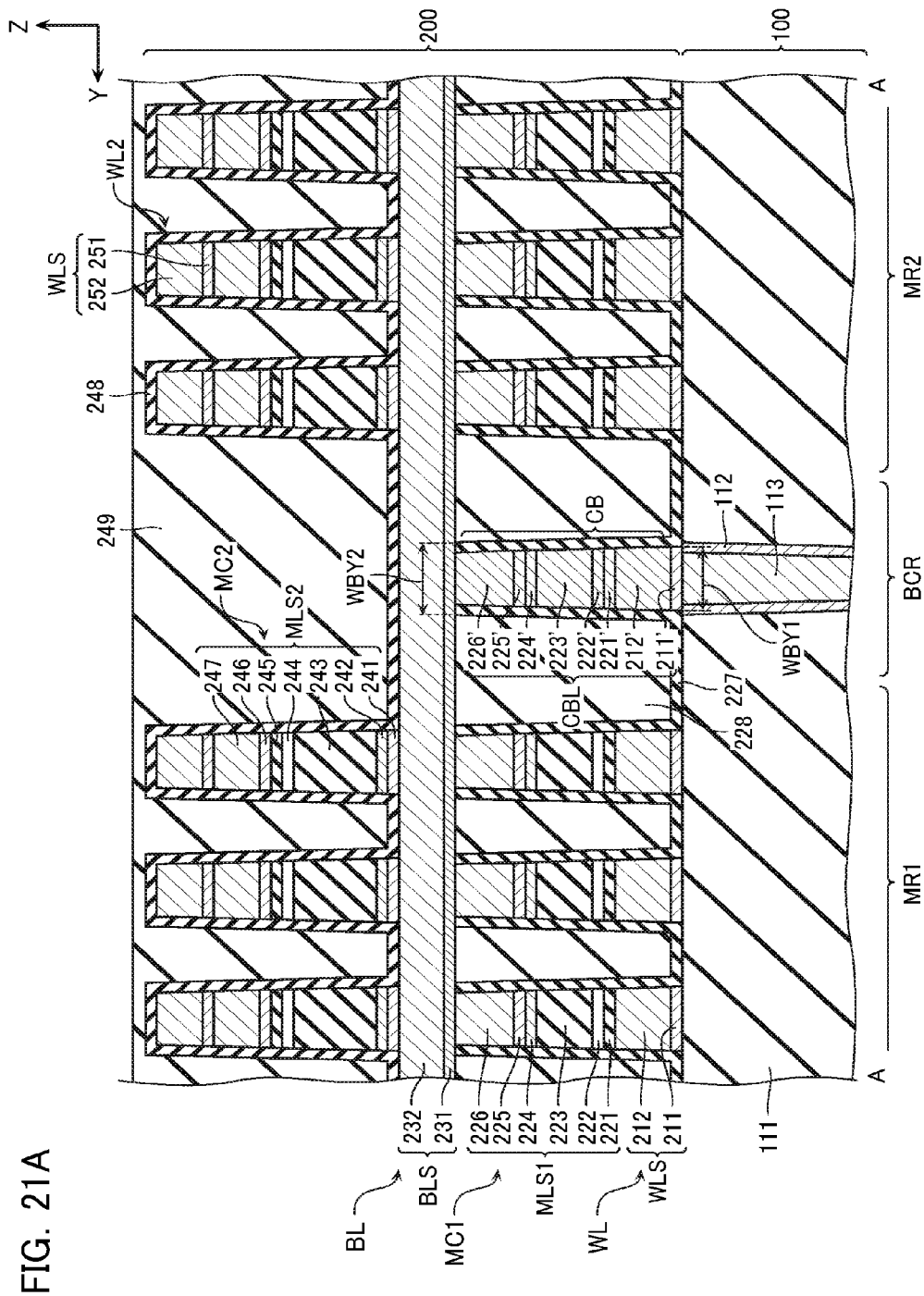
Figure 21B:
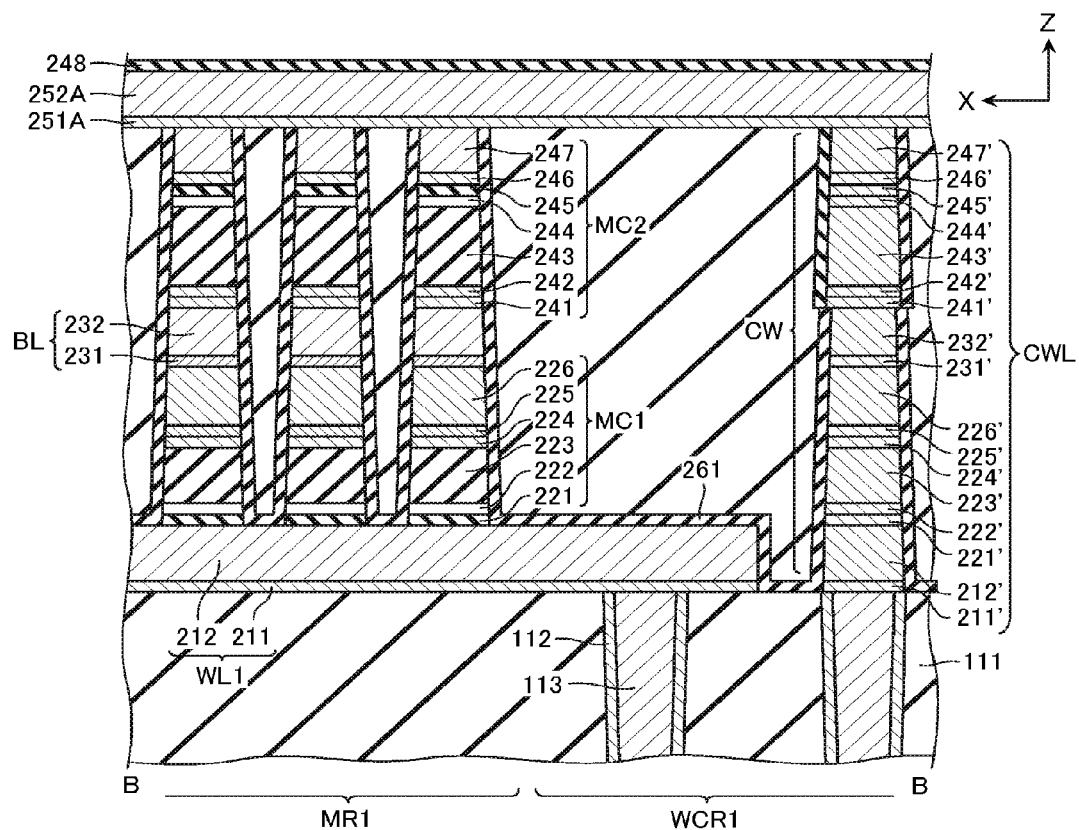

As shown in FIG. 21A and FIG. 21B, the side walls of the memory cell MC2 and the electrically conductive layer 232 are provided with an nitride film 248. The nitride film 248 includes, for example, silicon nitride (SiN). The nitride film 248 is covered by deposition of an interlayer insulating layer 249. The interlayer insulating layer 249 includes, for example, silicon oxide (SiO).

Finally, the interlayer insulating layer 249 is planarized by CMP or the like to provide the configuration shown in FIG. 7 and FIG. 8.

As described above, the bit-line contact CB and the word-line contact CW are formed at the same time as the process of forming the bit-line BL, the memory cells (MC1 and MC2), and the word-line WL1.

Specifically, the bit-line contact CB is formed at the same time as the process of forming the word-line WL1 and the memory cell MC1. A portion of the word-line contact CW is formed at the same time as the process of forming the word-line WL1 and the memory cell MC1. The remainder is formed at the same time as the process of forming the bit-line BL and the memory cell MC2.

Therefore, the bit-line contact CB has the structure CBL including a stack of the stack structure WLS1 of the word-line WL1 and the stack structure MLS1 of the memory cell MC1. In addition, the word-line contact CW has the stack structure CWL having the stack structure WLS1 of the word-line WL1, the stack structure MLS1 of the memory cell MC1, the stack structure BLS of the bit-line BL, and the stack structure MLS2 of the memory cell MC2.

Then, the stack structures CBL and CWL are each implanted with metal ions and thus provided with electrical conductivity and capable of functioning as the contacts.

In addition, the bit-line contact CB is etched using the same pattern as those of the word-line WL1 and the memory cell MC1, and the word-line contact CW is etched using the same pattern as those of the memory cell MC1, the bit-line BL, and the memory cell MC2.

Therefore, the bit-line contact CB has generally the same Y direction width as the Y direction widths of the word-line WL1 and the memory cell MC1. In addition, the word-line contact CW has generally the same X direction width as the X direction width of the memory cell MC1, the bit-line BL, and the memory cell MC2.

In addition, the word-line contact CW is formed by separate processes of forming the memory cell MC1 and the bit-line BL and forming the memory cell MC2. Therefore, as shown in FIG. 8, the stack structure CWL of the word-line contact CW has a stack of two normally tapered structures with their X direction widths decreasing upward from the lower wiring layer side in the Z-direction.

Second Embodiment

[Configuration]

The configuration of a non-volatile semiconductor memory device according to a second embodiment will be described with reference to FIG. 22A and FIG. 22B.

Figure 22A:
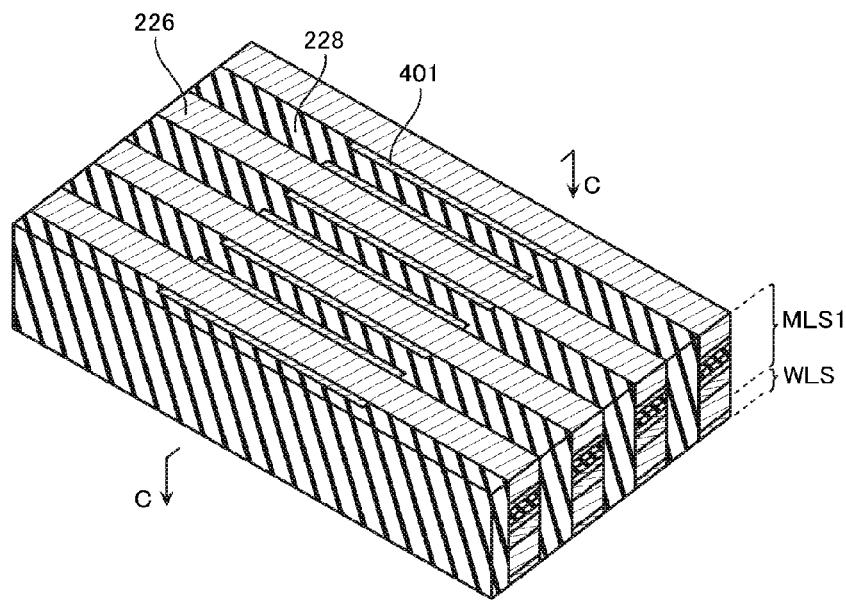
FIG. 22A is a perspective view partially illustrating the configuration of a non-volatile semiconductor memory device according to a second embodiment.

FIG. 22A is a schematic perspective view showing a portion of the configuration of a non-volatile semiconductor memory device according to the second embodiment that includes the bit-line contact CB or the word-line contact CW. FIG. 22B is a cross-sectional view along the C-C line in FIG. 22A. Here, as an example, a description is given of the configuration of the bit-line contact CB connected to the bit-line BL in a first layer. The word-line contact CW has a similar configuration.

Figure 22B:
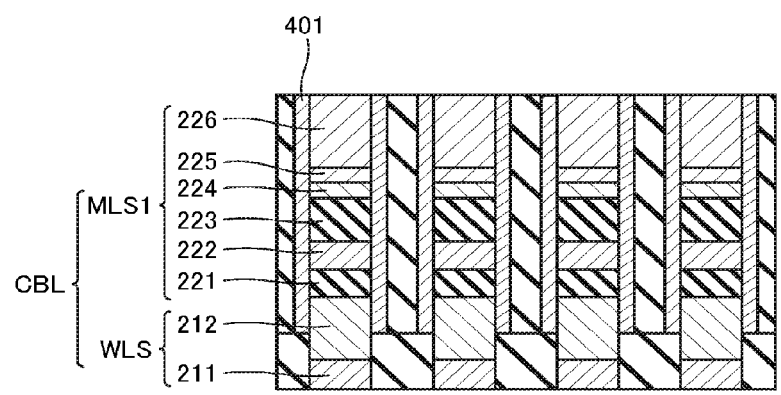
FIG. 22B is a cross-sectional view partially illustrating the configuration of the non-volatile semiconductor memory device.

In addition, other configurations than the bit-line contact CB and the word-line contact CW shown in FIG. 22A and FIG. 22B are similar to those in the first embodiment. Like elements as those in the first embodiment are designated with like reference numerals and their description is omitted hereafter. Note that FIG. 22A and FIG. 22B show four rows of bit-line contacts CB in the Y direction and this configuration is provided in a plurality in the Y direction.

As shown in FIG. 22A and FIG. 22B, in the non-volatile semiconductor memory device according to the second embodiment, the layers of the stack structure CBL of the bit-line contact CB have the same film thicknesses as the respective layers of the stack structure MLS1 of the memory cell MC1, like the first embodiment.

Then, in the second embodiment, the stack structure CBL of the bit-line contact CB does not include the stack structure MLS of the memory cell MC whose high resistance layer 222 and insulating layer 223 are replaced with electrically conductive layers. Instead, the stack structure CBL includes the stack structure MLS of the memory cell MC whose high resistance layer 222 is replaced with the layer 222' having generally the same film thickness and Z-direction position as the layer 222 and whose insulating layer 223 is replaced with the insulating layer 223' having generally the same film thickness and Z-direction position as the layer 223. Also, the stack structure CBL of the bit-line contact CB is provided on its side walls with an electrically conductive layer 401.

The electrically conductive layer 401 is provided over at least the insulating layer and the high resistance layer of the stack structure CBL to become contact with the electrically conductive layers and/or the metal layers provided above and below the insulating layer.

Such a configuration may form, without having the stack structure CBL whose insulating layer and high resistance layer are replaced with electrically conductive layers, the bit-line contact CB that electrically connects the bit-line BL with the lower wiring layer.

The electrically conductive layer 401 provided on the side walls of the bit-line contact CB may include a material such as a metal as well as polysilicon having impurity added therein.

[Manufacturing Method]

A method of manufacturing the non-volatile semiconductor memory device according to the second embodiment will be described with reference to FIGS. 23A, 23B to FIGS. 32A, 32B.

Figure 23A:
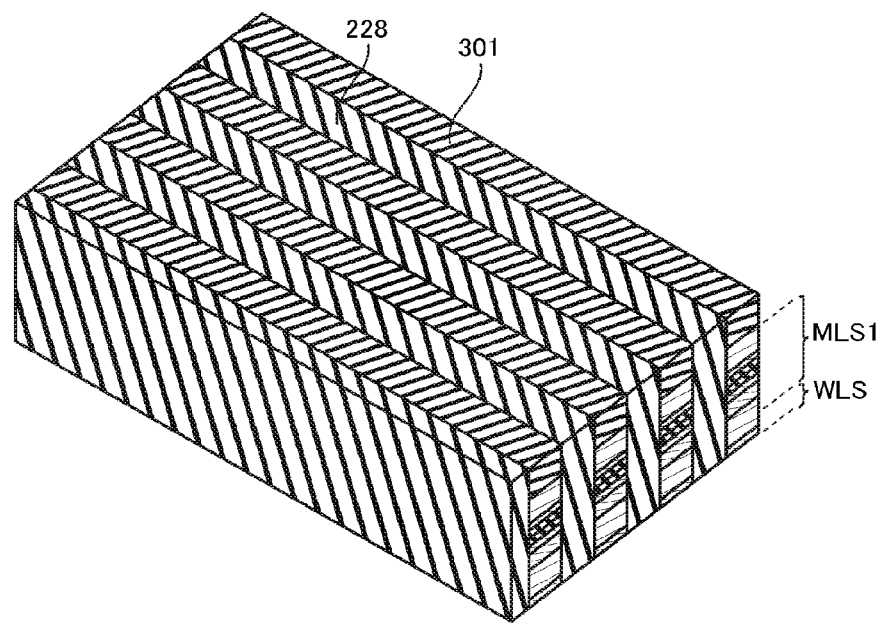
FIGS. 23A, 24, 25A, 26, 27A, 28A, 29, 30, 31, and 32A are perspective views illustrating a method of manufacturing the non-volatile semiconductor memory device.
Figure 23B:
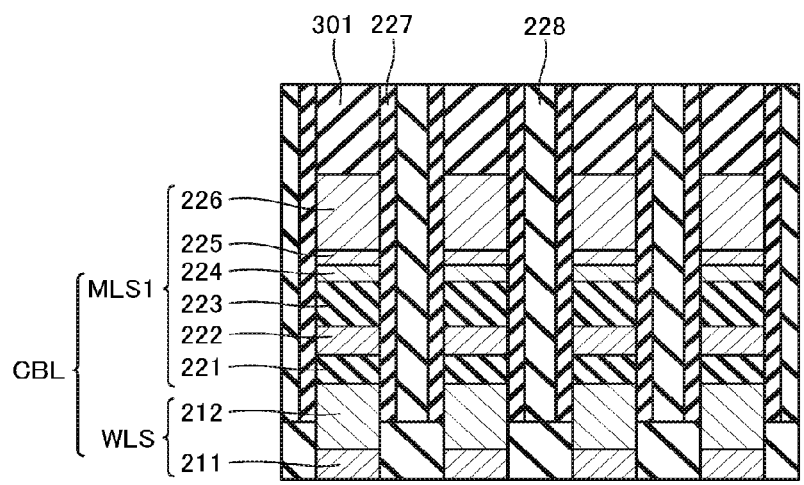
FIGS. 23B, 25B, 27B, 28B, and 32B are cross-sectional views illustrating the manufacturing method.

As shown in FIG. 23A and FIG. 23B, after patterning the word-line WL1 and the memory cell MC1, the interlayer insulating layer 228 is filled in the air gap and then the surface is planarized. In addition, during the planarization, the planarization condition is adjusted so that the insulating layer 301 remains. The insulating layer may include, for example, silicon nitride (SiN). The interlayer insulating layer includes, for example, silicon oxide (SiO). This step corresponds to the step described in the first embodiment with reference to FIG. 11A.

Figure 24:
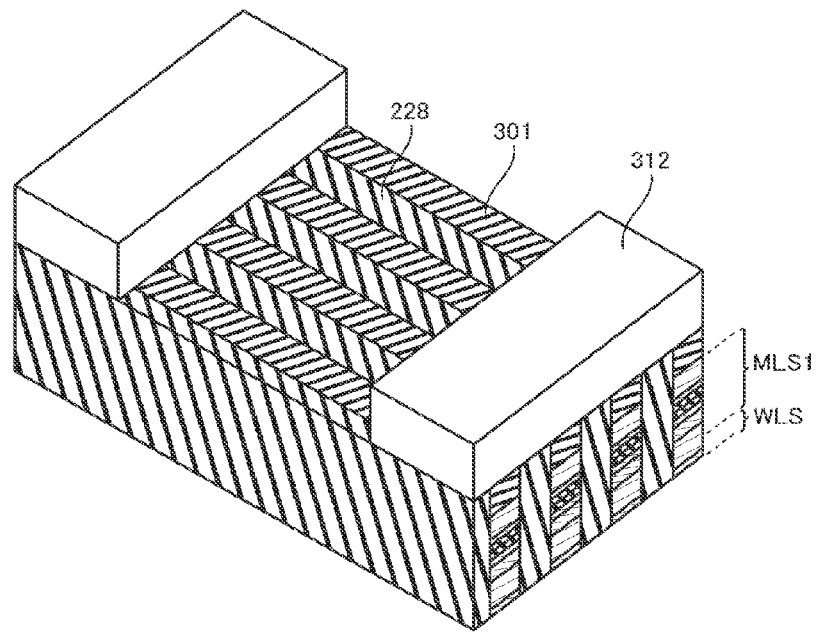

As shown in FIG. 24, a resist 312 is deposited using a pattern that opens a region where the bit-line contact CB is to be formed.

Figure 25A:
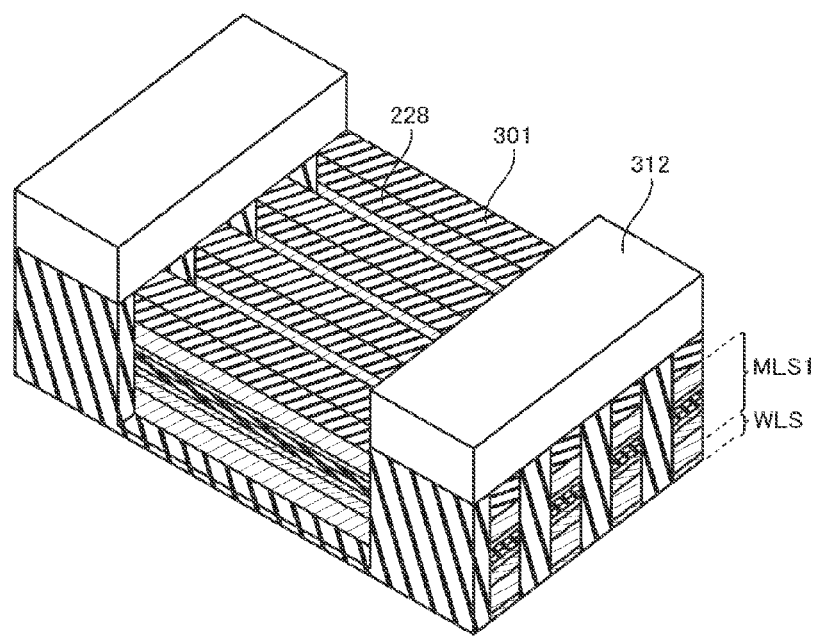
Figure 25B:
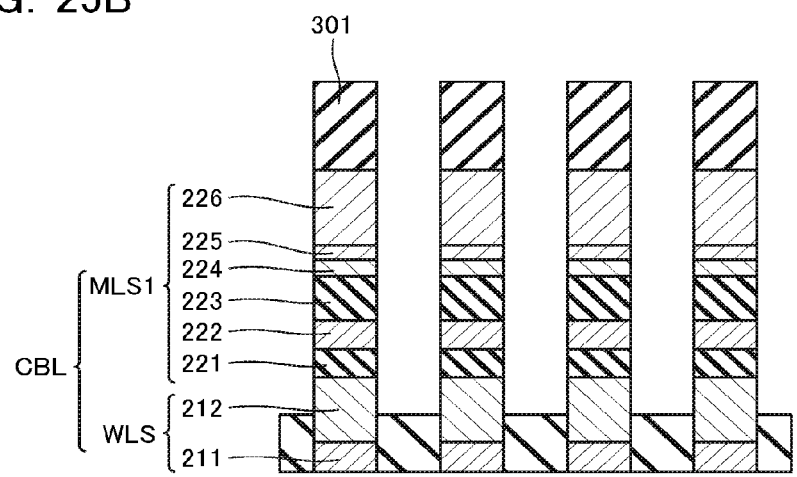

As shown in FIG. 25A and FIG. 25B, the interlayer insulating layer 228 in the opened portion is etched away by RIE or the like until the electrically conductive layer 212 of the word-line WL1 is exposed.

Figure 26:
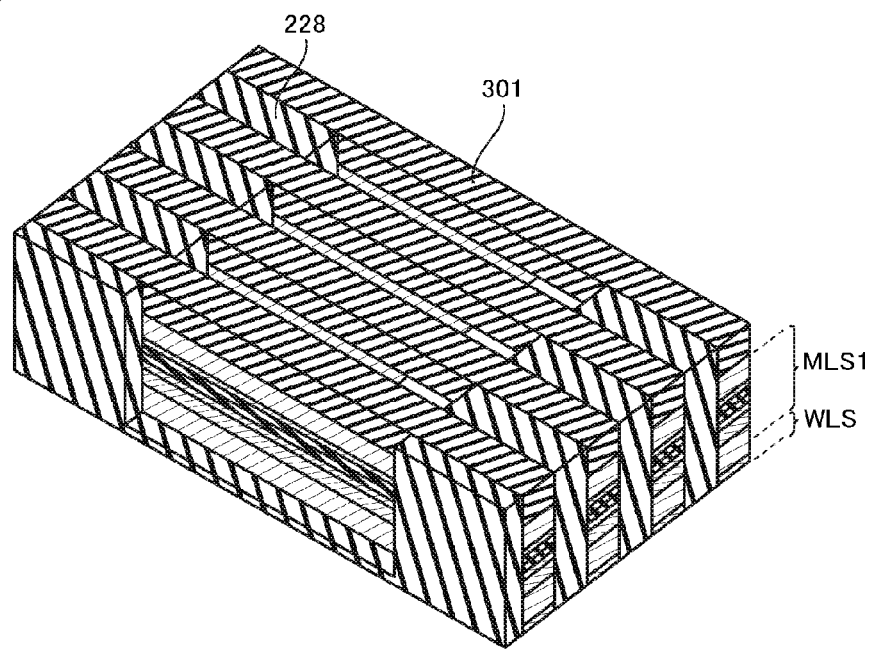

As shown in FIG. 26, the resist 312 is removed.

Figure 27A:
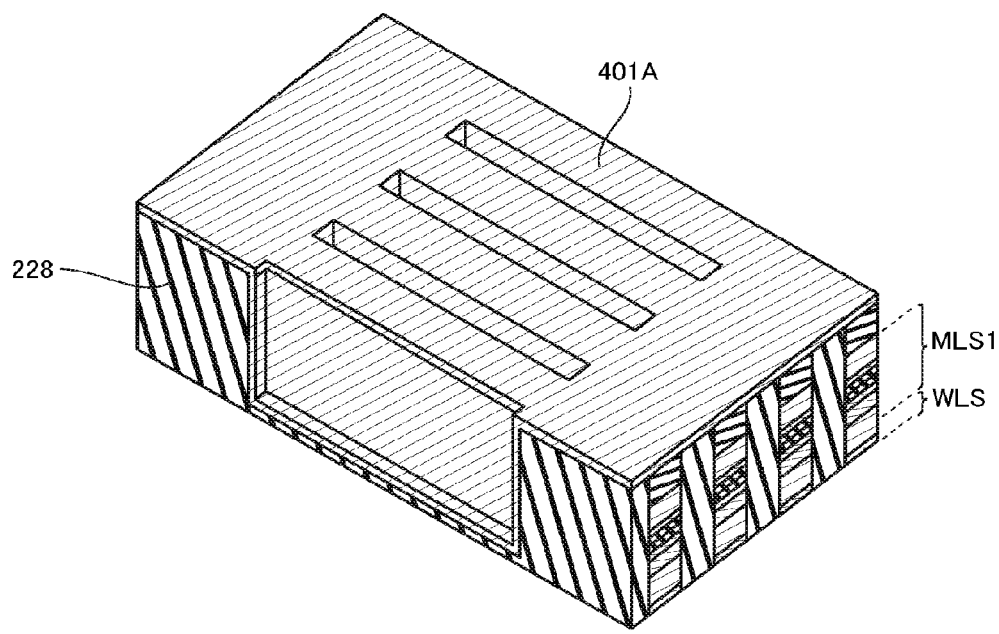
Figure 27B:
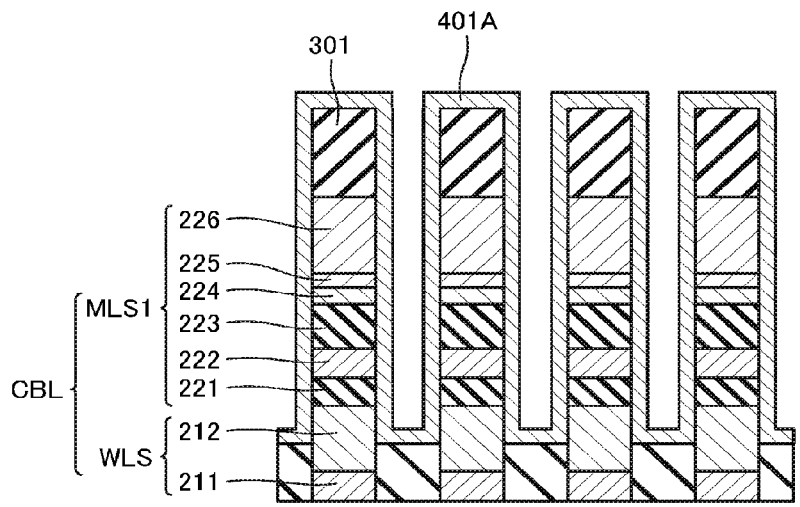

As shown in FIG. 27A and FIG. 27B, a region including the bit-line contact region BCR is deposited with a metal film 401A. The metal film may include any material.

Figure 28A:
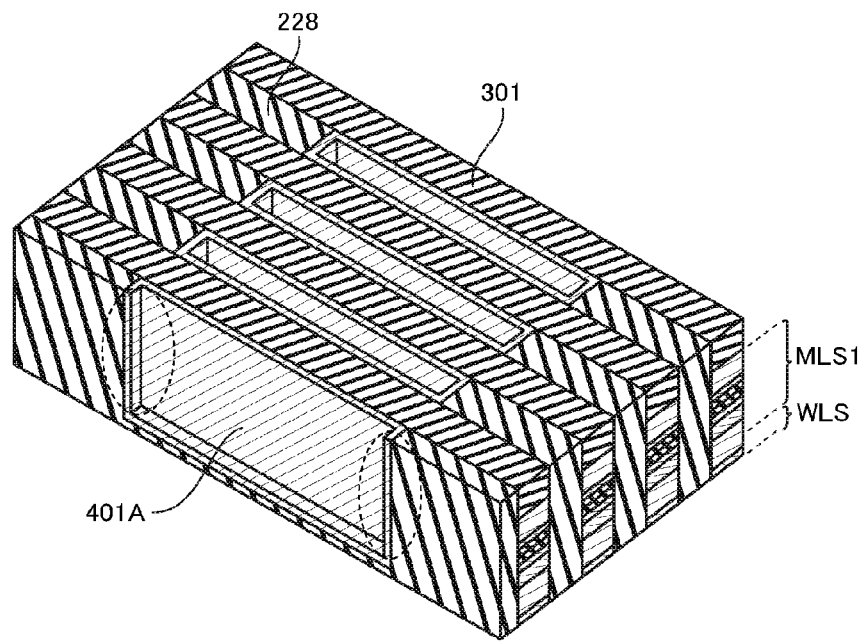
Figure 28B:
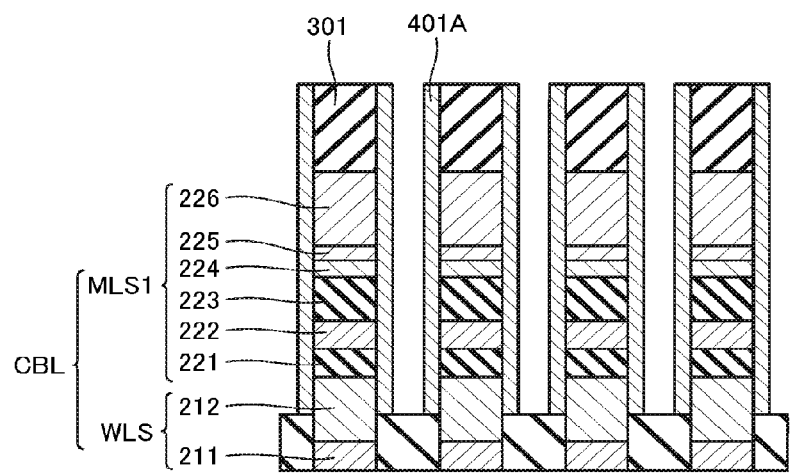

As shown in FIG. 28A and FIG. 28B, etching such as RIE removes the metal film 401A deposited on the Z-direction surface of the contact CB.

Here, as described above, the configuration having four rows of bit-line contacts CB in the Y direction is provided in a plurality in the Y direction. Therefore, the metal film deposited on other portions than the side walls of the stack structure CBL of the bit-line contact CB (the portion surrounded by a dotted line in FIG. 28A) may electrically connect the adjacent bit-line contacts CB and the wiring lines, thus providing a short circuit.

Figure 29:
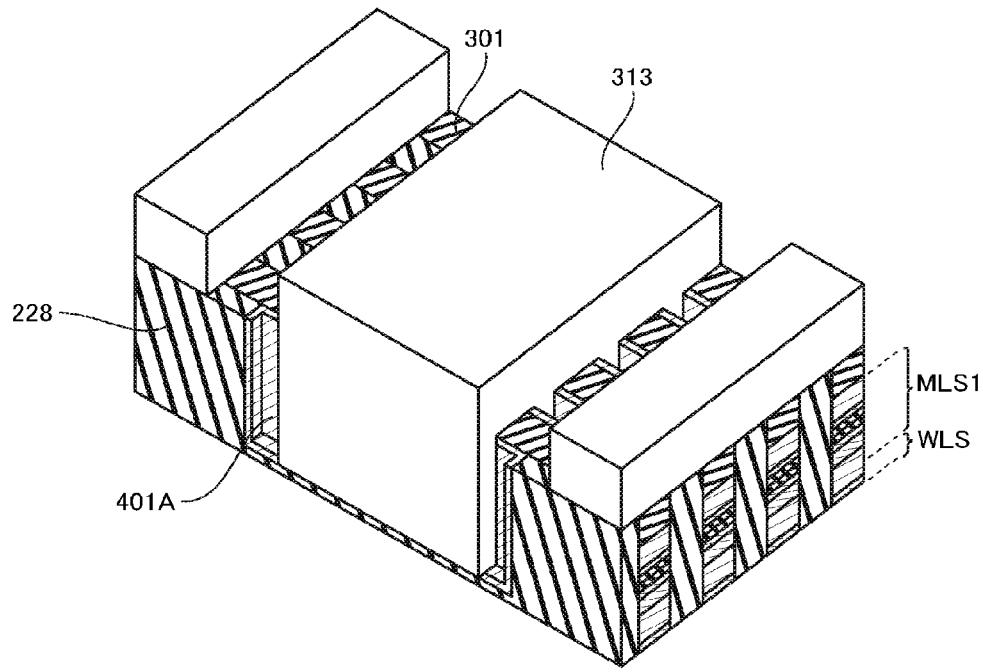

Then, the metal film 401A deposited between the adjacent bit-line contacts CB is removed. First, as shown in FIG. 29, a resist 313 is disposed to open a portion of the side walls of the bit-line contact CB that bears the metal film 401A to be removed. In addition, to protect the stack structure, the portion that does not bear the metal film 401A is also provided with the resist 314.

Figure 30:
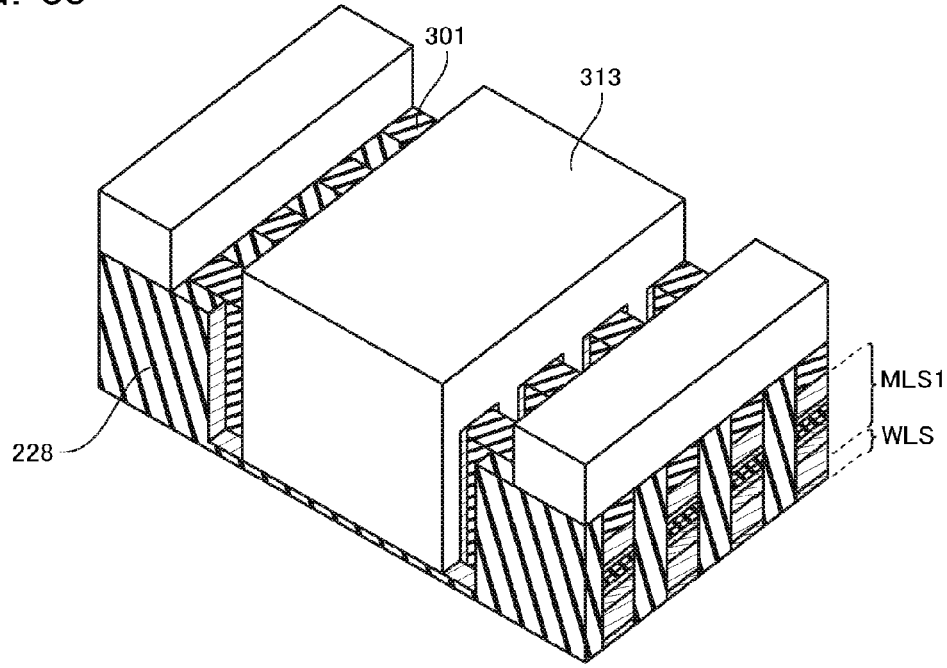

As shown in FIG. 30, RIE or the like removes the metal layer 401A in the exposed portion.

Figure 31:
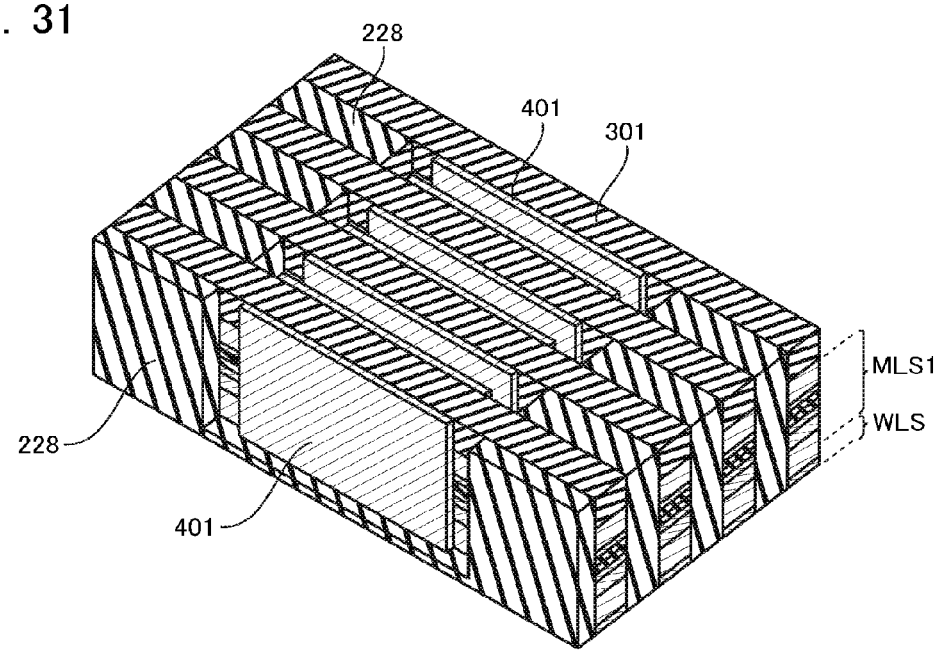

As shown in FIG. 31, the resist 313 is removed. The metal film 401 is thus disposed only on the side walls of the stack structure CBL of the bit-line contact CB.

Figure 32A:
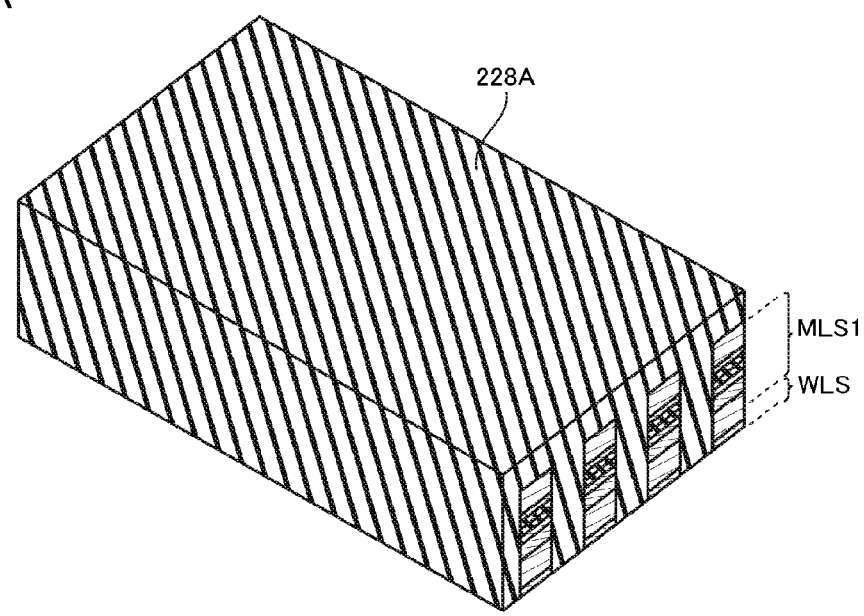
Figure 32B:
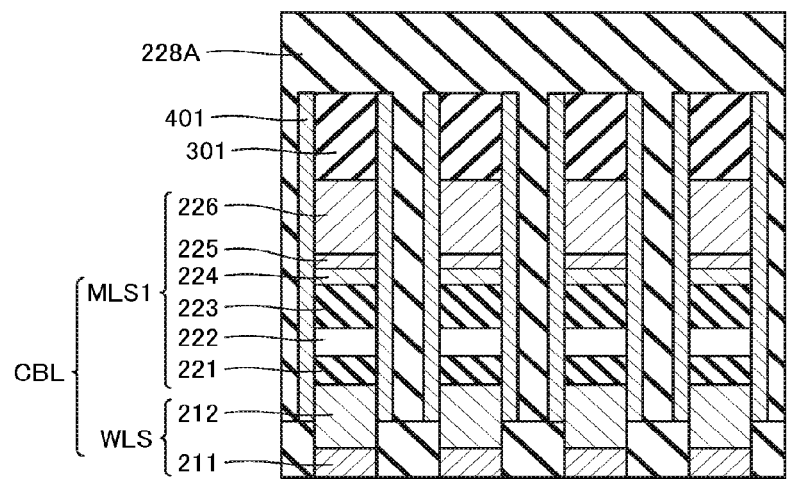

As shown in FIG. 32A and FIG. 32B, an insulating material 228A such as polysilazane is filled between the bit-line contacts CB.

Finally, the surface is planarized by CMP or the like to expose the electrically conductive layer 226 at the top surface of the bit-line contact CB, thus providing the configuration shown in FIGS. 22A, 22B.

The second embodiment may also provide similar effects to the first embodiment.

In addition, this embodiment does not include the implantation of metal ions and thus may limit the damage of each layer by the metal ion implantation or the like.

Third Embodiment

[Configuration]

The configuration of a non-volatile semiconductor memory device according to a third embodiment will be described with reference to FIG. 33A and FIG. 33B.

Figure 33A:
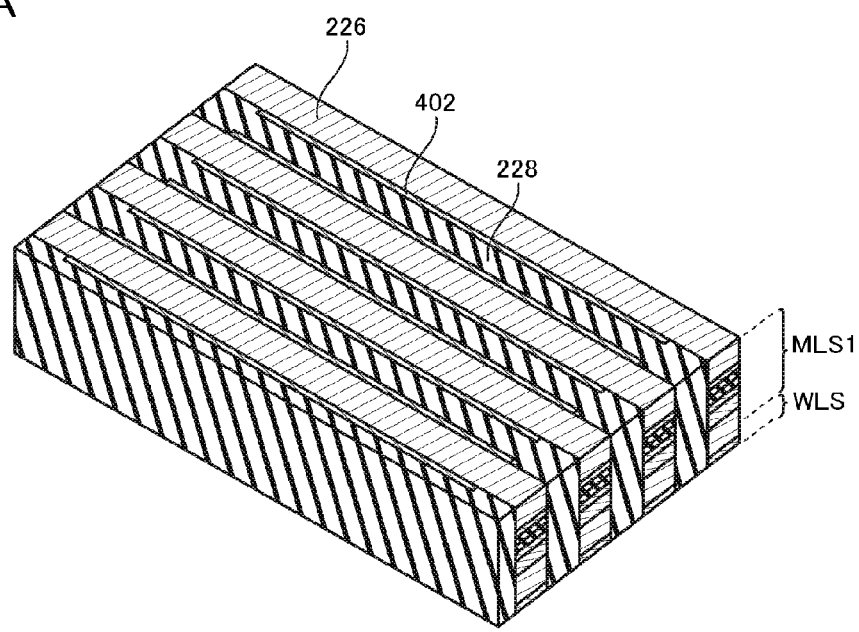
FIG. 33A is a perspective view partially illustrating the configuration of a non-volatile semiconductor memory device according to a third embodiment.

FIG. 33A is a schematic perspective view partially illustrating the configuration of a non-volatile semiconductor memory device according to the third embodiment. Here, like the second embodiment, a description is given of the configuration of the bit-line contact CB connected to the bit-line BL. The word-line contact CW has a similar configuration.

Figure 33B:
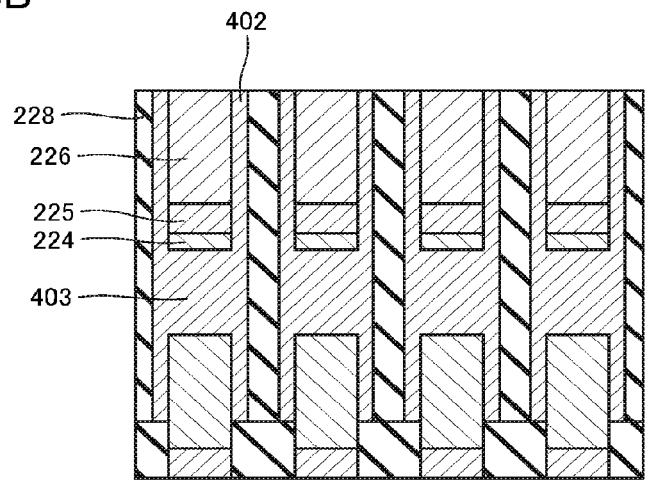
FIG. 33B is a cross-sectional view partially illustrating the configuration of the non-volatile semiconductor memory device.

In addition, other configurations than the bit-line contact CB and the word-line contact CW shown in FIG. 33A and FIG. 33B are similar to those in the first embodiment. Like elements as those in the first embodiment are designated with like reference numerals and their description is omitted hereafter. Note that FIG. 33A shows four rows of bit-line contacts CB in the Y direction and this configuration is provided in a plurality in the Y direction.

In this embodiment, the memory cell MC1 has, like the first and second embodiments, a stack of the electrode layer 221, the high resistance layer 222, the insulating layer 223, the metal layer 224, the barrier metal layer 225, and the electrically conductive layer 226.

In the third embodiment, as shown in FIG. 33A and FIG. 33B, the stack structure CBL of the bit-line contact CB is provided on its side wall an electrically conductive film 402. This point is similar to that in the second embodiment. The electrically conductive film 402 may include, for example, a metal or polysilicon having impurity added therein.

And, in the third embodiment, the stack structure CBL of the bit-line contact CB includes some of the layers of the stack structure MLS1 of the memory cell MC1. In addition, the stack structure CBL also includes an electrically conductive layer 403 of the same material as the electrically conductive film 402 provided on the side walls of the stack structure CBL.

Specifically, the stack structure of the bit-line contact CB in this embodiment includes the metal layer 224, the barrier metal layer 225, and the electrically conductive layer 226 of the stack structure MLS of the memory cell MC1, and the electrically conductive layer 403 stacked under the metal layer 224. In addition, the electrically conductive layer 403 has under it a stack of the electrically conductive layer 212 and the barrier metal layer 211 of the stack structure WLS of the word-line WL.

This configuration allows all layers of the bit-line contact CB to be made of electrically conductive films as well as the side wall to be provided with the electrically conductive film 402, thus further improving the electrical conductivity.

[Manufacturing Method]

A method of manufacturing the non-volatile semiconductor memory device according to the third embodiment will be described with reference to FIGS. 34A, 34B to FIGS. 40A, 40B.

Figure 34A:
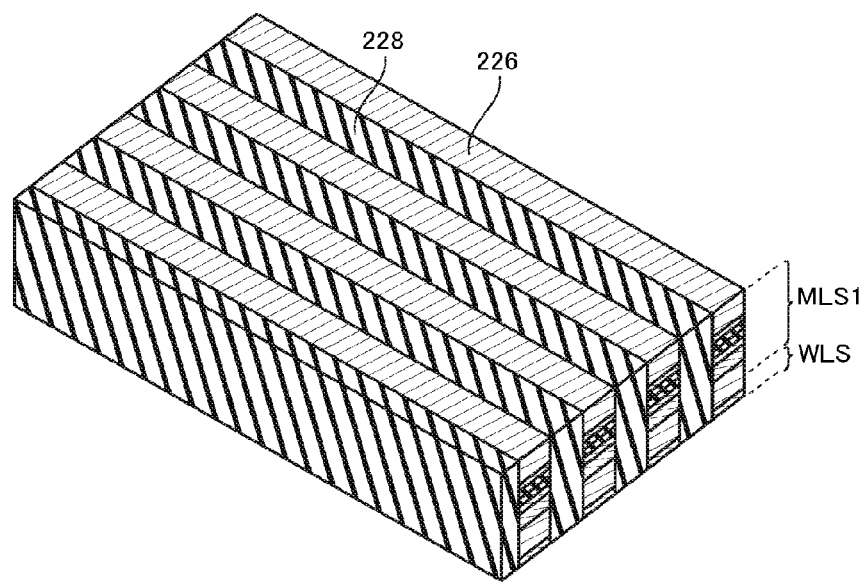
FIGS. 34A, 35, 36A, 37A, 38, 39A and 40A are perspective views illustrating a method of manufacturing the non-volatile semiconductor memory device.
Figure 34B:
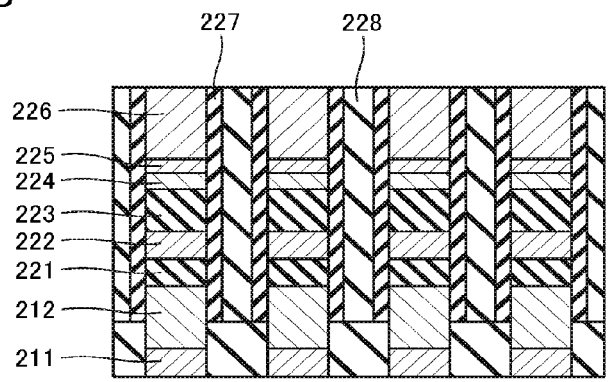
FIGS. 34B, 36B, 37B, 39B and 40B are cross-sectional views illustrating the manufacturing method.

First, as shown in FIG. 34A and FIG. 34B, the word-line WL1 and the memory cell MC1 are patterned. Between the patterned word-lines WL1 and the patterned memory cells MC1, the interlayer dielectric film 228 is filled. The interlayer dielectric film may include, for example, silicon oxide (SiO). This step is similar to the step in the first embodiment shown in FIG. 11.

Figure 35:
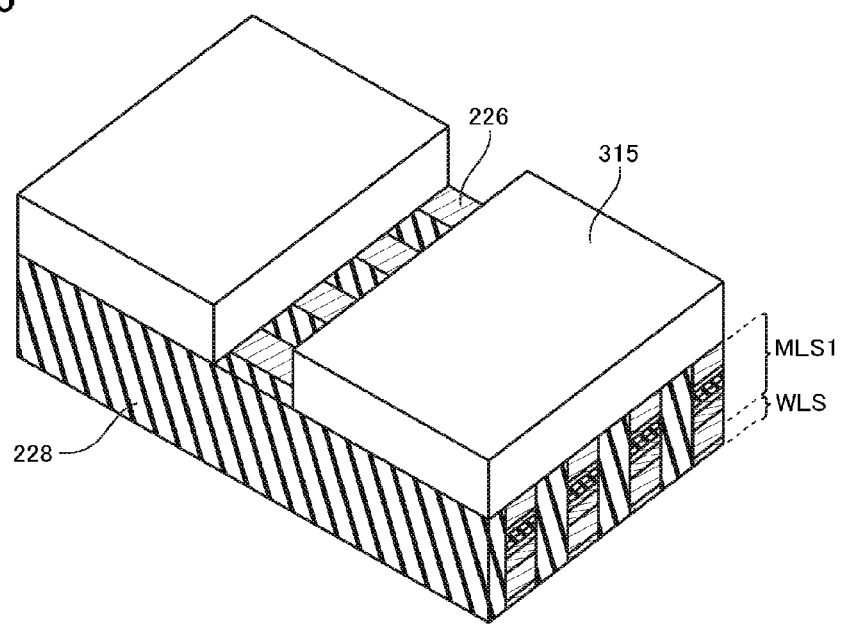

As shown in FIG. 35, the central portion of the bit-line contact CB is opened and deposited with a resist 315.

Figure 36A:
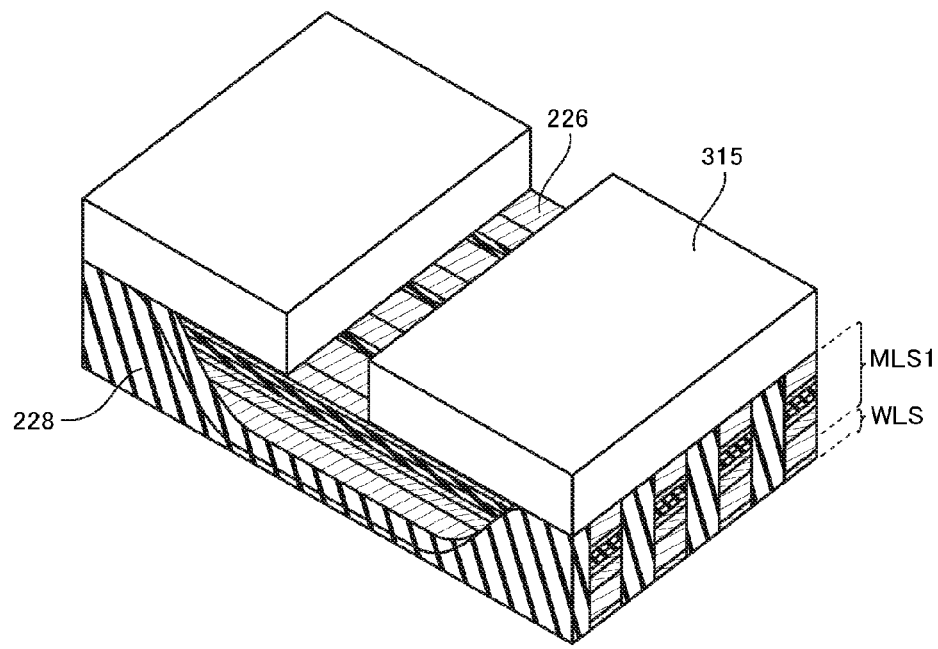
Figure 36B:
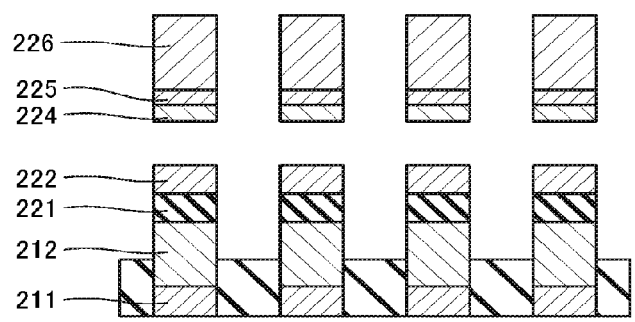

As shown in FIG. 36A and FIG. 36B, wet etching removes a portion of the interlayer dielectric film 228 and the insulating layer 223 of the stack structure CBL'. Then, the etching condition is adjusted so that the electrically conductive layer 212 of the word-line WL1 is exposed and the insulating film 228 on the side of the contact CB remains.

Figure 37A:
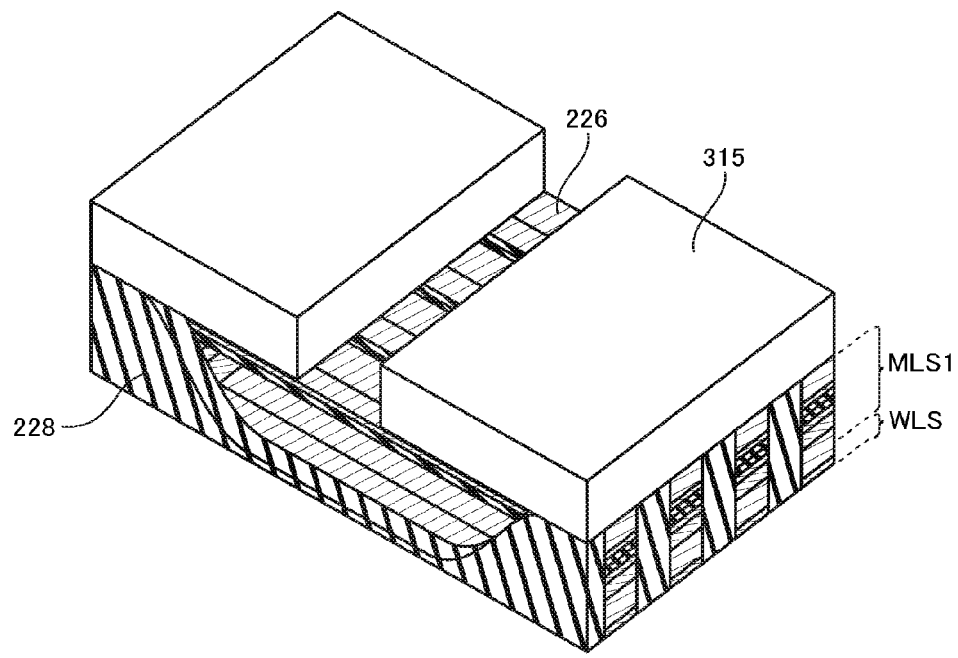
Figure 37B:
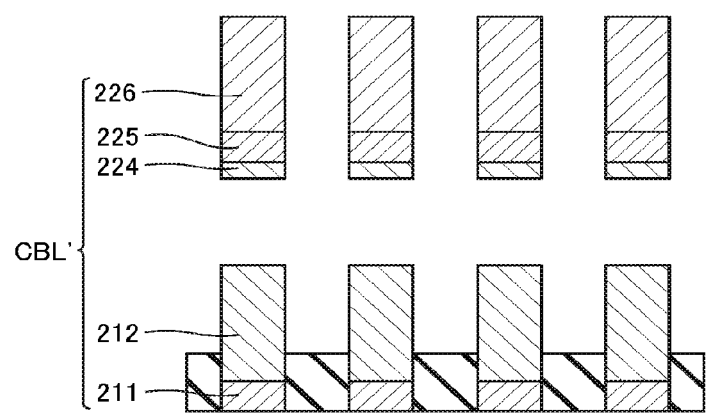

As shown in FIG. 37A and FIG. 37B, the electrode layer 221 and the high resistance layer 222 of the bit-line contact stack structure CBL' are removed by isotropic etching.

Figure 38:
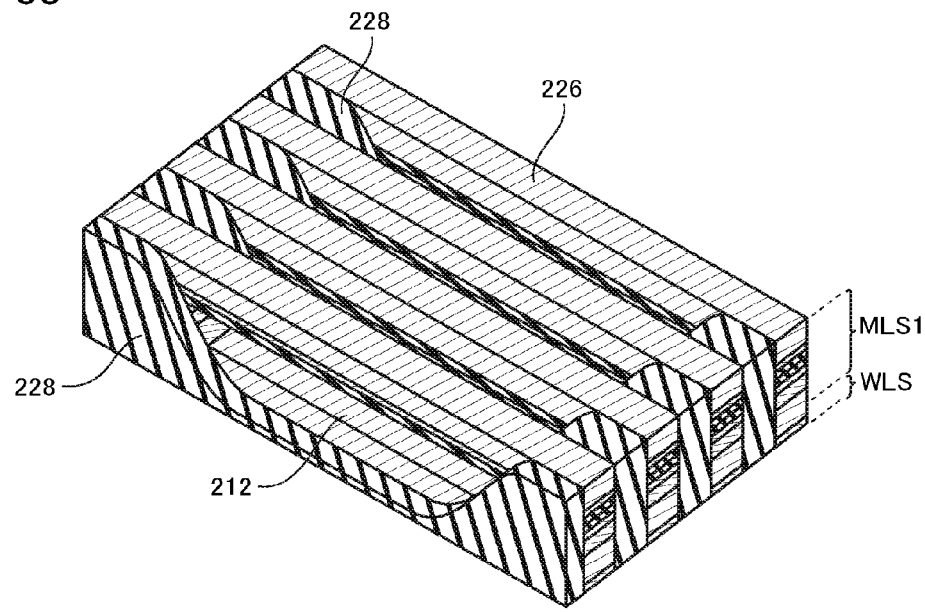

As shown in FIG. 38, the resist 315 is removed.

Figure 39A:
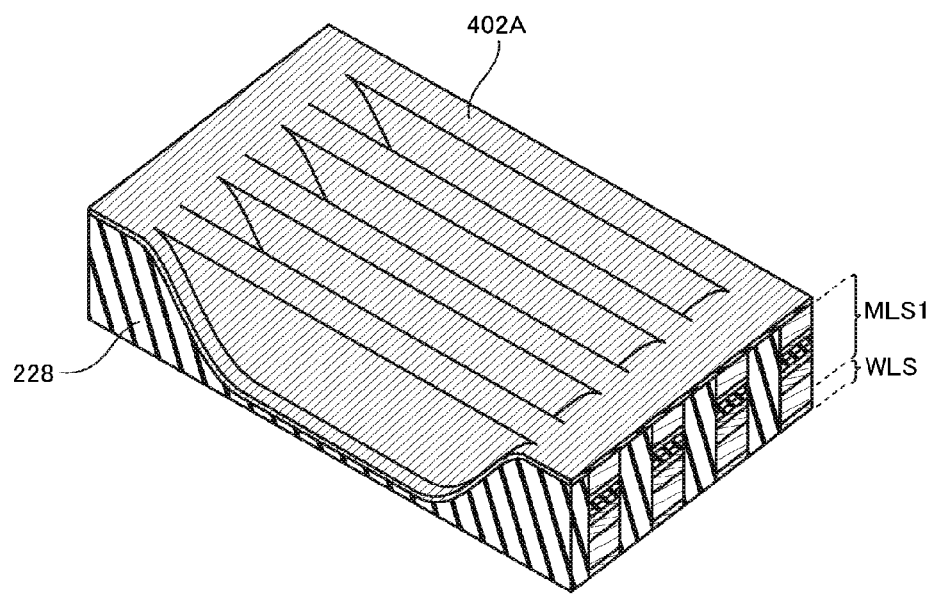
Figure 39B:
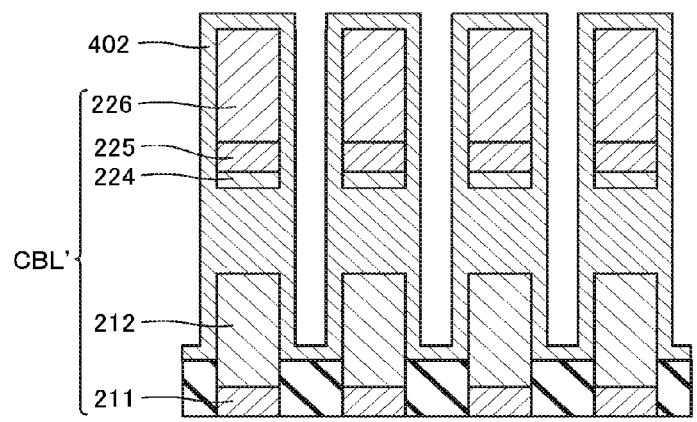

As shown in FIG. 39A and FIG. 39B, the entire surface and the air gap in the stack structure CBL' are deposited with an electrically conductive film 402A. The electrically conductive film may include for example, various metals or polysilicon having impurity added therein.

Figure 40A:
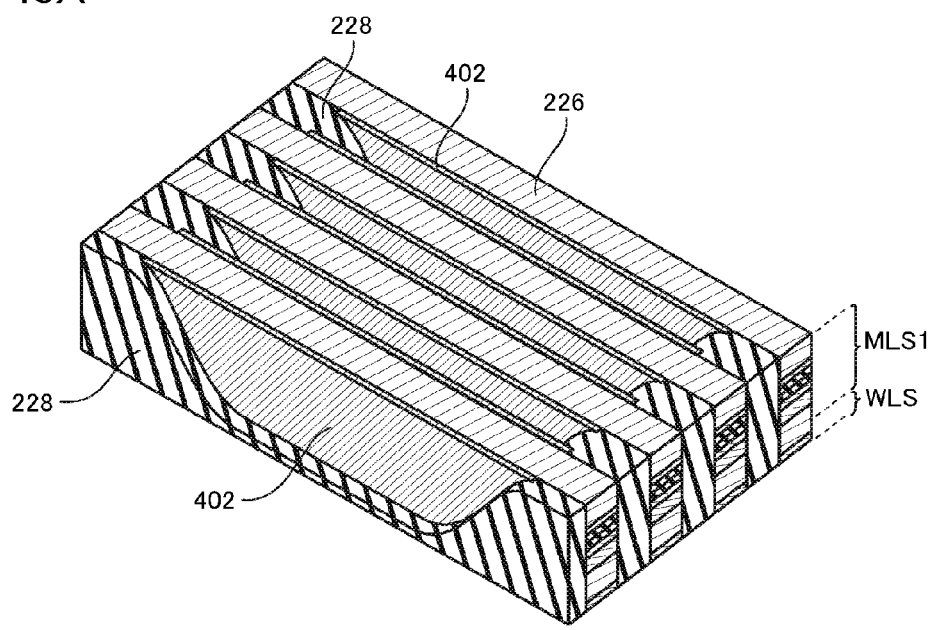
Figure 40B:
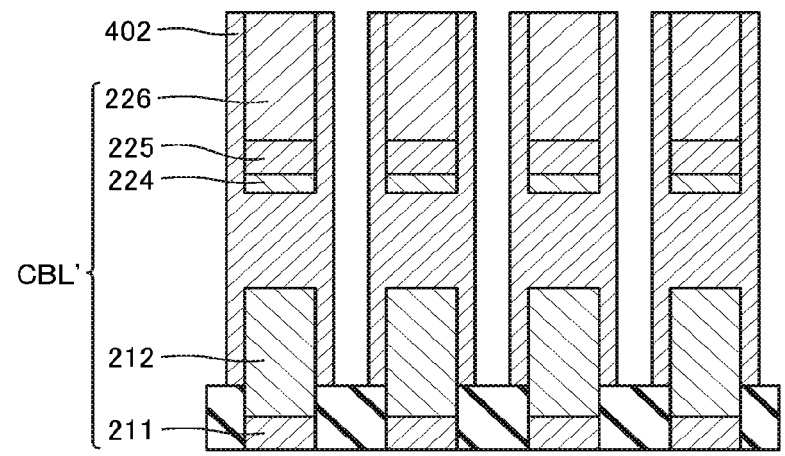

As shown in FIG. 40A and FIG. 40B, the electrically conductive film 402A deposited on the upper surface is removed by, for example, isotropic etching. The bit-line contact CB is thus formed. This process also removes the electrically conductive film 402A deposited on the upper surface of the insulating film 228 on the side of the bit-line contact CB. Therefore, the adjacent bit-line contacts CB in the Y direction are electrically isolated.

Finally, the bit-line contacts CB is filled with the insulating film 228A and the surface is planarized, thus providing the configuration shown in FIG. 33A and FIG. 33B. The insulating film 228A includes, for example, polysilazane. The planarization may be performed by, for example, CMP.

[Modified Example]

Non-volatile semiconductor memory devices according to some modified examples will be described with reference to FIG. 41 to FIG. 44.

FIG. 41 to FIG. 44 are cross-sectional views illustrating the stack structure of the bit-line contact CB or the word-line contact CW of non-volatile semiconductor memory devices according to the modified examples. FIG. 41 to FIG. 44 correspond to the configuration shown in FIG. 33B.

In the above third embodiment, the insulating layer and the high resistance film of the films of the memory cell MC are all removed and replaced with electrically conductive films.

However, the etching conditions described with reference to FIG. 36A, FIG. 36B, FIG. 37A, and FIG. 37B may be adjusted to provide other configurations.

Figure 41:
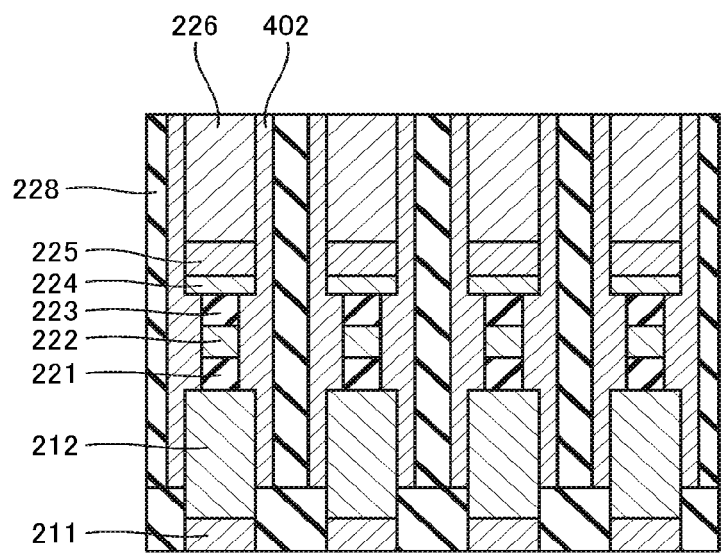
FIGS. 41 to 43 are cross-sectional views partially illustrating the configuration of a non-volatile semiconductor memory device according to a modified example.

For example, as shown in FIG. 41, the stack structure CBL of the bit-line contact CB may be a configuration in which the opposite ends of the electrode layer 221, the high resistance layer 222, and the insulating layer 223 are replaced with the electrically conductive film 402.

Figure 42:
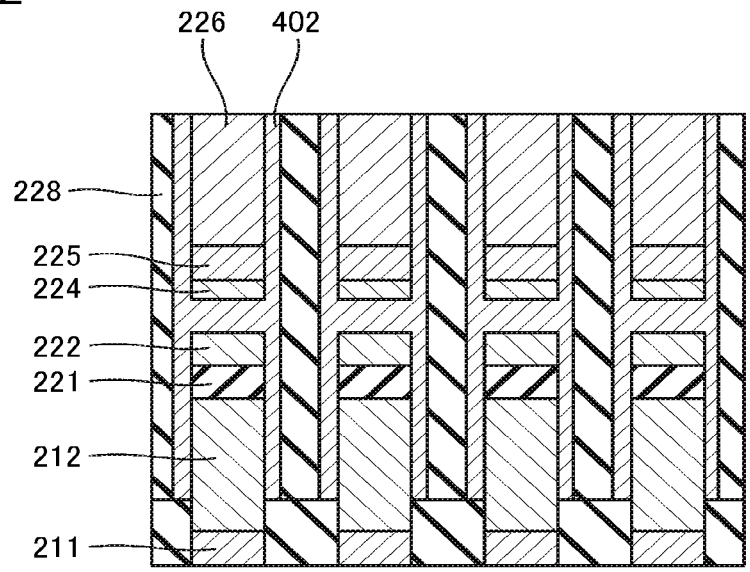

In addition, as shown in FIG. 42, any of the electrode layer 221, the high resistance layer 222, or the insulating layer 223 may be replaced with the electrically conductive layer 402. Note that the modified example shown in FIG. 42 shows a configuration in which the insulating layer 223 is replaced with the electrically conductive layer 402. However, the invention is not limited thereto. Only the electrode layer 221 or only the high resistance layer 222 or any two films of the electrode layer 221, the high resistance layer 222, and the insulating layer 223 may also be replaced with the electrically conductive film 402.

Figure 43:
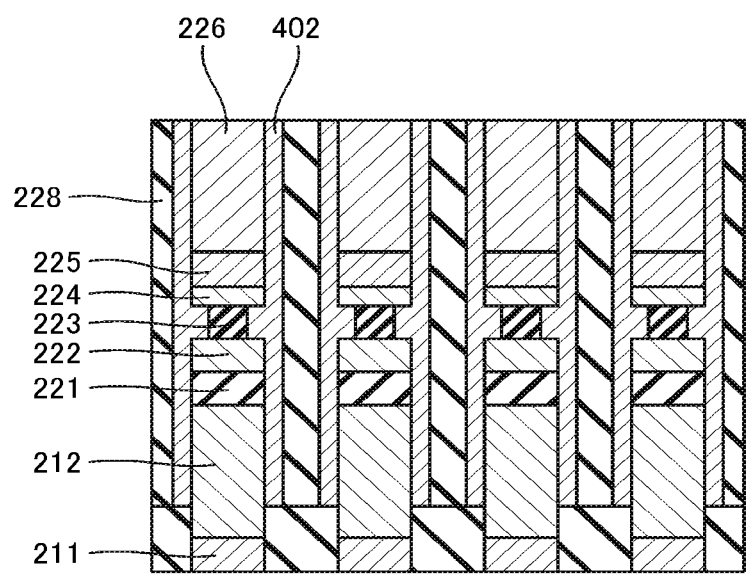

In addition, as shown in FIG. 43, the opposite ends of some of the electrode layer 221, the high resistance layer 222, and the insulating layer 223 may be replaced with the electrically conductive layer 402. Again, the layers whose opposite ends are replaced with the electrically conductive layer 402 may be selected and combined as appropriate.

The non-volatile semiconductor memory device according to the modified examples may also provide similar effects to the above embodiments.

In addition, in the non-volatile semiconductor memory devices according to the embodiments, as one memory mat is stacked in the Z-direction, the bit-line BL or word-line WL is increased by one layer. In addition, as any wiring line is increased by one layer, the memory cell in the Z-direction is increased by one. Then, depending on the position of the wiring line in the Z-direction, the stack structure of the contact for connecting each wiring line with the lower wiring layer includes more number of stack structures of the memory cell.

Figure 44:
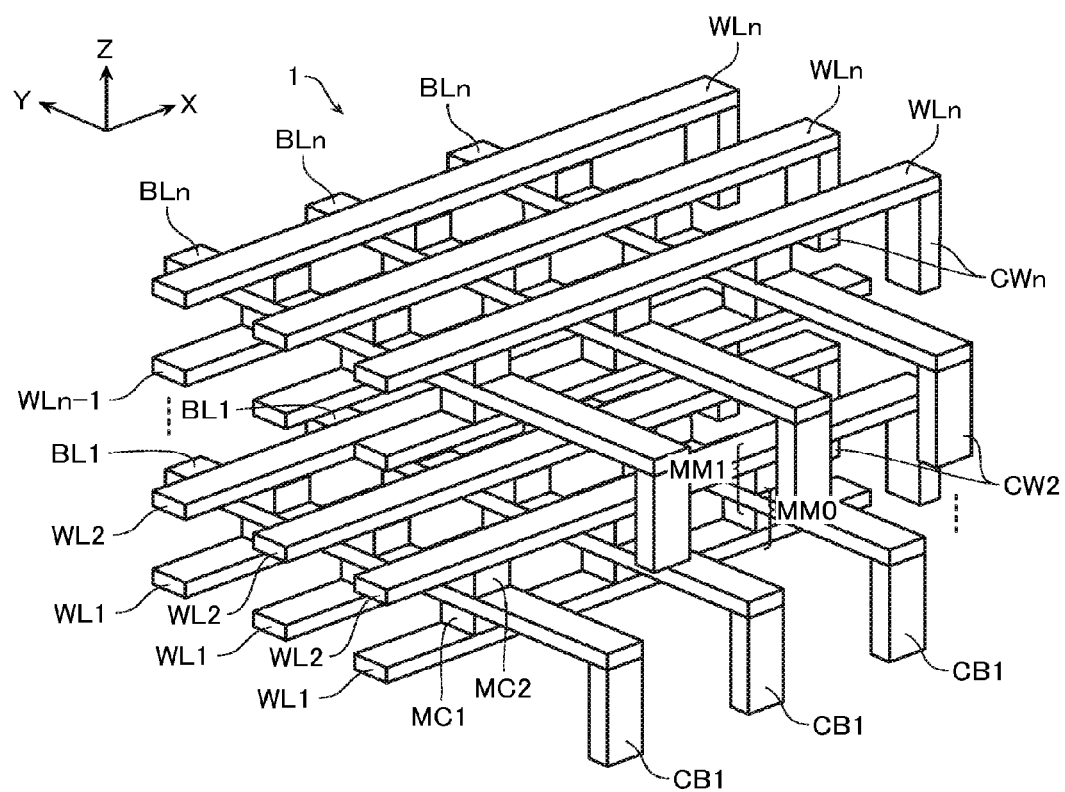
FIG. 44 is a perspective view illustrating an example of the configuration of a non-volatile semiconductor memory device according to another modified example.

Specifically, as shown in FIG. 44, when n layers of bit-lines and n layers of word-lines are provided (n is a natural number), as the bit-line or word-line is increased by one layer, the memory cell in the Z-direction is increased by one. Therefore, the contact of mth (m is a natural number equal to or more than 2 and equal to or less than 2n) bit-line or word-line from the bottom includes (m−1) stack structures of the memory cell. In other words, the contact of mth bit-line or word-line from the bottom includes the first stack structure of each memory cell MC disposed between the opposite ends of the contact.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, replaces and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first wiring lines extending in a first direction, the first wiring lines being provided in a second direction intersecting the first direction;
   a plurality of second wiring lines extending in the second direction, the second wiring lines being provided in the first direction;
   a plurality of memory cells provided in the intersections between the first wiring lines and the second wiring lines, each memory cell having a first stack structure comprising at least a variable resistor film;
   a contact extending in a third direction intersecting the first and second directions, the contact having a first end connected to one of the first wiring lines or one of the second wiring lines, the contact having a second stack structure having a stack of a plurality of films; and
   a wiring layer connected to a second end of the contact,
   at least some of the films of the second stack structure having generally the same third direction position and film thickness as at least some of layers of the first stack structure, and
   the second stack structure having a higher metal ratio than the first stack structure.

2. The semiconductor memory device according to claim 1, wherein
   at least some of the films of the second stack structure generally have the same third direction position and film thickness as at least some of layers of the first stack structure of each memory cell disposed between opposite ends of the contact having the second stack structure.

3. The semiconductor memory device according to claim 1, wherein
the first stack structure has a taper structure in which widths in the first and second directions change in the third direction.

4. The semiconductor memory device according to claim 3, wherein
the contact has a structure comprising a stack of a plurality of the first stack structures, each first stack structure having the taper structure, in the third direction.

5. The semiconductor memory device according to claim 1, wherein
at least some of the films of the second stack structure have generally the same width in the first and second directions as layers of the first stack structure.

6. The semiconductor memory device according to claim 1, wherein
the second stack structure of the contact connected to the first wiring lines further comprises a layer of the same material as an electrically conductive layer of the second wiring lines.

7. The semiconductor memory device according to claim 1, wherein
the second stack structure of the contact connected to the second wiring lines comprises a layer of the same material as an electrically conductive layer of the first wiring lines.

8. A semiconductor memory device comprising:
a plurality of first wiring lines extending in a first direction, the first wiring lines being provided in a second direction intersecting the first direction;
a plurality of second wiring lines extending in the second direction, the second wiring lines being provided in the first direction;
a plurality of memory cells provided in the intersections between the first wiring lines and the second wiring lines, each memory cell having a first stack structure comprising at least a variable resistor film;
a contact extending in a third direction intersecting the first and second directions, the contact having a first end connected to one of the first wiring lines or one of the second wiring lines, the contact having a second stack structure having a stack of a plurality of films; and
a wiring layer connected to a second end of the contact, the second stack structure having a side wall provided with an electrically conductive film.

9. The semiconductor memory device according to claim 8, wherein
the second stack structure comprises the same stack structure as the first stack structure.

10. The semiconductor memory device according to claim 8, wherein
at least some of the films of the second stack structure generally have the same third direction position and film thickness as at least some of layers of the first stack structure of each memory cell disposed between opposite ends of the contact having the second stack structure.

11. The semiconductor memory device according to claim 8, wherein
the first stack structure has a taper structure in which widths in the first and second directions change in the third direction.

12. The semiconductor memory device according to claim 11, wherein
the contact has a structure comprising a stack of a plurality of the first stack structures, each first stack structure having the taper structure, in the third direction.

13. The semiconductor memory device according to claim 8, wherein
the second stack structure comprises a film of the same material as the electrically conductive film.

14. The semiconductor memory device according to claim 8, wherein
the second stack structure includes the first stack structure, at least one of films of which is partially replaced with the same material as the electrically conductive film.

15. The semiconductor memory device according to claim 8, wherein
at least some of films of the second stack structure have generally the same width in the first and second directions as layers of the first stack structure.

16. The semiconductor memory device according to claim 8, wherein
the second stack structure of the contact connected to the first wiring lines further comprises a layer of the same material as an electrically conductive layer of the second wiring lines.

17. The semiconductor memory device according to claim 8, wherein
the second stack structure of the contact connected to the second wiring lines comprises a layer of the same material as an electrically conductive layer of the first wiring lines.

18. A method of manufacturing a semiconductor memory device, the device comprising,
a plurality of first wiring lines extending in a first direction, the first wiring lines being provided in a second direction intersecting the first direction,
a plurality of second wiring lines extending in the second direction, the second wiring lines being provided in the first direction,
a plurality of memory cells provided in the intersections between the first wiring lines and the second wiring lines, each memory cell having a first stack structure comprising at least a variable resistor film,
a contact extending in a third direction intersecting the first and second directions, the contact having a first end connected to one of the first wiring lines or one of the second wiring lines, the contact having a second stack structure having a stack of a plurality of films, and
a wiring layer connected to a second end of the contact, the method comprising:
forming the wiring layer;
depositing a first electrically conductive layer on the wiring layer;
forming the first stack structure comprising the variable resistor film on the first electrically conductive layer;
dividing the first electrically conductive film in the second direction to form the first wiring lines;
dividing the first stack structure in the first and second directions to form the memory cells and the second stack structure; and
implanting metal ions in the second stack structure or depositing an electrically conductive film on a side wall of the second stack structure to form the contact.

19. The method of manufacturing a semiconductor memory device according to claim 18, wherein forming the electrically conductive film on a side wall of the second stack structure is combined with replacing some of the layers of the second stack structure with the electrically conductive film.

20. The method of manufacturing a semiconductor memory device according to claim 19, wherein
the layers of the second stack structure to be replaced with the electrically conductive film comprise an insulating material.

* * * * *